US008897077B2

(12) United States Patent
Ajika et al.

(10) Patent No.: US 8,897,077 B2
(45) Date of Patent: Nov. 25, 2014

(54) NONVOLATILE SEMICONDUCTOR MEMORY DEVICE

(71) Applicant: Genusion, Inc., Amagasaki (JP)

(72) Inventors: Natsuo Ajika, Hyogo (JP); Shoji Shukuri, Hyogo (JP); Satoshi Shimizu, Hyogo (JP); Taku Ogura, Hyogo (JP)

(73) Assignee: Genusion, Inc., Tokyo (JP)

( * ) Notice: Subject to any disclaimer, the term of this patent is extended or adjusted under 35 U.S.C. 154(b) by 0 days.

(21) Appl. No.: 13/715,469

(22) Filed: Dec. 14, 2012

(65) Prior Publication Data

US 2013/0107634 A1    May 2, 2013

Related U.S. Application Data

(63) Continuation of application No. 12/343,552, filed on Dec. 24, 2008, now Pat. No. 8,339,862.

(30) Foreign Application Priority Data

Dec. 25, 2007 (JP) ................................. 2007-331533
Mar. 4, 2008 (JP) ................................. 2008-053561

(51) Int. Cl.
*G11C 16/10* (2006.01)
*H01L 27/115* (2006.01)
*G11C 16/12* (2006.01)
*G11C 16/04* (2006.01)

(52) U.S. Cl.
CPC .............. *G11C 16/10* (2013.01); *H01L 27/115* (2013.01); *G11C 16/12* (2013.01); *G11C 16/0483* (2013.01); *H01L 27/11524* (2013.01)
USPC .................................. 365/185.23; 365/185.18

(58) Field of Classification Search
None
See application file for complete search history.

(56) References Cited

U.S. PATENT DOCUMENTS 4,882,707 A * 11/1989 Mizutani ................. 365/185.12
5,043,942 A    8/1991 Iwata et al.
(Continued)

FOREIGN PATENT DOCUMENTS

JP    08-204159 A    8/1996
JP    H09-008153    1/1997
(Continued)

OTHER PUBLICATIONS

JPO Office action of Feb. 26, 2013; JP Serial No. 207040; publication No. 111594; with English translation.
(Continued)

*Primary Examiner* — James G Norman
(74) *Attorney, Agent, or Firm* — The Marbury Law Group, PLLC

(57) ABSTRACT

According to an aspect of the present invention, it is provided: a nonvolatile semiconductor memory device comprising: a plurality of bit lines arranged in a first direction; a plurality of source lines arranged in the first direction, the plurality of source lines being parallel to the plurality of bit lines, the plurality of source lines being distinct from the plurality of bit lines; a plurality of memory gate lines arranged in a second direction perpendicular to the first direction; a plurality of memory cells arranged in a matrix, each of the plurality of memory cells including a p type MIS nonvolatile transistor having a first terminal, a second terminal, a channel between the first terminal and the second terminal, a gate insulation film formed on the channel, a gate electrode connected to one corresponding memory gate line of the plurality of memory gate lines, and a carrier storage layer formed between the gate insulation film and the gate electrode, the first terminal being connected to one corresponding bit line of the plurality of bit lines and the second terminal being connected to one corresponding source line of the plurality of source lines.

14 Claims, 84 Drawing Sheets

(56) References Cited

U.S. PATENT DOCUMENTS

| | | | |
|---|---|---|---|
| 5,687,118 A * | 11/1997 | Chang | 365/185.19 |
| 5,745,417 A | 4/1998 | Kobayashi et al. | |
| 5,898,606 A | 4/1999 | Kobayashi et al. | |
| 5,912,842 A | 6/1999 | Chang et al. | |
| 5,914,895 A * | 6/1999 | Jenne | 365/185.08 |
| 6,288,944 B1 | 9/2001 | Kawamura | |
| 7,656,710 B1 * | 2/2010 | Wong | 365/185.19 |
| 2001/0017789 A1 | 8/2001 | Noda | |
| 2001/0048612 A1 | 12/2001 | Yi et al. | |
| 2002/0014642 A1 | 2/2002 | Gerber et al. | |
| 2002/0019097 A1 | 2/2002 | Arai et al. | |
| 2003/0161184 A1 | 8/2003 | Lee et al. | |
| 2005/0041476 A1 | 2/2005 | Sakui et al. | |
| 2005/0219912 A1 | 10/2005 | Gendrier et al. | |
| 2005/0282332 A1 | 12/2005 | Hsu et al. | |
| 2006/0244041 A1 * | 11/2006 | Tanaka et al. | 257/315 |
| 2007/0190453 A1 | 8/2007 | Nozaki et al. | |

FOREIGN PATENT DOCUMENTS

| | | |
|---|---|---|
| JP | 2000-149581 A | 5/2000 |
| JP | 2001-506063 A | 5/2001 |
| JP | 2001-229680 A | 8/2001 |
| JP | 2001-358237 A | 12/2001 |
| JP | 2006-128594 A | 5/2006 |
| JP | 2006-156925 A | 6/2006 |
| JP | 2006-236424 A | 9/2006 |
| JP | 2006-269697 A | 10/2006 |
| JP | 2007-142450 A | 6/2007 |
| JP | 2007-219152 A | 8/2007 |
| WO | 99/19880 A1 | 4/1999 |

OTHER PUBLICATIONS http://rfengineer.net/1282/top-60-emerging-startup/; "Top 60 Emerging Startups"; Feb. 3, 2009.

http://ieeexplore.ieee.org/xpl/mostRecentIssue.jsp-?punumber=5871161; IEEE Xplore Digital Library; IEEE Xplore—Memory Workshop (IMW), 2011 3rd IEEE International, May 22-25, 2011.

2011 Symposium on VLSI Circuits (VLSIC 2011); Kyoto, Japan, IEEE Catalog No. CFP11VLS-PRT; Jun. 15-17, 2011.

Peter Clarke; EE Times News & Analysis, Press Release: "Genusion licenses 84-Flash to Rohm, Lapis"; Feb. 23, 2012.

http://en.wikipedia.org/wiki/INCJ, Wikipedia, INCJ Innovation Network Corporation of Japan, p. last edited May 20, 2012.

http://www.prnewswire.com/news-releasesl, PR Newswire, Press Release: Nokia Announces 'Mobile Rules! 08' Competition Winners, website accessed Jun. 8, 2012.

Japanese Office Action of Japanese application No. 2008-053561 of Apr. 30, 2013.

* cited by examiner

| | | operation condition | | | |
|---|---|---|---|---|---|
| | | program | erase1 | erase2 | read |
| select | bit line | 0V | Vcc, or V(IO) | Vbl(E2) > Vcc > 0V : example 10V | 0V |
| | select gate | Vsg(P) < 0V:example -3V | Vcc, or V(IO) | Vsg(E2) > Vcc > 0V : example 10V | 0V |
| | control gate | Vcg(P) > Vcc > 0V: example 8V | Vcg(E1) < 0V, :example -20V | Vcg(E2) < 0V :example -10V | V(IO) or Vcc or 0V or Vcg(R) : example -3V |
| common | source | Vcc or V(IO) | Vcc, or V(IO) | Vsl(E2) > Vcc > 0V : example 10V | Vcc, or V(IO) |
| | n well | Vwell(P) > Vcc > 0V: example 8V | Vcc, or V(IO) | Vwell(E2) > Vcc > 0V : example 10V | Vcc, or V(IO) |
| non-select | bit line | Vcc, (1.8V) or V(IO) or Vubl(P), :example2 * Vcc or 2 * V(IO) | Vcc, or V(IO) | Vbl(E2) > Vcc > 0V : example 10V | Vcc, or V(IO) |
| | select gate | Vcc or V(IO) | Vcc, or V(IO) | Vsg(E2) > Vcc > 0V : example 10V | Vcc, or V(IO) |
| | control gate | Vcc or V(IO) or Vucg(P) < 0V :the voltage for switching on a SG, example -3V | Vcc, or V(IO) | Vucg(E2) > Vcc > 0V : example 10V | Vcc, or V(IO) | ex : Vcc=1.8V, V (IO)= 2.5V or 3.3V (B)

| a magnitude relationship of the voltage |
|---|
| Vbl(E2)=Vsg(E2)=Vsl(E2)=Vwell(E2)=Vucg(E2)=Vcg(P)≧Vwell(P)≧Vubl(P)>V(IO)>Vcc>0V>Vsg(P)≧Vucg(P)≧Vcg(E2)>Vcg(E1) |

FIG. 24A
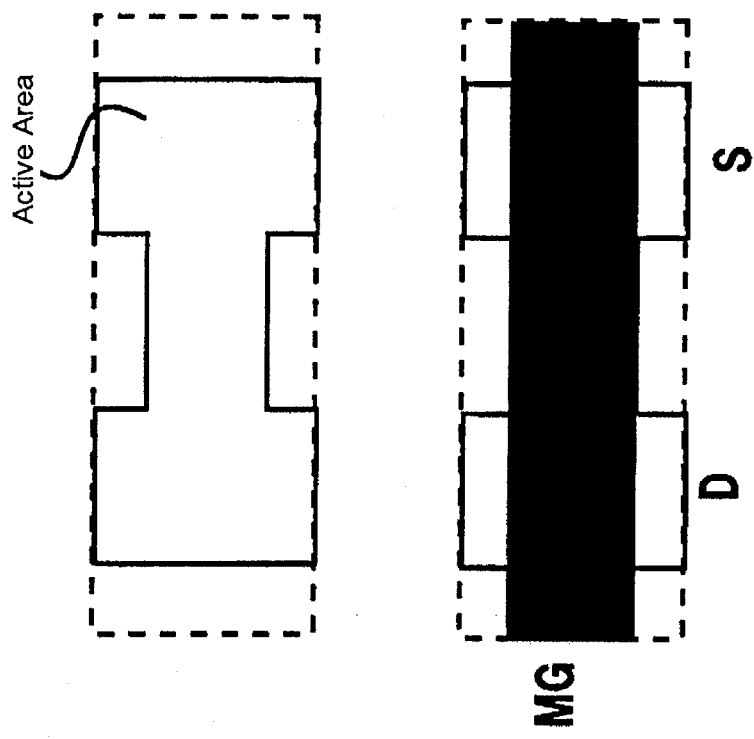
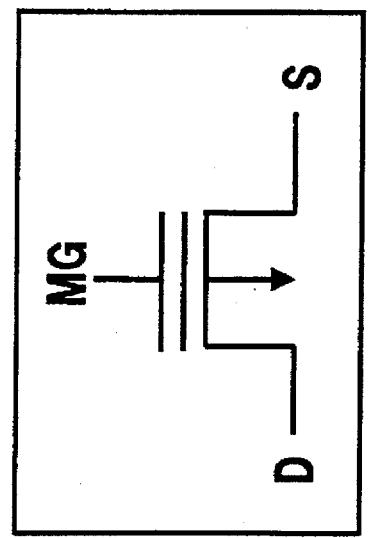

Fig.26

| | | READ | PGM | ERS Block unit | ERS Word unit |
|---|---|---|---|---|---|
| MG | Sel | $Vmg\_r$ | $Vmg\_p$ | $Vmg\_eb$ | $Vmg\_ewl$ |
| MG | Non-sel | $Vumg\_r$ | $Vumg\_p$ | — | $Vumg\_ewl$ |
| BL | Sel | Vsense | $Vbsl\_p$ | HiZ or $Vnw\_eb$ | HiZ or $Vnw\_ewl$ |
| BL | Non-sel | VCC | $Vubsl\_p$ | | |
| SL | Sel | VCC | $Vbsl\_p$ | $Vnw\_eb$ | $Vnw\_ewl$ |
| SL | Non-sel | VCC | $Vubsl\_p$ | — | — |
| NW | | VCC | $Vnw\_p$ | $Vnw\_eb$ | $Vnw\_ewl$ |

<inequality formula expressing voltage relationship>

$Vumg\_r > Vmg\_r$
$VCC > Vsense > 0V$
$Vmg\_p > VCC \geqq Vumg\_p \geqq 0V$
$Vnw\_p \geqq Vubsl\_p \geqq VCC \geqq Vbsl\_p \geqq 0V$
$Vnw\_eb > Vmg\_eb$
$Vnw\_ewl \geqq Vumg\_ewl > Vmg\_ewl$

Fig.27

|  |  | READ | PGM | ERS Block unit① | ERS Block unit② | ERS Word unit① | ERS Word unit② |
|---|---|---|---|---|---|---|---|
| MG | Sel | -2V | 8V | -10V | 0V | -10V | 0V |
| MG | Non-sel | VCC | 0V | - | - | 10V | 20V |
| BL | Sel | Sense | 0V | HiZ (10V) | HiZ (20V) | HiZ (10V) | HiZ (20V) |
| BL | Non-sel | VCC | 8V | - | - | - | - |
| SL | Sel | VCC | 0V | 10V | 20V | 10V | 20V |
| SL | Non-sel | VCC | 8V | - | - | - | - |
| NW |  | VCC | 8V | 10V | 20V | 10V | 20V |

Fig.33

| | | READ | PGM | ERS Block unit | ERS Word unit |
|---|---|---|---|---|---|
| WL | Sel | 0V | $Vwl\_p$ | $Vwl\_eb$ | $Vwl\_ewl$ |
| WL | Non-sel | VCC | $Vuwl\_p$ | – | $Vuwl\_ewl$ |
| MG | Sel | $Vmg\_r$ | $Vmg\_p$ | $Vmg\_eb$ | $Vmg\_ewl$ |
| MG | Non-sel | $Vumg\_r$ | $Vumg\_p$ | – | $Vumg\_ewl$ |
| BL | Sel | Vsense | $Vbsl\_p$ | HiZ or $Vnw\_eb$ | HiZ or $Vnw\_ewl$ |
| BL | Non-sel | VCC | $Vubsl\_p$ | – | – |
| SL | Sel | VCC | $Vbsl\_p$ | $Vnw\_eb$ | $Vnw\_ewl$ |
| SL | Non-sel | VCC | $Vubsl\_p$ | – | – |
| NW | | VCC | $Vnw\_p$ | $Vnw\_eb$ | $Vnw\_ewl$ |

< inequality formula expressing voltage relationship >

$VCC \geqq Vmg\_r = Vumg\_r \geqq 0V$ $VCC > Vsense > 0V$ $Vnw\_p \geqq Vuwl\_P \geqq Vubsl\_p \geqq VCC$
$\geqq Vbsl\_p \geqq 0V \geqq Vwl\_P$ $Vmg\_p > VCC \geqq Vumg\_p \geqq 0V$ $Vnw\_eb \geqq Vwl\_eb > Vmg\_eb$ $Vnw\_ewl \geqq Vumg\_ewl \geqq Vwl\_ewl = Vuwl\_ewl > Vmg\_ewl$

Fig.34

|  |  | READ | PGM | ERS Block unit① | ERS Block unit② | ERS Word unit① | ERS Word unit② |
|---|---|---|---|---|---|---|---|
| WL | Sel | 0V | -2V | 10V | 20V | 10V | 20V |
| WL | Non-sel | VCC | 8V | - | - | 10V | 20V |
| MG | Sel | 0V | 8V | -10V | 0V | -10V | 0V |
| MG | Non-sel | 0V | 0V | - | - | 10V | 20V |
| BL | Sel | Sense | 0V | 10V | 20V | 10V | 20V |
| BL | Non-sel | VCC | 8V | - | - | - | - |
| SL | Sel | VCC | 0V | 10V | 20V | 10V | 20V |
| SL | Non-sel | VCC | 8V | - | - | - | - |
| NW |  | VCC | 8V | 10V | 20V | 10V | 20V |

| | | READ | PGM | ERS Block unit | ERS Word unit |
|---|---|---|---|---|---|
| WL | Sel | 0V | Vwl_p | Vwl_eb | Vwl_ewl |
| | Non-sel | VCC | Vuwl_p | – | Vuwl_ewl |
| MG | Sel | Vmg_r | Vmg_p | Vmg_eb | Vmg_ewl |
| | Non-sel | Vumg_r | Vumg_p | – | Vumg_ewl |
| BL | Sel | Vsense | Vbsl_p | Vnw_eb | Vnw_ewl |
| | Non-sel | VCC | Vubsl_p | – | – |
| SL | Sel | VCC | Vbsl_p | Vnw_eb | Vnw_ewl |
| | Non-sel | VCC | Vubsl_p | – | – |
| NW | | VCC | Vnw_p | Vnw_eb | Vnw_ewl |

< inequality formula expressing voltage relationship >

$VCC \geqq Vmg\_r = Vumg\_r \geqq 0V$
$VCC > Vsense > 0V$
$Vnw\_p \geqq Vuwl\_P \geqq Vubsl\_p \geqq VCC$
$\geqq Vbsl\_p \geqq 0V \geqq Vwl\_P$
$Vmg\_p > VCC \geqq Vumg\_p \geqq 0V$
$Vnw\_eb \geqq Vwl\_eb > Vmg\_eb$
$Vnw\_ewl \geqq Vumg\_ewl \geqq Vwl\_ewl = Vuwl\_ewl > Vmg\_ewl$

| | | READ | PGM | ERS Block unit① | ERS Block unit② | ERS Word unit① | ERS Word unit② |
|---|---|---|---|---|---|---|---|
| WL | Sel | 0V | -2V | 10V-α | 20V-α | 10V-α | 20V-α |
| WL | Non-sel | VCC | 8V | - | - | 10V-α | 20V-α |
| MG | Sel | 0V | 8V | -10V | 0V | -10V | 0V |
| MG | Non-sel | 0V | 8V | - | - | 10V | 20V |
| BL | Sel | Sense | 0V | 10V | 20V | 10V | 20V |
| BL | Non-sel | VCC | 8V | - | - | - | - |
| SL | Sel | VCC | 0V | 10V | 20V | 10V | 20V |
| SL | Non-sel | VCC | 8V | - | - | - | - |
| NW | | VCC | 8V | 10V | 20V | 10V | 20V |

Fig42

| | | Conventional example | Example 3(1Tr version) | Example 4(2T version) | Example 5(3Tr version) |
|---|---|---|---|---|---|
| Memory element S/D | | Asymmetric structure | symmetric structure | Asymmetric structure | symmetric structure |
| Array structure | | NOR type array | | AND type array | |
| Gate length L scaling | | Potential S/D when programming<br>Necessary to optimize with balance of resistance and each disturb characteristic between S/D | Same voltage control S/D when programming unrelated to resistance between S/D<br>Possible to set voltage to meet each disturb characteristic<br>Also, voltage difference between S/D is zero, easy to shrink gate length L | | |
| READ | | Necessary to control memory cell WL voltage in −2V/VCC range<br>Large power consumption | Can control of memory cell WL voltage in −2V/VCC range | | Can control of memory cell WL voltage in 0V/VCC range<br>Power consumption is small |
| PROGRAM | | Gate Disturb characteristic and Drain Disturb characteristic<br>Necessary to make voltage settings compatible.<br>Optimization is difficult | Possible to independently optimize Gate Disturb characteristic and Drain Disturb characteristic | Improve Drain Disturb resistance more than example 3 | Improve Drain Disturb resistance more than example 4 |

| Select Tr for MG | PMOS | NMOS |
|---|---|---|
| Array area | — | Increase only by size of well separation |
| Program | In B4-HE operation<br>Requires Vg≦Vb precondition | In B4-HE operation<br>No restriction on Vg, Vb relationship |
| Erase | Required resistance Spec for Periphery Tr =erase voltage+2V | Required resistance Spec for periphery =erase voltage |
| Read | Mg voltage=VCC | MG voltage=0V |

NONVOLATILE SEMICONDUCTOR MEMORY DEVICE

RELATED APPLICATIONS

This application is a continuation of U.S. patent application Ser. No. 12/343,552 entitled "Nonvolatile Semiconductor Memory Device" filed Dec. 24, 2008, which claims the benefit of priority to Japanese Patent Application Nos. 2007-331533, filed Dec. 25, 2007 and 2008-053561, filed Mar. 4, 2008, the entire contents of each of which are incorporated herein by reference.

BACKGROUND OF INVENTION

1. Field of the Invention

This invention is related to nonvolatile semiconductor memory device which can reprogram data in bits or byte units.

2. Description of the Prior Art

Recently, LSI such as a microcomputer are being incorporated into a variety of devices, and demands for storing small to medium amounts of data in a nonvolatile way to each of these many LSI are also increasing. In order to achieve such aims, a medium amount of memory is sufficient as a nonvolatile memory. However, data which is reprogrammable in smaller units (1 byte to a few bytes) is being demanded.

However, flash memory represented by a NAND type has large capacity and low cost and is presently widely being used. However, in flash memory, programming is performed in byte to page units (about 1 kb), erasure is performed in page units (about 1 kb) to blocks (about 64 kb) and therefore does not satisfy the reprogramming unit requested for the programming purposes stated above.

Conventionally, memory such as pFLASH (registered trademark) (refer to Patent Document 1) and NeoFlash (registered trademark) (refer to Patent Document 2) have been proposed.

Background arts to this invention are described, in more detail, in WO99/19880; U.S. Pat. No. 7,250,654; Japanese Patent Publications 2006-156925, 2006-128594, and 2006-269697; and U.S. Pat. No. 5,687,118, incorporated herein as a reference.

SUMMARY OF THE INVENTION

It is one object of the present invention to provide an improved nonvolatile semiconductor memory device.

According to an aspect of the present invention, it is provided: a nonvolatile semiconductor memory device comprising: a semiconductor substrate; an n type well formed in the semiconductor substrate; a plurality of memory cells arranged in matrix, each of the memory cells having a first p type MIS transistor formed in the n type well and a second p type MIS transistor formed in the n type well, the first p type MIS transistor and the second MIS type transistor being connected in series, the second p type MIS transistor having a charge accumulation layer; a plurality of bit lines arranged in parallel; a plurality of selection lines, each connected to a corresponding gate of the first p type MIS transistor, the plurality of selection lines arranged in parallel and perpendicular to the plurality of bit lines; a plurality of word lines, each connected to a corresponding gate of the second p type MIS transistor, the plurality of selection lines arranged in parallel and perpendicular to the plurality of bit lines; and a programming circuit for programming a selected row of the plurality of memory cells, the programming circuit providing a first positive voltage (Vwell) to the n type well and providing a second positive voltage (Vcg) to a selected word line of the plurality of word lines.

According to another aspect of the present invention, it is provided: a nonvolatile semiconductor memory device comprising: a plurality of bit lines arranged in a first direction; a plurality of source lines arranged in the first direction, the plurality of source lines being parallel to the plurality of bit lines, the plurality of source lines being distinct from the plurality of bit lines; a plurality of memory gate lines arranged in a second direction perpendicular to the first direction; a plurality of memory cells arranged in a matrix, each of the plurality of memory cells including a p type MIS nonvolatile transistor having a first terminal, a second terminal, a channel between the first terminal and the second terminal, a gate insulation film formed on the channel, a gate electrode connected to one corresponding memory gate line of the plurality of memory gate lines, and a carrier storage layer formed between the gate insulation film and the gate electrode, the first terminal being connected to one corresponding bit line of the plurality of bit lines and the second terminal being connected to one corresponding source line of the plurality of source lines.

According to the present invention, it is possible to improve scalability of both a memory transistor, and a selection transistor. In addition, according to the present invention, because high speed and multi-bit programming is simultaneously possible, even of the unit which is reprogrammed is one word line, it is possible to read out one word line, reprogram or program back only the necessary bit and seen externally, it is possible to emulate reprogramming in bit units.

According to the present invention, it is possible to reduce disturbances suffering non-selected memory cells.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 3 is a comparison diagram of the operation conditions of programming, erasing and reading of the memory cell.

FIG. 24A is one example of a memory cell array layout of a nonvolatile memory related to the third embodiment of this invention.

FIG. 26 is a chart diagram which shows a magnitude relationship of the voltages and their potentials which are applied to each part in the third embodiment of the present invention.

FIG. 27 is a specific example of the voltages applied to each part in the third embodiment of the present invention.

FIG. 33 is a chart diagram which shows a magnitude relationship of the voltages and their potentials which are applied to each part in the fourth embodiment of the present invention.

FIG. 34 is a specific example of the voltages applied to each part in the fourth embodiment of this invention.

FIG. 39 is a chart diagram which shows a magnitude relationship of the voltages and their potentials which are applied to each part in the fifth embodiment of the present invention.

FIG. 40 is a specific example of the voltages applied to each in the fifth embodiment of this invention.

FIG. 42 is a chart diagram which shows a comparison between each embodiment of the present invention and a conventional example.

FIG. 43 is a chart diagram which shows a comparison between each embodiment of the present invention and a conventional example focusing on each disturb stress at the time of programming

FIG. 62 is a chart diagram of a comparison of the sixth and seventh embodiments of this invention.

DETAILED DESCRIPTION

The detailed description of the preferred embodiments will be described hereinafter, however, the invention is not limited thereto.

Figure 1:
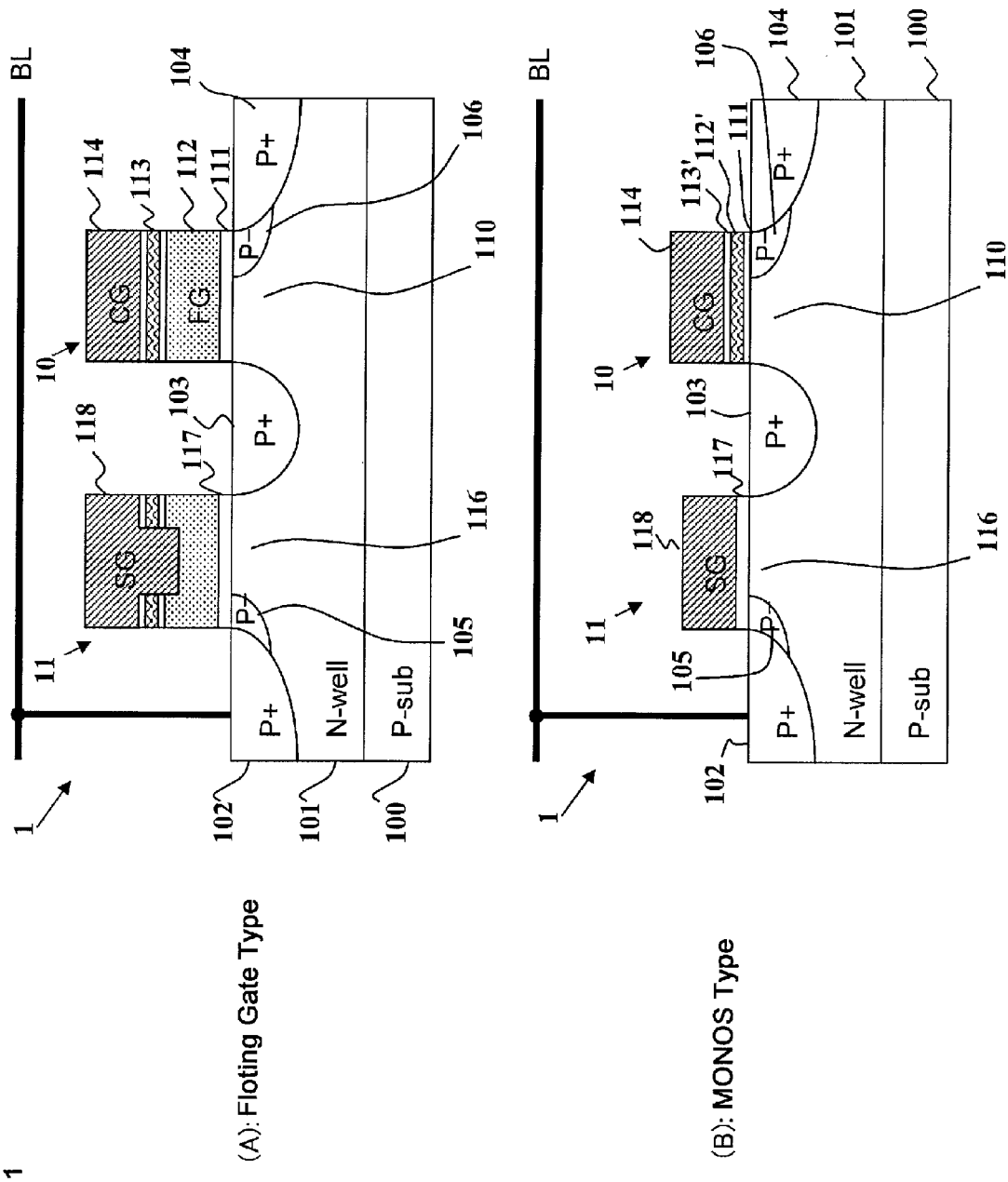
FIG. 1 is cross sectional structure diagram of a memory cell (nonvolatile semiconductor memory element) which is an embodiment of this invention.

The embodiments of the present invention will be explained while referring to the diagrams. FIG. 1 is a cross sectional diagram of a memory cell which is an embodiment of the present invention. This memory cell is an EEPROM type memory cell having a memory transistor and a selection transistor. FIG. 1 (A) shows an embodiment of a floating gate type EEPROM and FIG. 1 (B) shows an embodiment/example of a MONOS type EEPROM.

In FIG. 1 (A), the parts which are different to a usual floating gate type EEPROM are the transistor is a P channel MIS transistor, the insulation film thickness of the selection transistor is the film thickness of the a Vcc transistor or I/O transistor used, for example, in the periphery circuits. That is, a conventional EEPROM transistor is comprised from a high voltage transistor which can, for example, switch on and off a 20V voltage (a voltage Vds between drain and source), however, the transistor of this embodiment is a logic LSI and has the same break down voltage as a generally used transistor.

In FIG. 1 (A), an N type well 101 is formed near the surface of a P type substrate 100. A memory cell 1 is formed within this N type well 101. The memory cell 1 is comprised of a memory transistor 10 and a selection transistor 11. The memory transistor 10 is a floating gate type transistor and is comprised of a tunnel oxide film 111, a floating gate 112, a gate insulation film 113 and a control gate 114 which are formed above a channel region 110 between a P+ region 104 which becomes a source and P+ region 103 which becomes a drain (and also becomes the source of the selection transistor 11). Because the capacitance between the floating gate 112 and the control gate 114 is large, the gate insulation film 113 has a structure in which a dielectric film such as a nitride film is sandwiched by an oxide film.

The selection transistor 11 is comprised of a gate insulation film 117 and a selection gate 118 formed above a channel region 116 between a P+ region 102 which becomes a drain and a P+ region 103 which becomes a source. Here, in order to achieve standardization in the formation process of the selection transistor 11 and the memory transistor 10, the select gate 118 of the selection transistor 11 has a structure in which a hole is formed in the gate insulation film 113 of the memory transistor 10 through a polysilicon layer of the control gate 114 as far as the floating gate 112.

Here, P-regions 105 and 106 which are LDD regions are respectively arranged in the channel region 116 side of the P+ region 102 which becomes the drain of the selection transistor, and in the channel region 110 of the P+ region 104 which becomes the source of the memory transistor. These P-regions 105 and 106 are to prevent undesired BTBT (Band To Band Tunneling) from occurring when a high back gate voltage is applied to the N well 101 when programming.

The control gate 114 of the memory transistor 10 is formed as one part of a word line of a memory array in which comprises this memory chip in the shape of an array. The source (P+ region) 104 of the memory transistor 10 is connected to a source line of the memory array. The drain (P+ region) 102 of the selection transistor is connected to a bit line of the memory array. The select gate 118 of the selection transistor 11 is formed as one part of the select line of the memory array.

In FIG. 1 (B) the same numbers are attached to the same parts as in FIG. 1 (A). An N type well 101 is formed near the surface of a P type substrate. A memory cell 1 is formed within this N type well 101. The memory cell 1 is comprised of a memory transistor 10 and a selection transistor 11. The memory transistor 10 is an MONOS type transistor and is comprised of a tunnel oxide film 111, a charge storage layer 112', a gate insulation film 113' and a control gate 114 which are formed above a channel region 110 between a P+ region 104 which becomes a source and a P+ region 103 which becomes a drain (and also becomes the source of the selection transistor 11). A nano-crystal layer or a non-conducting charge storage layer such as a nitride oxide film may be applied as the charge storage layer 112'.

The selection transistor 11 is comprised of a gate insulation film 117 and a select gate 118 which are formed above a channel region 116 between a P+ region 102 which becomes a drain and a P+ region 103 which becomes a source.

The control gate 114 of the memory transistor is formed as one part of a word line of a memory array in which comprises this memory chip in the shape of an array. The source (P+ region) 104 of the memory transistor 10 is connected to a source line of the memory array. The drain (P+ region) 102 of the selection transistor is connected to a bit line of the memory array. The select gate 118 of the selection transistor 11 is formed as one part of the select line of the memory array.

Figure 2:
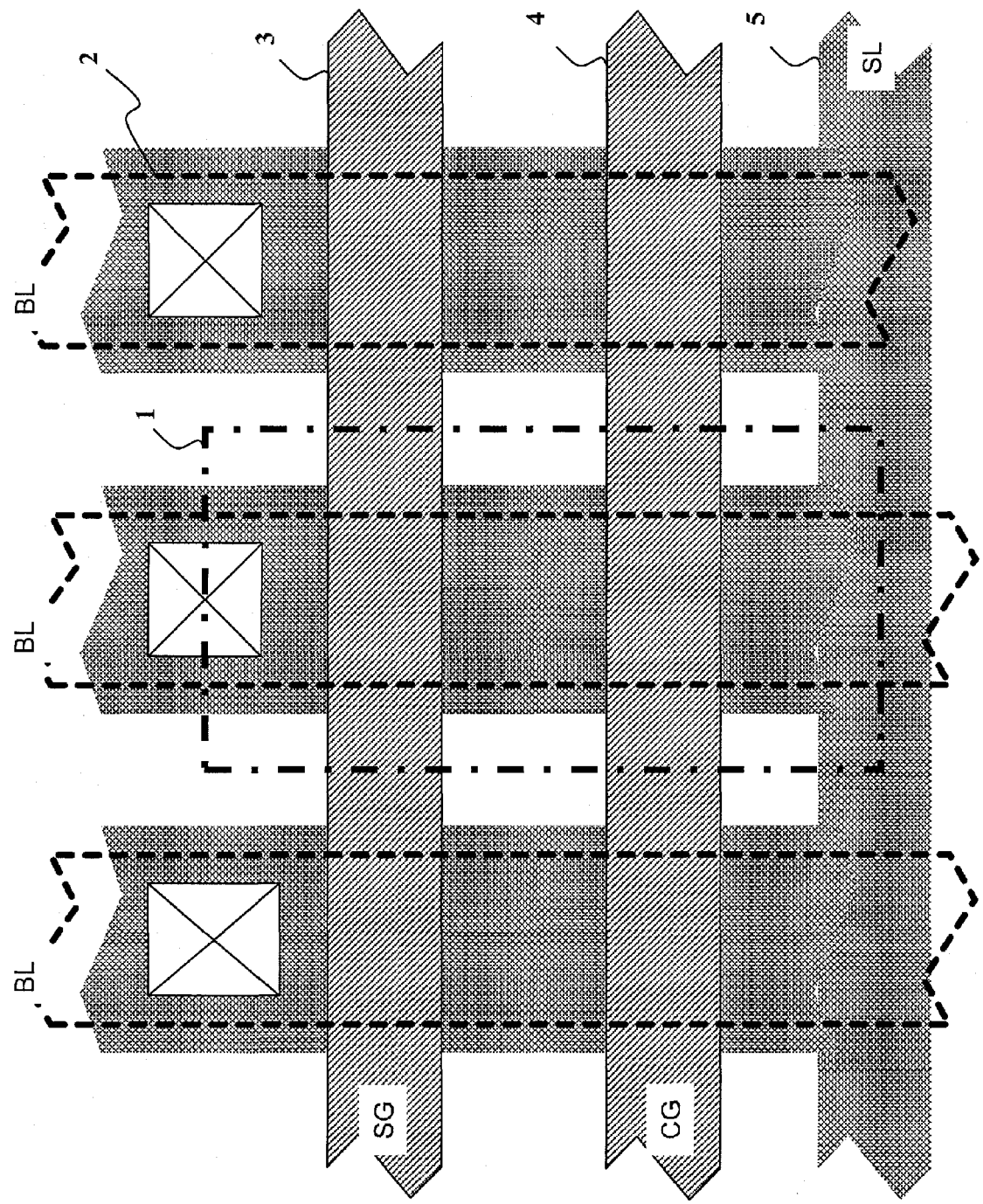
FIG. 2 is a planar view structural diagram of a memory cell arranged with a series of the same memory cells.

FIG. 2 is a planar view structure of a memory cell array in which the memory cell shown in FIG. 1 is arranged in the shape of an X, Y matrix. The memory cell 1 is comprised of two transistors (a Vcc or I/O transistor and a memory transistor) arranged in series in a Y direction. Among these, the transistor situated in a −Y direction (lower side of the diagram) is the memory transistor 10 and the transistor situated in the +Y direction (upper side of the diagram) is the selection transistor 11. A word line CG is formed in an X direction above the memory transistor 10 and a selection line SG is formed in an X direction above the selection transistor 11. In addition, a source line SL is formed beneath the word line CG and a bit line BL is formed above on top of the selection line SG. The bit line BL is formed in a Y direction in each column. The source line is commonly formed for all the memory cells in the memory array. The bit line BL and the drain 102 of the selection transistor 11 of the memory cell 1 are connected by a contact plug. The source line SL is connected with the source 104 of the memory transistor 10 of the memory cell 1.

Figure 4:
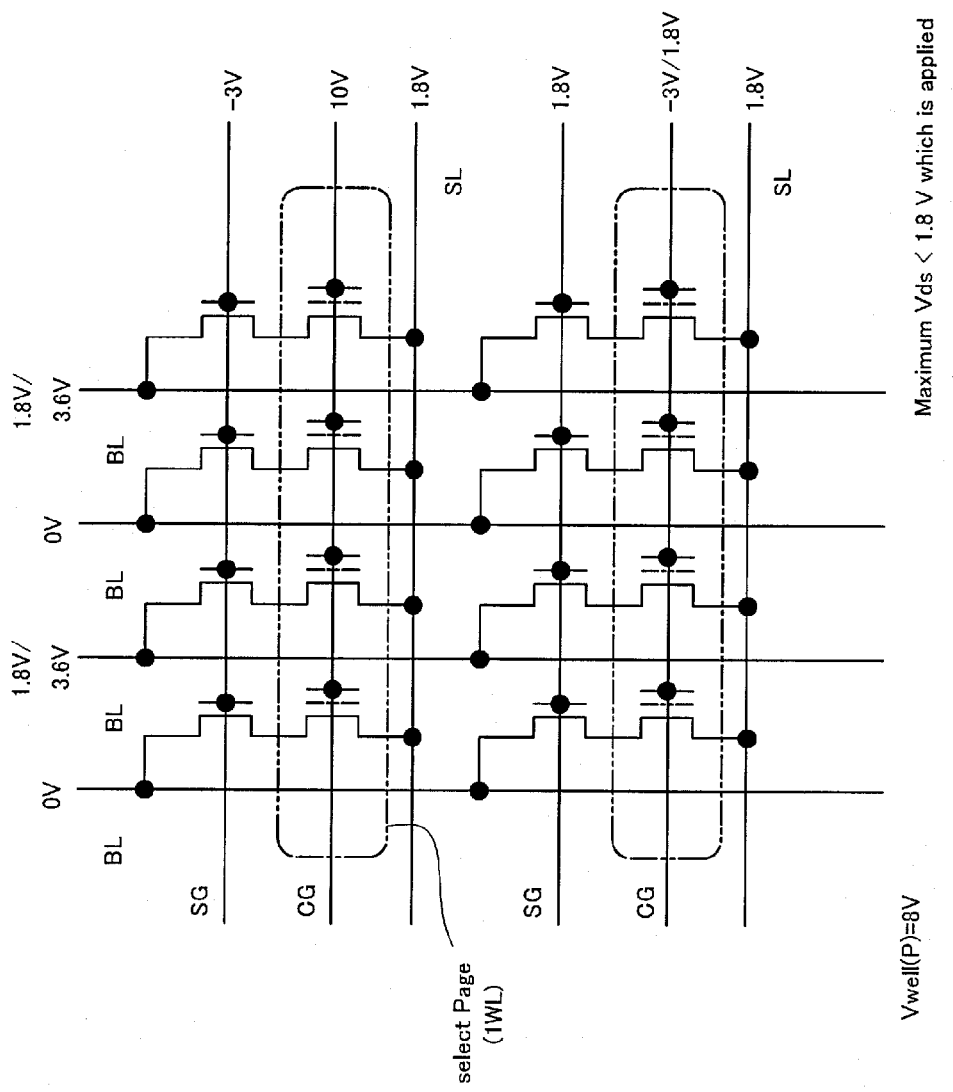
FIG. 4 is diagram which shows the application conditions of a programming voltage of the memory cell.
Figure 5:
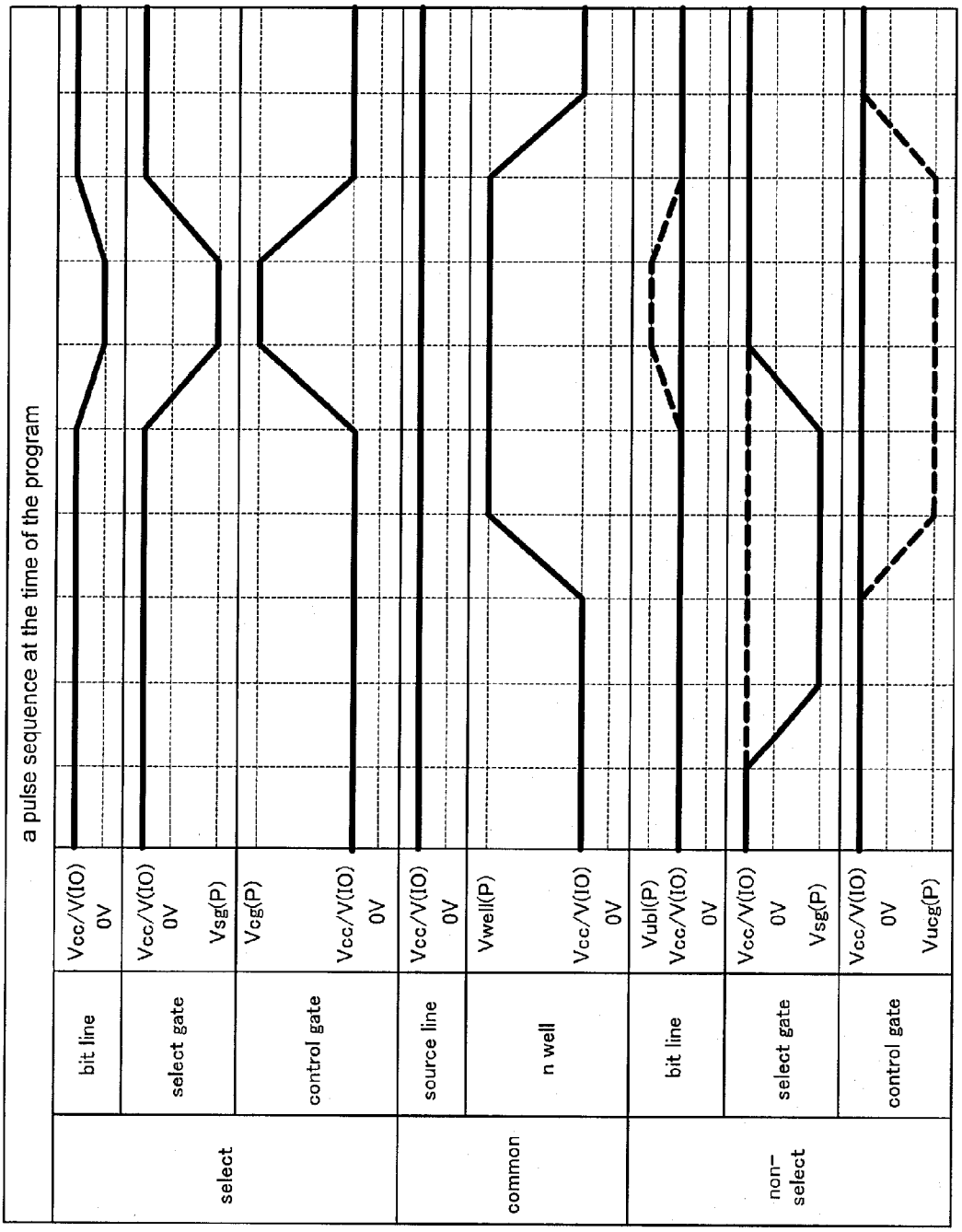
FIG. 5 is a diagram which shows a pulse sequence at the time of programming the memory cell.
Figure 6:
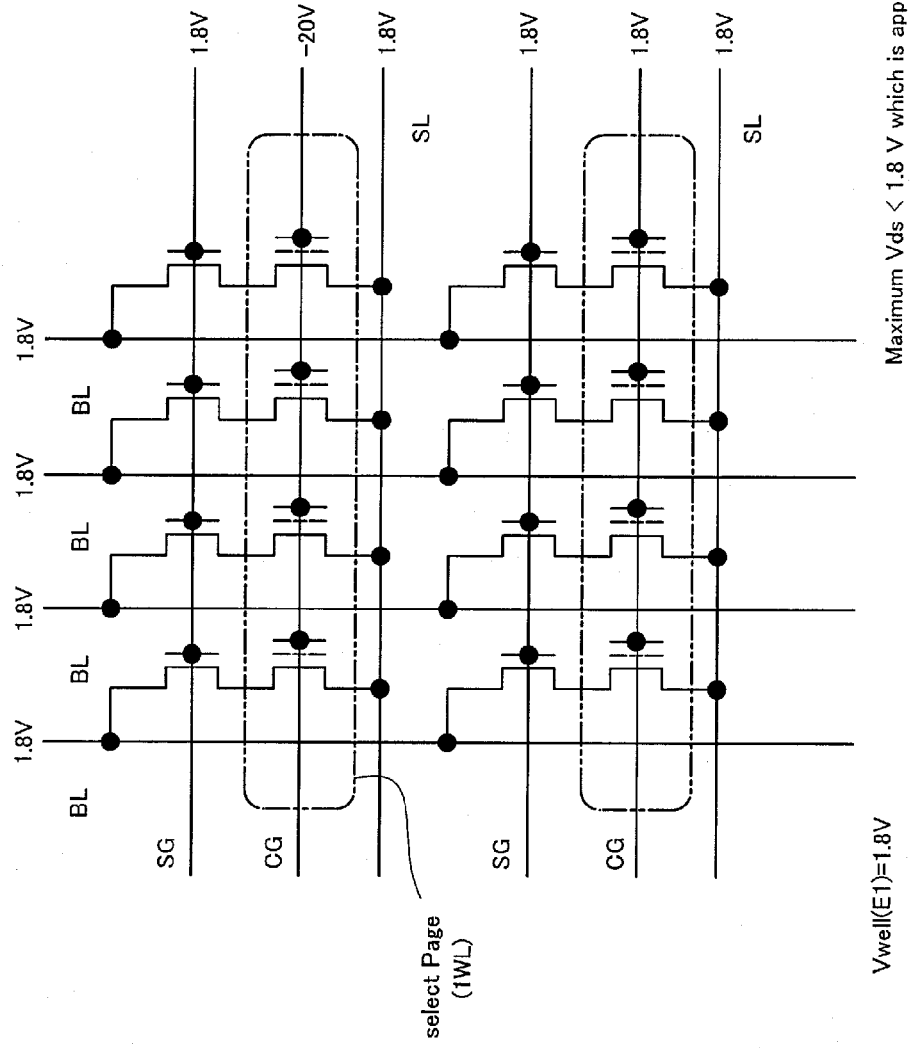
FIG. 6 is a diagram which shows the application conditions of an erase (first embodiment) voltage of the memory cell.
Figure 7:
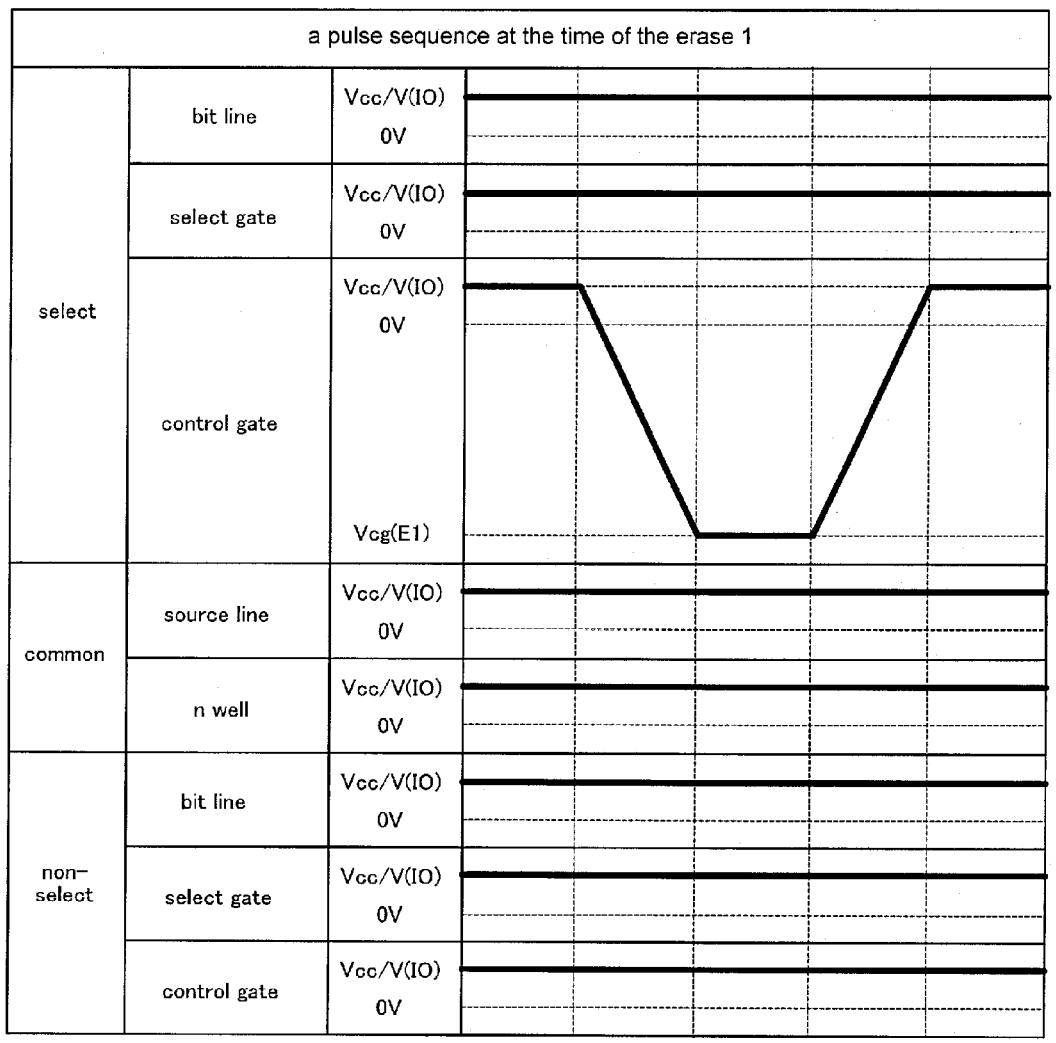
FIG. 7 is a diagram which shows a pulse sequence at the time of erasure (first embodiment) of the memory cell.
Figure 8:
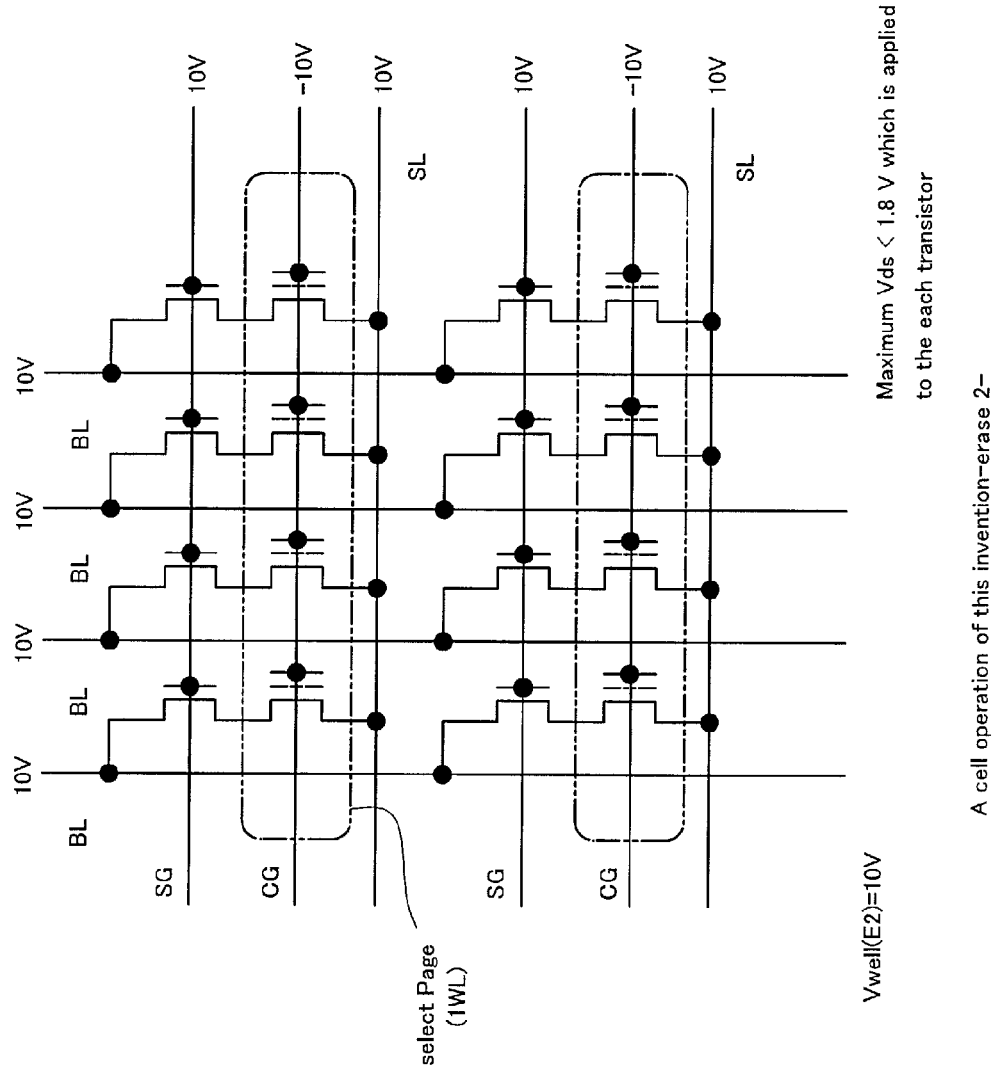
FIG. 8 is a diagram which shows the application conditions of an erase (second embodiment) of the memory cell.
Figure 9:
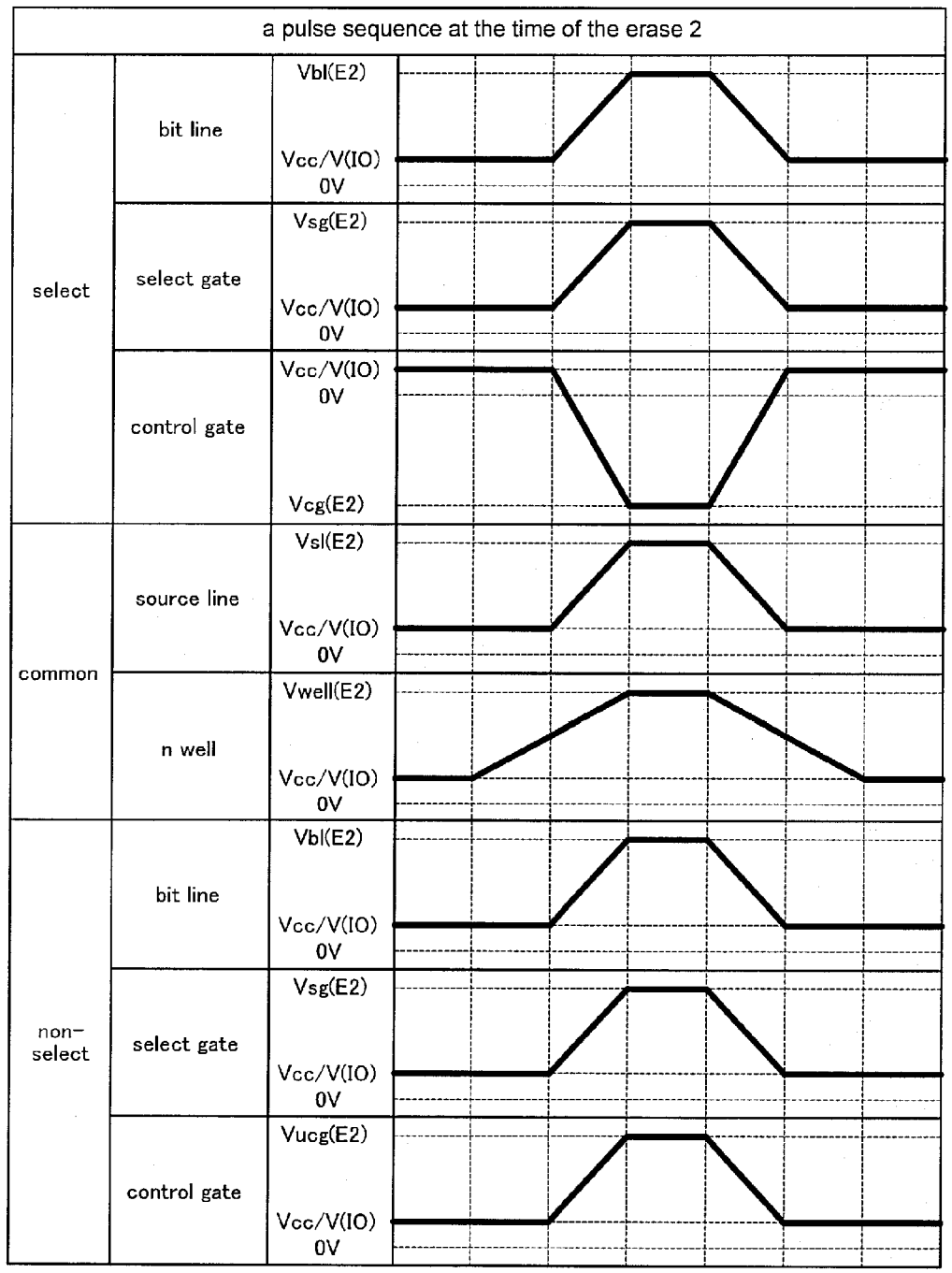
FIG. 9 is a diagram which shows a pulse sequence at the time of erasure (second embodiment) of the memory cell.
Figure 10:
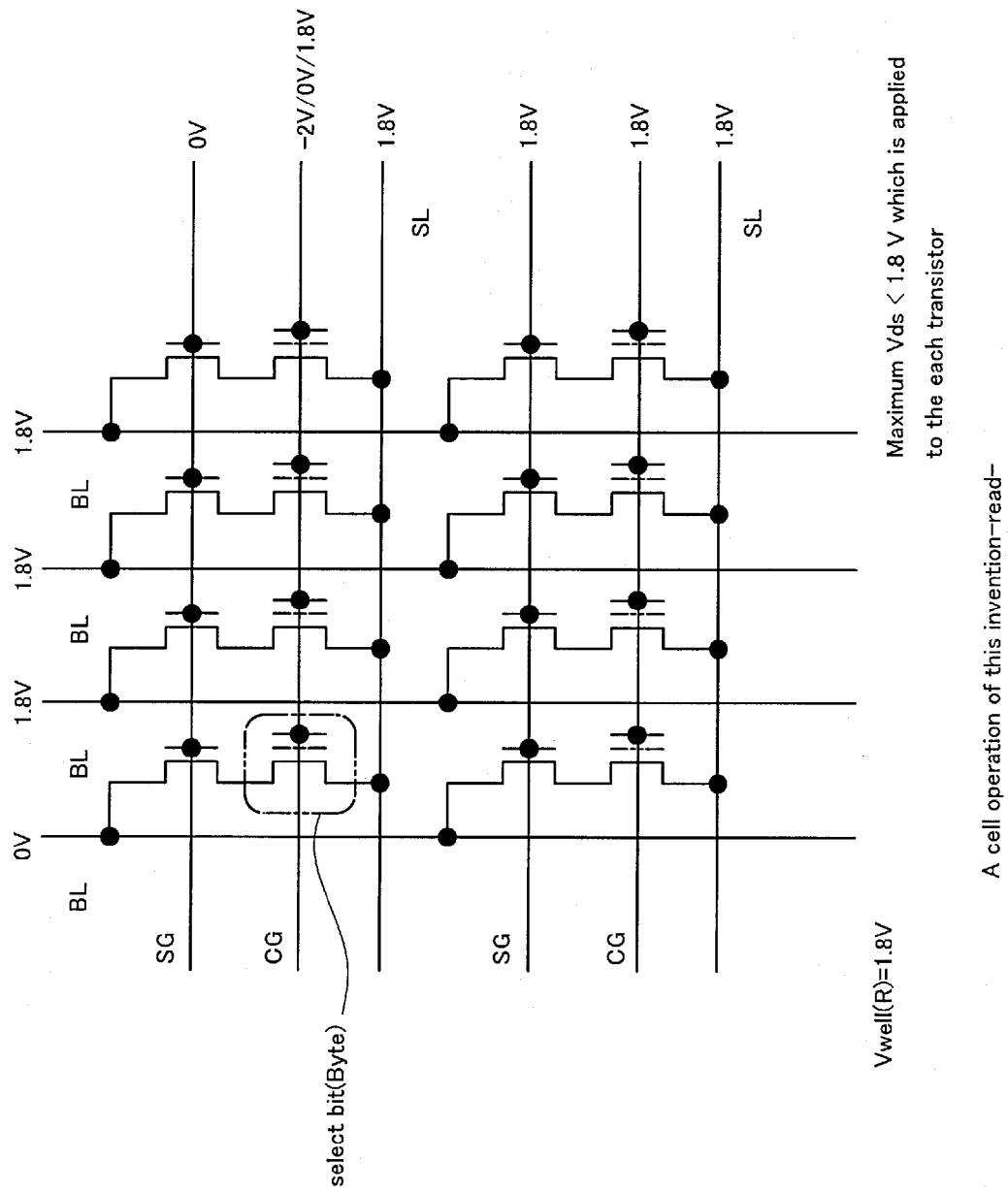
FIG. 10 is a diagram which shows the application conditions of a read voltage of the memory cell.
Figure 11:
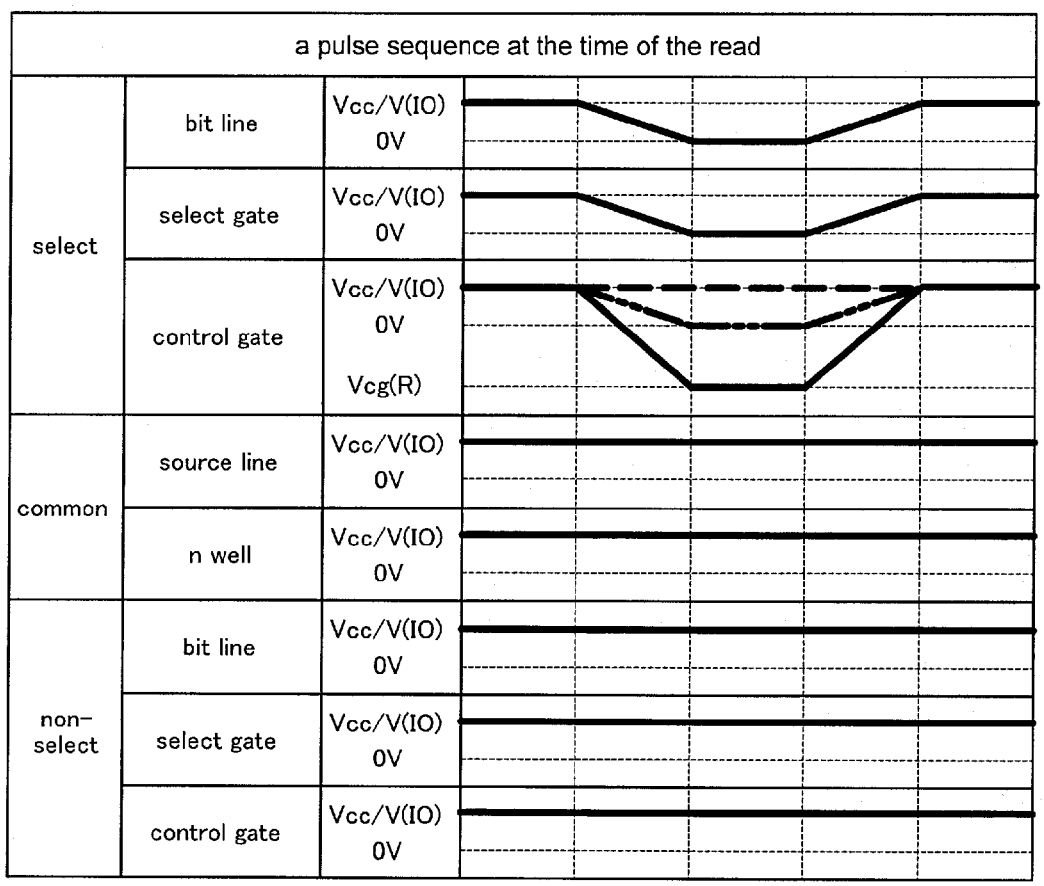
FIG. 11 is a diagram which shows a pulse sequence at the time of reading the memory cell.

The programming, erasure and reading operations of the memory cell 1 will be explained while referring to FIG. 3 to FIG. 11. FIG. 3 (A) is a comparison chart of the operation conditions of programming, erasure and reading. FIG. 4 and FIG. 5 are diagrams which show the voltage application conditions and pulse sequence when programming FIG. 6 and FIG. 7 are diagrams which show the voltage application conditions and pulse sequence when erasing (first embodiment). FIG. 8 and FIG. 9 are diagrams which show the voltage application conditions and pulse sequence when erasing (second embodiment). FIG. 10 and FIG. 11 are diagrams which show the voltage application conditions and pulse sequence when reading.

First, the operation in the case where data is programmed to this memory cell, that is, in the case where the memory transistor is programmed, will be explained while referring to FIG. 3 (A), FIG. 4 and FIG. 5.

The characteristics of the programming operation of this memory cell are that the memory transistor is programmed by Band to Band Tunneling (BTBT) hot electrons (BBHE). The programming current used in a program operation using BBHE is small compared to a programming current used in a program operation using channel hot electrons (CHE). Therefore, a program operation using BBHE is about 100 times more efficient than a program operation using (CHE) or simultaneous programming (high speed programming) of a memory cell is 1000 times faster. Furthermore, another characteristic of the programming operation of this memory cell is that by applying a back gate voltage (for example, 8V) to the N type well 101 when programming, BBHE is generated near the drain by a small Vds (a voltage between the drain and source of the memory transistor). As a result, because the channel length of the memory transistor can be reduced, miniaturization of the memory cell becomes easier, and because it is possible to form a drive transistor which drives a bit line with a high speed Vcc transistor (or I/O transistor), greater high speed programming is possible.

In an initial state, a bit line BL, the select gate SG, the control gate CG and the source line SL are all Vcc (or an I/O voltage: also the same in the explanations in FIG. 3 to FIG. 11).

(1) The select gate of a non-selected cell is applied with Vsg (P) (for example, −3V) in advance, the selection transistor of the non-selected cell is switched ON and the N well is applied with a back gate voltage of Vwell (P) (for example, 8V). BBHE occurs easily in the selected cell due to the application of this back gate voltage. Because the selection transistor of the non-selected cell is ON, the drain of the memory transistor (source of the selection transistor) is maintained at Vcc and the voltage does not rise due to coupling with the N well. The select gate voltage of the non-selected cell is returned to Vcc after the N well voltage is stabilized at Vwell (P).

(2) Next, the bit line of the selected cell is set at 0V, the select gate voltage is reduced to Vsg (P) (for example, −3V), the selection transistor 11 is switched ON and the voltage of the control gate CG is increased to Vcg (P) (for example, 8V). As a result, the drain (P+ region) 103 of the memory transistor 10 becomes 0V and BBHE occurs near the drain due to the potential difference with the N well. This BBHE is extracted by the voltage of the control gate CG and injected/implanted into the charge storage layer (including the floating gate).

(3) Following this, the bit line of a selected cell, the select gate and control gate are returned to Vcc and programming is completed by also returning the voltage of the N well to Vcc.

Furthermore, in order to reduce the effects on the non-selected cell which shares a word line with a selected cell at the time of the operations in (2), an inhibit voltage Vubl (P) (about 2 times Vcc, Vio) may be applied to the bit line of the non-selected cell.

In addition, in the operations in (1) stated above, before applying a back gate voltage of Vwell (P) to the N well, the select gate of the non-selected cell is set at Vsg (P) in advance and the selection transistor of the non-selected cell is switched ON, however, instead of this, the selection transistor may be switched ON by reducing the control gate of the non-selected cell to Vucg (P) (for example, −3V) as shown by the dotted line in FIG. 5.

The erasure operation (first embodiment) of data in a memory cell will be explained while referring to FIG. 3 (A), FIG. 6 and FIG. 7. This erasure operation is an operation in which the accumulated electrons are ejected by an FN (Fowler-Nordheim) tunnel current.

In an initial state, a bit line, the select gate SG, the control gate CG and the source line SL are all Vcc and the selection transistor of all the memory cells are switched OFF.

In this state, the control gate of the selected cell (selected row) is applied with an erasure voltage Vcg (E1) (for example, −20V). As a result, the electrons are extracted towards the substrate from the charge storage layer and the memory transistor is erased.

The erasure operation (second embodiment) of data in a memory cell will be explained while referring to FIG. 3 (A), FIG. 8 and FIG. 9. This erasure operation is also an operation in which the accumulated electrons are ejected by an FN (Fowler-Nordheim) tunnel current the same as in the first embodiment. However, the erasure voltage which is applied to the control gate is reduced to about −10V (a potential difference of −20V) by biasing all the memory cells (memory array) with about 10V. As a result, it is possible to use a low break down voltage high speed transistor as the transistor which drives the control gate.

All the voltages except the control gate of the selected cell (row), that is, the N well, source line, bit line of the selected cell, select gate of the selected cell, bit line of the non-selected cell, select gate of the non-selected cell and control gate of the non-selected cell are applied with the voltages Vwell (E2), Vsl (E2), Vbl (E2), Vsg (E2), Vbl (E2), Vsg (E2) and Vucg (E2) respectively. These voltages may be almost the same, for example, about 10V. Furthermore, because the capacitance of the N well is large and a shift in voltage takes a certain period time, the application of the N well voltage may be started slightly earlier than the other voltages as shown in FIG. 9. Then, at the same time, the control gate voltage of the selected cell is reduced to Vcg (E2) (for example, −10V). That is, the voltage difference between the bias voltage and the control gate voltage of the selected cell may become the voltage which generates FN. As a result, the the accumulated electrons are ejected towards the substrate from the charge storage layer and the memory transistor is erased.

The reading operation (second embodiment) of data in a memory cell will be explained while referring to FIG. 3 (A), FIG. 10 and FIG. 11. As the same time as releasing/cancelling the application of a selected cell bit line voltage Vcc, the select gate voltage is reduced to 0V and the selection transistor is switched ON. Then, the control gate voltage of the memory transistor is reduced to a predetermined voltage. The voltage level Vcg (R) is determined by the specifications (threshold voltage at the time of programming) of the memory transistor.

At the time of programming, erasure and reading explained above, a variety of voltages are applied to each part, and the magnitude relationship formula of that voltage is shown in FIG. 3 (B). Furthermore, in this formula, "=" means substantially equal such as supplied from the same power supply circuit and does not mean strictly the same voltage.

Figure 12:
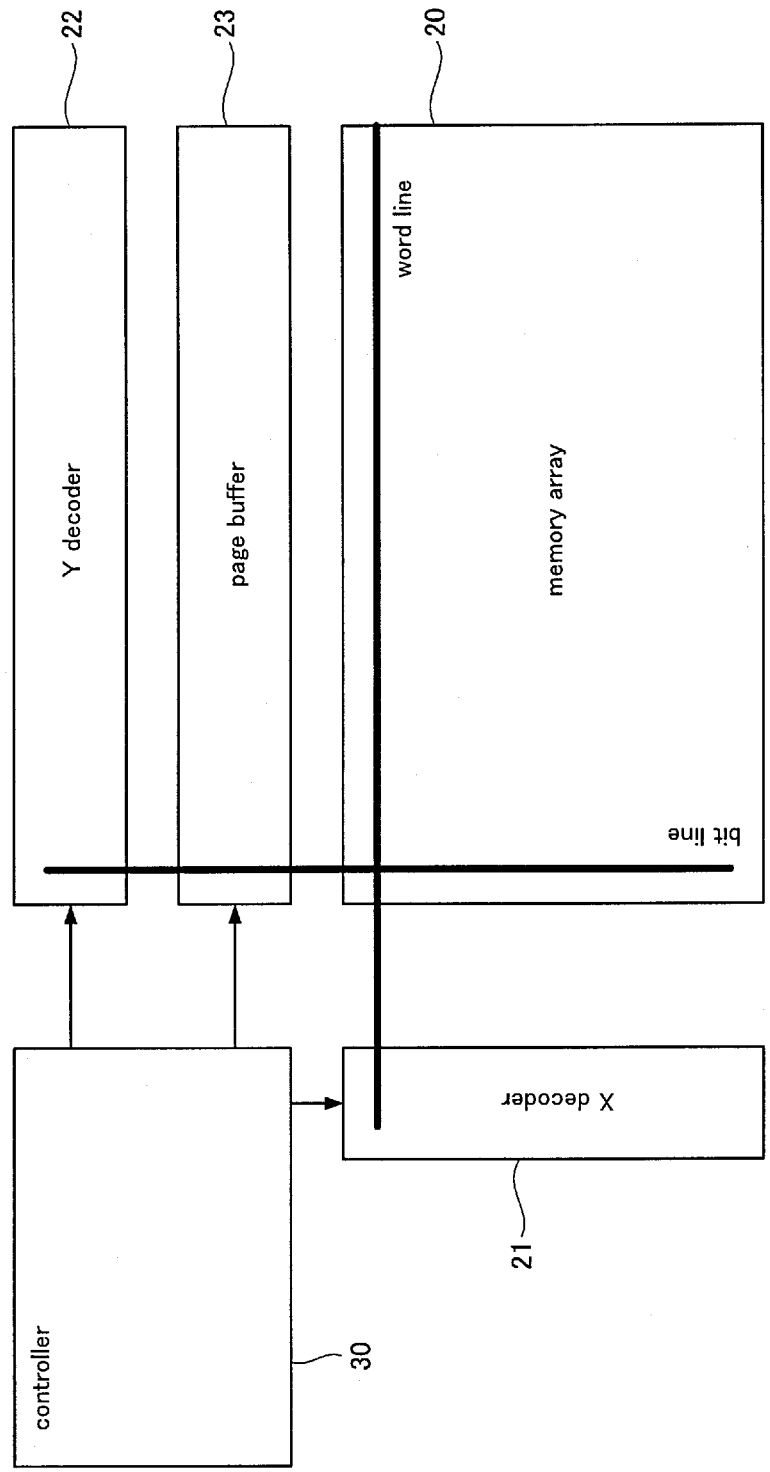
FIG. 12 is an outline structural diagram of a memory device arranged with the memory cell.
Figure 13:
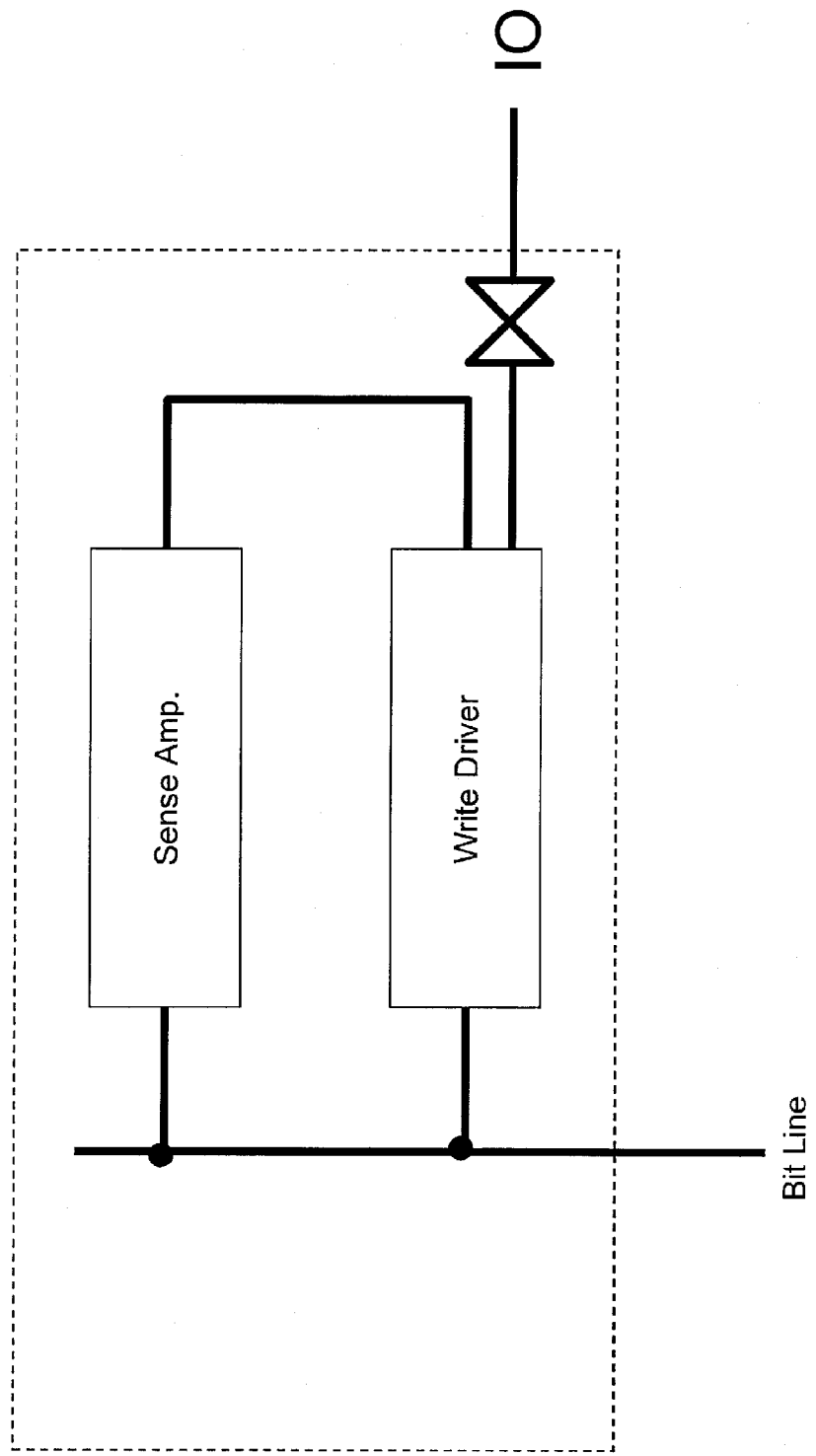
FIG. 13 is a page buffer block diagram of the memory device.

FIG. 12 is a diagram which shows an example structure of a memory device comprised of a memory array in which the above stated memory cells are arranged in a X (row), Y (column) matrix. In addition, FIG. 13 is circuit block diagram of one cell's page buffer incorporated in this memory device. A page buffer is arranged with a number of sense amplifiers and programming buffers corresponding to all the bit lines (for example, 1024).

A memory cell array 20 is arranged with, for example, 1024 of the above stated memory cells in the X (row) direction X 1024 memory cells in the Y (column) direction. A word line and a select line are arranged for each row and a bit line is arranged for each column. Each word line and each select line are driven by an X decoder 21. In addition, each bit line is driven by a Y decoder 22. A page buffer 23 is connected between the Y decoder 22 and a memory cell. The page buffer 23 buffers data of one word line's memory cell (1024 cells in this example). The page buffer 23 buffers the data read from the memory cell and also buffers the data programmed to the memory cell.

The operations of the X decoder 21, the Y decoder 22 and the page buffer 23 are controlled by a controller 30. The controller 30 controls the programming, erasing and reading of data to and from a predetermined memory cell according to an external instruction.

In this memory device, a characteristic operation is a one bit reprogram emulate operation.

This memory device is arranged with the page buffer 23 which buffers the data of one word line, high speed programming of data of one word line is simultaneously possible by BBHE programming and by arranging a selection transistor for each memory cell, it is possible to erase data in a unit of a memory cell which share a word line. Thus, by making the controller 30 perform the following control operations, it is possible to emulate data reprogramming in one bit units.

(1) All of the data of a memory cell connected to one word line is read to the corresponding page buffer 23.

(2) The data of the memory cell connected to this word line is erased.

(3) One data or a plurality of data out of the data which is read to the page buffer is reprogrammed according to an external reprogram request.

(4) The contents of this reprogrammed page buffers are programmed back to the original memory cell connected to this one word line.

Furthermore, the operations in (2) and (3) may be reversed.

Figure 14:
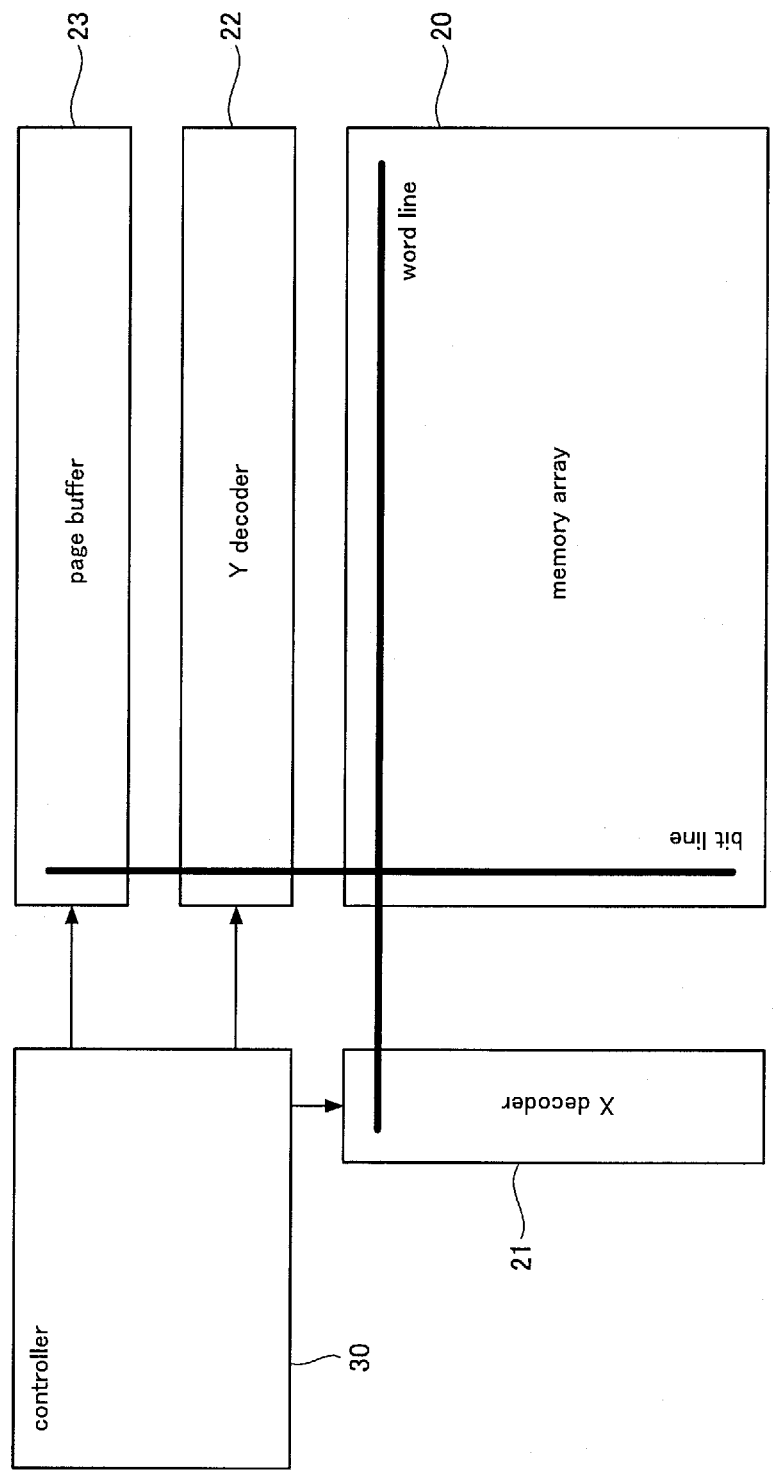
FIG. 14 is a diagram which shows another embodiment of the memory device.
Figure 15:
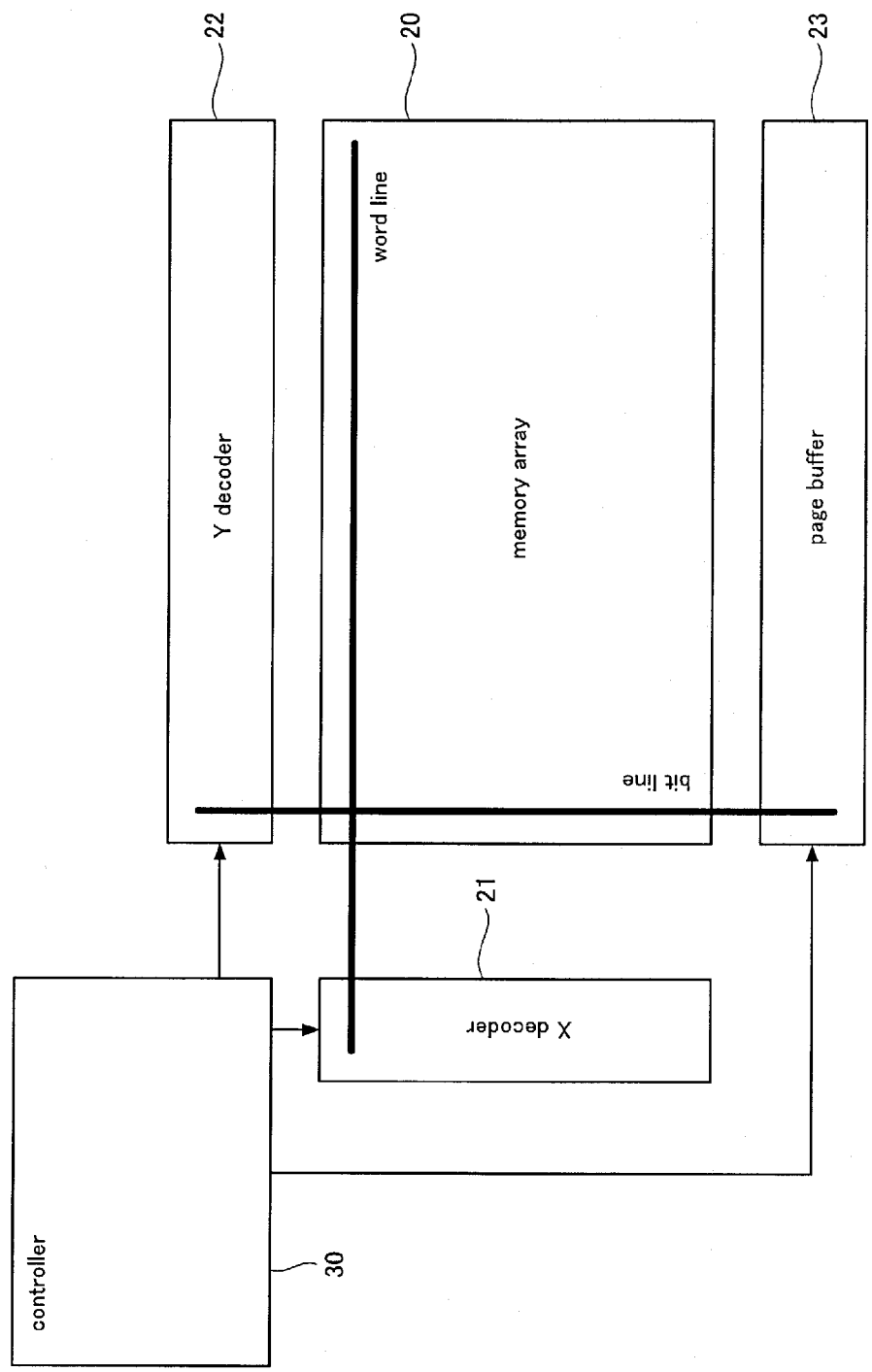
FIG. 15 is a diagram which shows another embodiment of the memory device.
Figure 16:
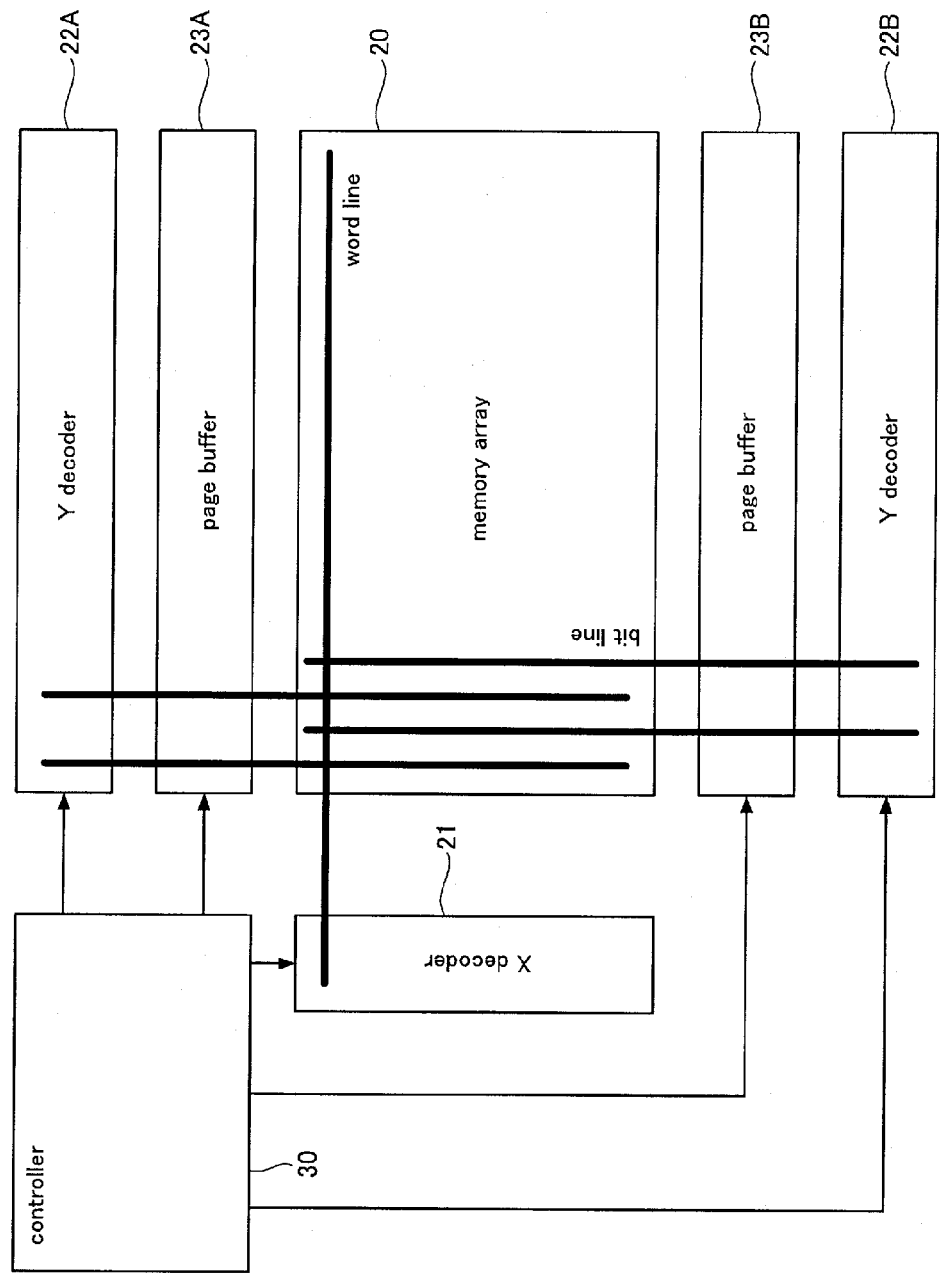
FIG. 16 is a diagram which shows another embodiment of the memory device.

In addition, FIG. 14 to FIG. 16 are diagrams which show other embodiments of the memory device. In these embodiments, the connection configuration between the memory device and the page buffer in FIG. 12 is different. In the embodiment in FIG. 14, the location of the page buffer 23 and the Y decoder is swapped. In the embodiment in FIG. 15, when viewed from the memory device 20 the page buffer 23 is arranged on the opposite side of the Y decoder. In addition, in the embodiment in FIG. 16, a Y decoder 22 (22A, 22B) and a page buffer 23 (23A, 23B) are arranged on the Y side (top) and −Y side (bottom) of the memory cell array 20 and a decode and buffer operation are performed on an odd numbered bit line in the top side Y decoder 22A and page buffer 23A and a decode and buffer operation are performed on an even numbered bit line in the bottom side Y decoder 22B and page buffer 23B. Because the Y decoder 22 and the page buffer 23 circuits are larger than a memory cell, by dividing the circuits above and below the memory cell in this way, it is possible to create ample space and better makes use of a memory cell's (memory array) scaling efficiency.

Another embodiment of a memory cell array will be described hereafter.

In the embodiment stated above, an example of a memory cell array in which one word line is arranged for each row was shown. That is, in a memory cell array in which a plurality of memory cells are arranged in an X, Y matrix, a word line and a select line are arranged for each row and a common source line is also arranged for the entire memory cell array.

The memory cell array of the second embodiment explained below has a structure in which the memory cell array is divided into one byte sections in an X direction and a word line is individually arranged for each of the divided bytes. Here, one byte means a unit of data programming (for example, the width of a data bus), and is not limited to eight bits. By adopting such a structure it is possible to perform reprogramming (read→erase→program) in one byte units.

Figure 17:
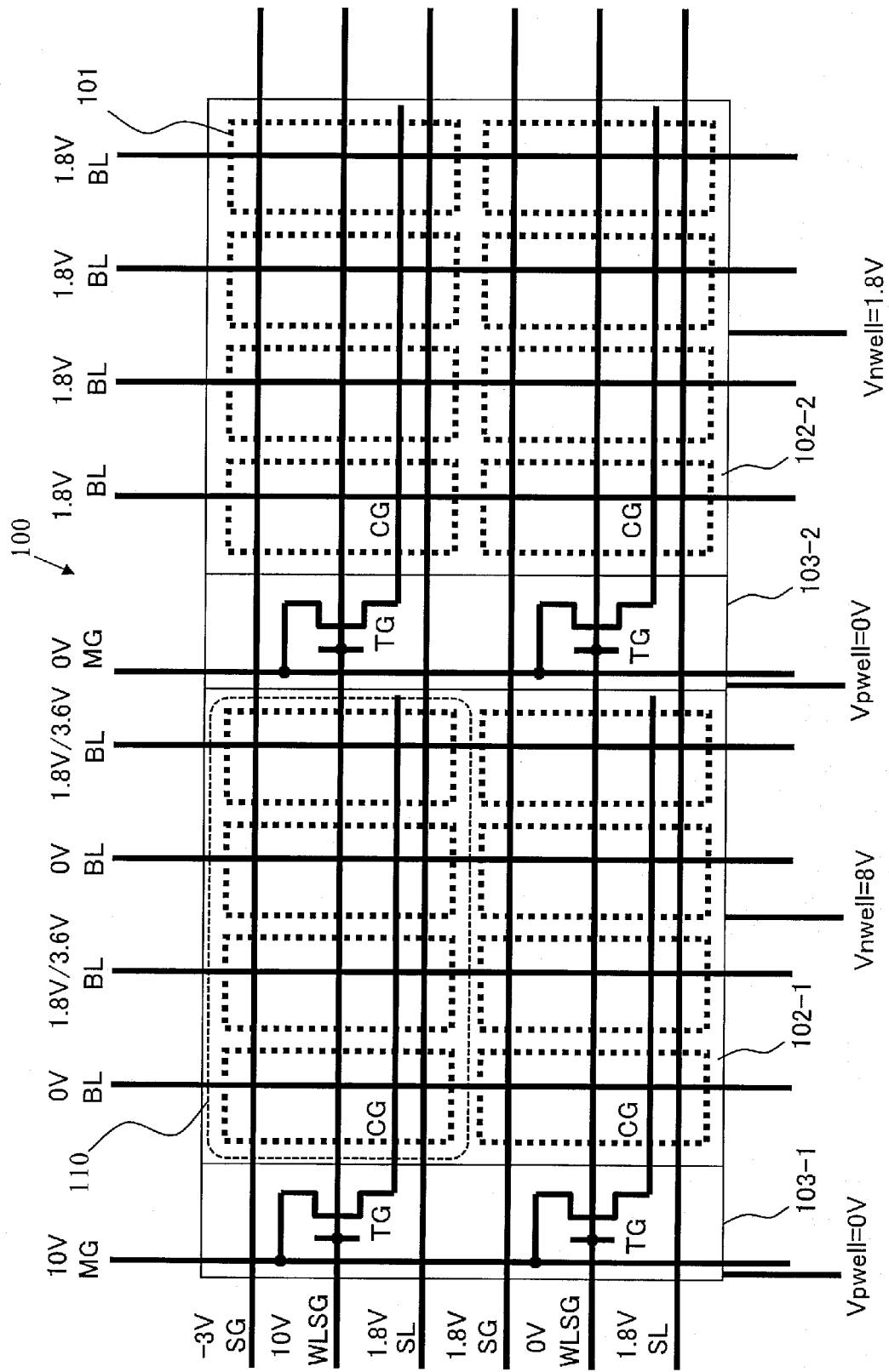
FIG. 17 is a diagram which shows the second embodiment (at the time of programming) of a memory array
Figure 18:
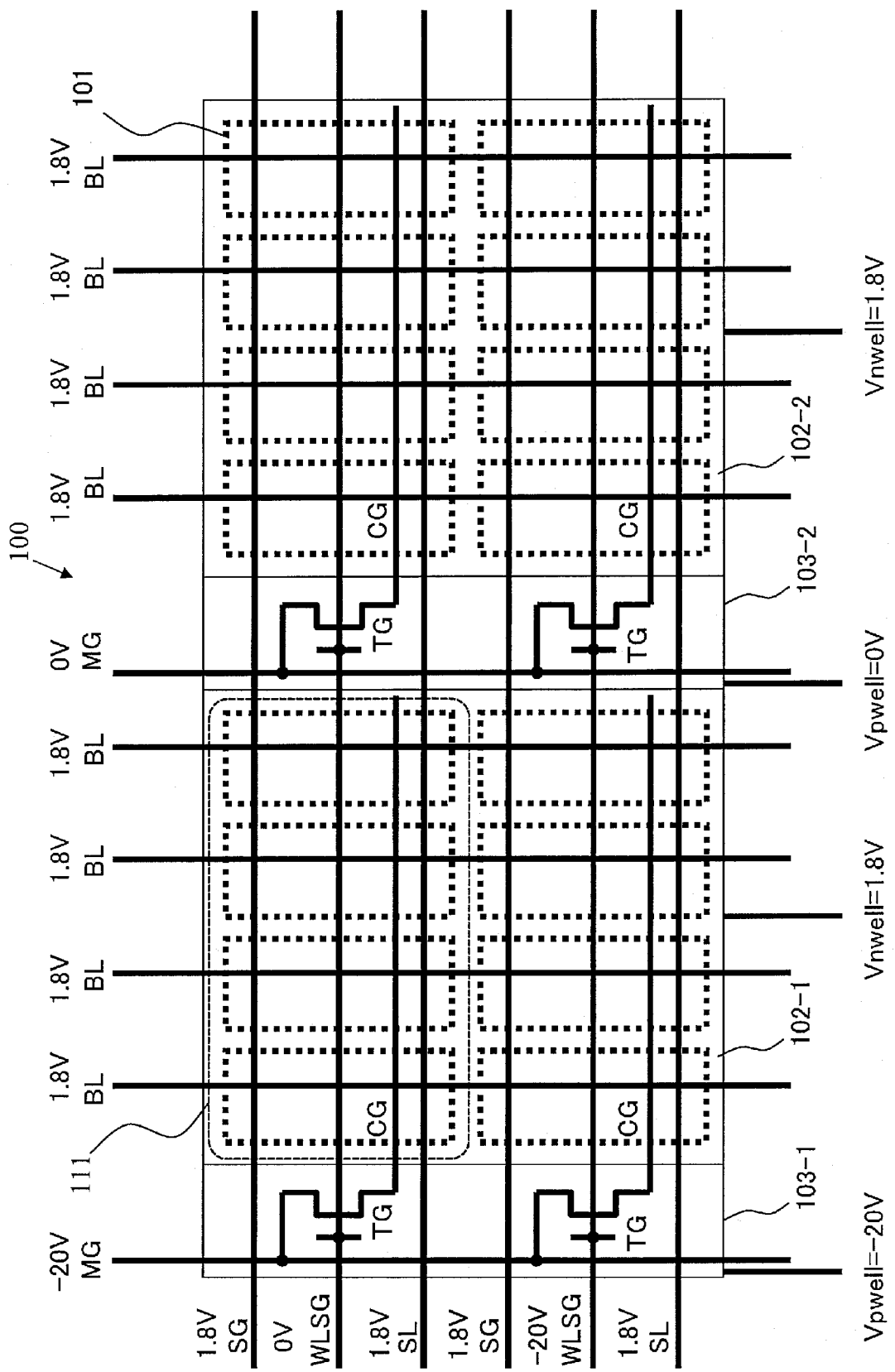
FIG. 18 is a diagram which shows the second embodiment (at the time of erasure) of a memory array
Figure 19:
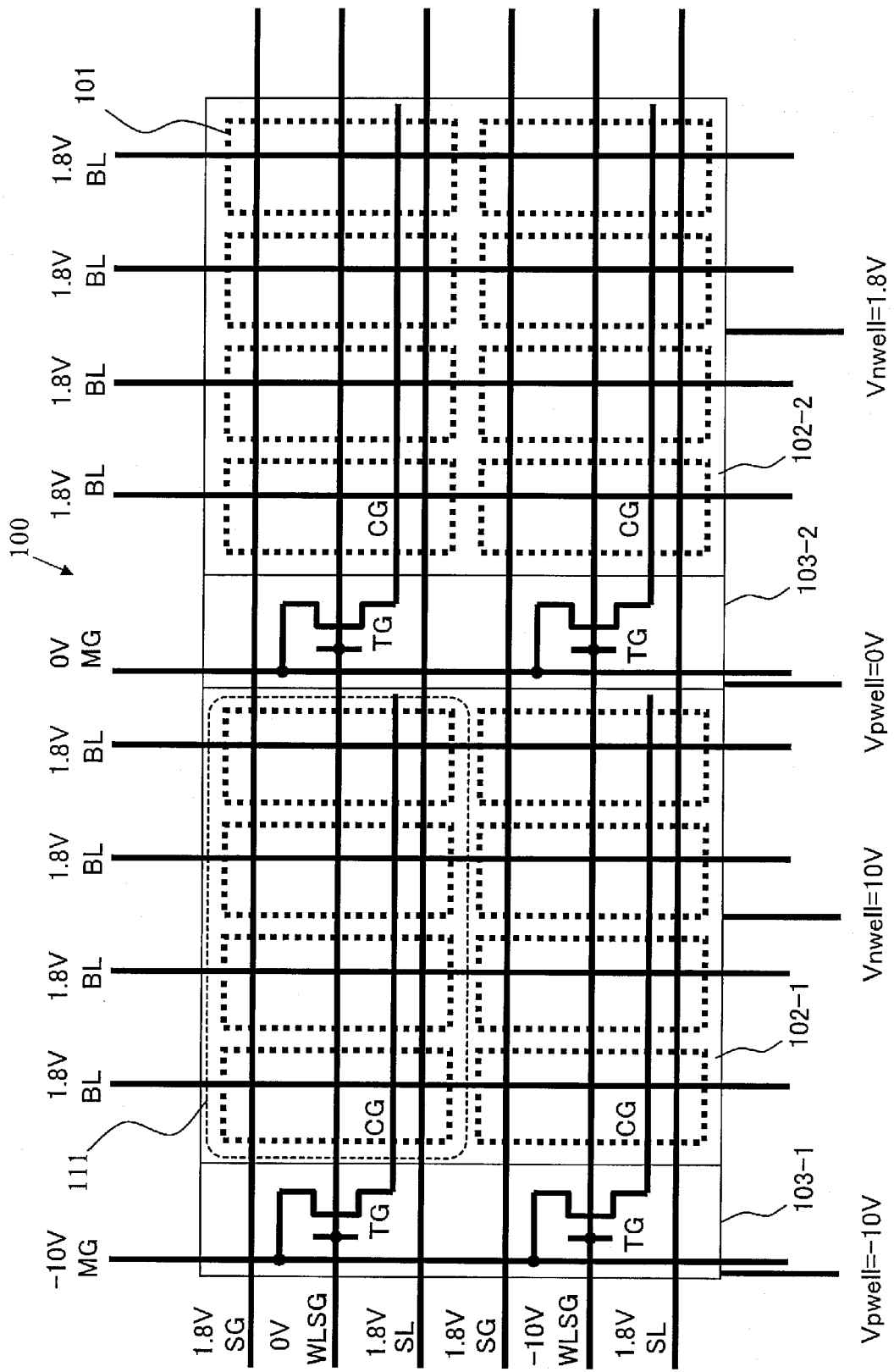
FIG. 19 is a diagram which shows the second embodiment (at the time of erasure) of a memory array
Figure 20:
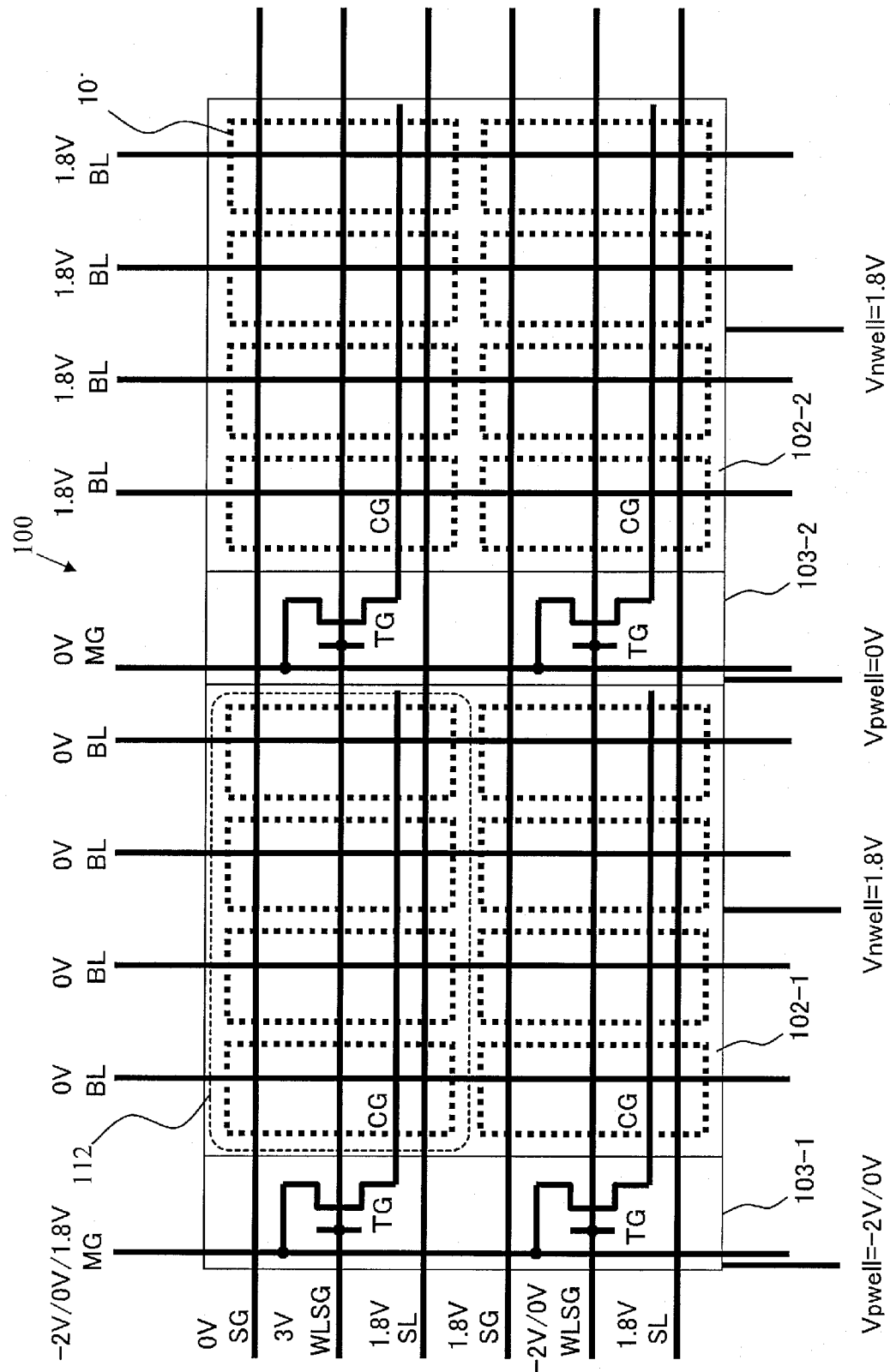
FIG. 20 is a diagram which shows the second embodiment (at the time of reading) of a memory array

FIG. 17 to FIG. 20 are planar view diagrams which show the structure of the memory cell array of the second embodiment. FIG. 17 shows the voltage application conditions at the time of programming, FIG. 18 shows the voltage application condition at the time of erasing (first embodiment), FIG. 19 shows the voltage application conditions at the time of erasing (second embodiment) and FIG. 20 shows the voltage application conditions at the time of reading.

In FIG. 17 to FIG. 20, each memory cell 101 which comprises the memory cell array 100 is the same as that shown in FIG. 1 and FIG. 2. The N well 102 arranged in each memory cell is divided into byte blocks (n type well block) 102-$n$ of one byte units (four bits: four columns in the same diagram) and a P well (p type well block) 103-$n$ is formed between each divided N well. The memory cell select line SG is formed on each row across a plurality of byte blocks and across the entire memory cell array in row direction. The word line CG is arranged on each row in byte block units. Each one byte unit word line CG is connected to a gate voltage supply line MG via a transfer gate Tr. The transfer gate Tr is formed within the P well 103 for each one byte unit word line CG The transfer gate Tr arranged in a column (Y) direction and formed within the same P well 103-*n*, is connected to the same gate voltage supply line MG In addition, the gate of the transfer gate Tr which is arranged on the same row across a plurality of byte blocks 102-*n*, is connected to a word line select line WLSG which is arranged across the entire memory cell array in a row direction.

In the memory cell array with the above stated structure, the voltage which should be applied to a word line (control gate) among the programming voltage, erase voltage and read voltage of the first embodiment shown FIG. 3 to FIG. 11, is applied to the gate voltage supply line MG of a byte block in which the byte desired to be reprogrammed (read, erased or programmed) exists. The voltage which is applied to each bit line, source line, each N well and each select line (select gate) is the same as in the first embodiment.

In addition, in this embodiment, in order to apply a voltage only to a word line CG of a byte desired to be reprogrammed and perform reprogramming in byte units, a voltage such as that described below is applied to a word line select line WLSG and each P well.

At the time of programming operation shown in FIG. 17, the voltage of the gate of the transfer gate Tr which applies a voltage to the word line CG of the byte 110 to be programmed is made the same as the voltage which is applied to the gate voltage supply line MG and the transfer gate Tr is switched ON. Here, because 10V is applied to the gate voltage supply line MG, 10V is also applied to the gate of the transfer gate Tr of the byte to be programmed. That is, 10V is applied to the selected word line select line WLSG. Other (non-selected) gate voltage supply lines MG are 0V and other (non-selected) word line select lines WLSG are 0V. All of the P wells are 0V.

At the time of an erase operation in the first embodiment shown in FIG. 18, –20V is applied to a gate voltage supply line MG which applies a voltage to the word line (control gate CG) of the byte 111 to be erased and –20V is also applied to the P well 103-1 which corresponds to this gate voltage supply line MG Then, the selected word line select line WLSG is set at 0V, the transfer gate Tr of the byte to be erased is switched ON, –20V is applied to the non-selected word line select line WLSG and the non-selected transfer gate is switched OFF. Therefore, the non-selected gate voltage supply line MG and the non-selected P well 103-*n* are 0V.

At the time of an erase operation in the second embodiment shown in FIG. 19, –10V is applied to a gate voltage supply line MG which applies a voltage to the word line (control gate CG) of the byte 111 to be erased and –10V is also applied to the P well 103-1 which corresponds to this gate voltage supply line MG Then, the selected word line select line WLSG is set at 0V, the transfer gate Tr of the byte to be erased is switched ON, –10V is applied to the non-selected word line select line WLSG and the non-selected transfer gate is switched OFF. In this erase operation, 10V is applied only to the N well 102-1 arranged in the byte to be erased as is shown in FIG. 8 and FIG. 9. Furthermore, the non-selected gate voltage supply line MG and the non-selected P well 103-*n* are 0V and a voltage of about 1.8V (Vcc or I/O voltage) is applied to the non-selected N well 102-*n*.

At the time of a read operation shown in FIG. 20, a predetermined voltage (–2V/0V/1.8V) is applied to selected gate voltage supply line MG The type/level of voltage applied is determined by the specifications of the memory transistor or the memory cell. The transfer gate of the byte to be read is switched ON by applying 3V to the selected word line select line WLSG. A voltage of about –2V to 0V depending on the gate voltage is applied to the other non-selected word line select lines WLSG. In addition, a voltage of about –2V to 0V depending on the gate voltage is also applied to the P well 103-1 in which the transfer gate of the byte to be read 112 is arranged. The voltage of the other non-selected P well 103 is 0V.

Furthermore, the P wells 103-1-*n* in which a transfer gate Tr is formed are each commonly formed and may be controlled at the same potential.

Figure 21:
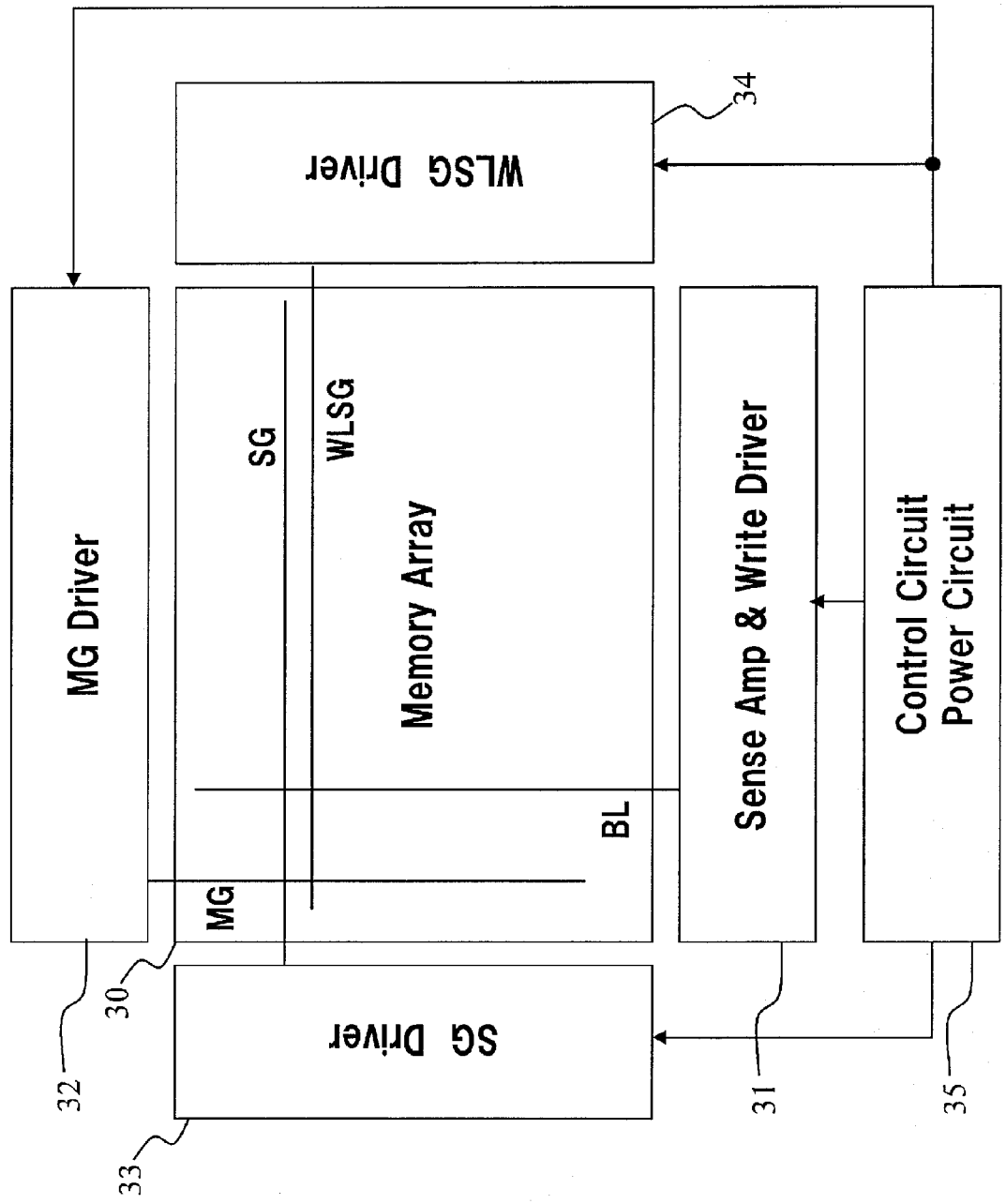
FIG. 21 is an outline structural diagram of a memory device arranged with the memory cell.

FIG. 21 is a diagram which shows an example structure of a memory device arranged with the memory cell array shown in FIG. 17 to FIG. 20. Sense amplifiers and program driver circuits 31 which control bit lines, and MG drivers 32 which control the gate voltage supply lines are arranged in the Y side periphery of the memory cell array 30. The number of these circuits is the same as the number of the programming/reading (one byte) unit. In addition, SG drivers 33 which control SGs and WLSG drivers 34 which control WLSGs are arranged on the X side periphery of the memory cell array. The operations of each driver 31 to 34 are controlled by control circuits and power circuits 35. Programming, erase and reading operations in byte units can be executable due to the above stated structure and voltage application conditions.

Another structure of the present invention is shown below.

Another structure of the present invention, proposes a P channel type nonvolatile semiconductor memory device in which disturb stress in the memory cell which is applied with a B4-HE program operation, can be relieved and also a programming method of the nonvolatile semiconductor memory device.

The embodiments of the present invention will be explained below while referring to the diagrams. Furthermore, in the embodiments, the same symbols are attached to the same structural parts and to avoid repetition between embodiments some explanations are omitted.

The third embodiment of the present invention will be explained while referring to FIG. 22 to FIG. 28.

Figure 22:
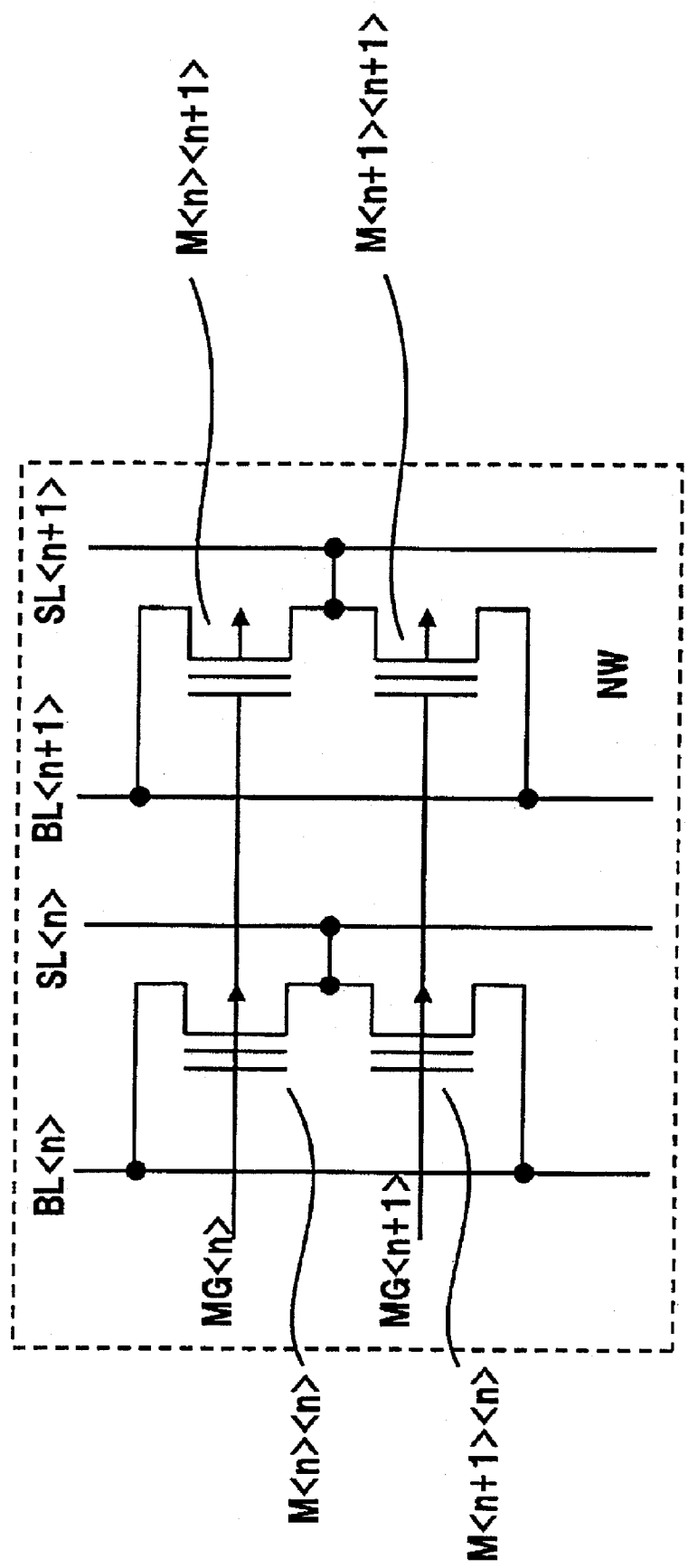
FIG. 22 is an array structural diagram of a nonvolatile memory related to the third embodiment of this invention.

As is shown in FIG. 22, a memory cell array of a NOR type flash memory related to the first embodiment of this invention, is comprised of a plurality of memory cells M<n><n>, M<n+1><n>, M<n><n+1> and M<n+1><n+1> which are formed in an N type well NW. Each individual memory cell is comprised from a P type MIS transistor which has a charge storage layer such as a floating gate, and each memory cell also has a source and a drain. The gate electrode of the n-th row memory cells M<n><n>, M<n><n+1>, is connected to a memory gate line MG<n> which is arranged in a row direction, and the gate of the (n+1)th row memory cells M<n+1><n>, M<n+1><n+1> is connected to a memory gate line MG<n+1> which is arranged in a row direction. The drain of the n-th column memory cells M<n><n>, M<n+1><n> is connected to a bit line BL<n> arranged in a column direction, and the drain of the n-th column memory cells M<n><n+1> and M<n+1><n+1> is connected to a bit line BL<n+1> arranged in a column direction. As a result, the memory cell array has an AND type array shape.

Furthermore, the source of the n-th column memory cells M<n><n>, M<n+1><n> is connected to a source line SL<n> arranged in a column direction, and the source of the (n+1)th column memory cells M<n><n+1> and M<n+1><n+1> is connected to a source line SL<n+1> arranged in a column direction. As a result, the source line SL becomes paired with a bit line, and the source voltage of the MIS transistor which forms the memory cell can be independently controlled for each bit line. Each individual memory cell is comprised form one P type MIS transistor.

Figure 23:
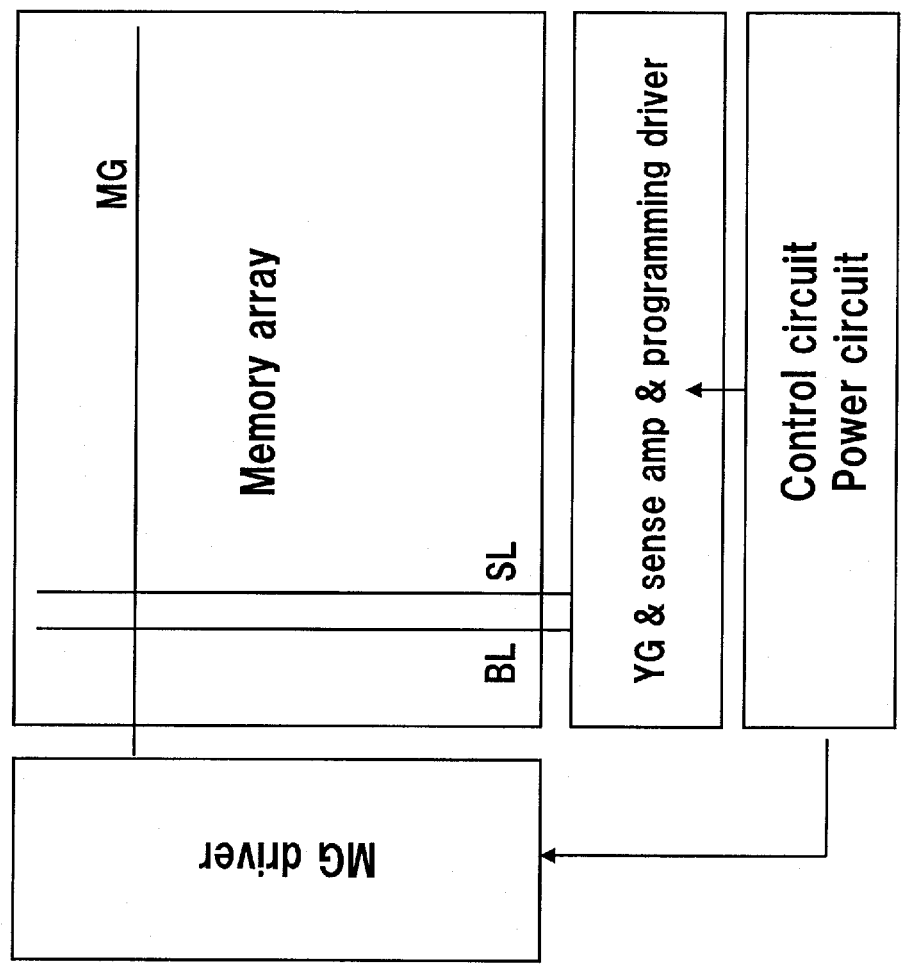
FIG. 23 is an entire structure diagram of a nonvolatile memory related to the third embodiment of this invention.

FIG. 23 shows the entire structure of a nonvolatile semiconductor memory device which includes a circuit for driving the memory cell array shown in FIG. 22. This nonvolatile semiconductor memory device is comprised of the memory cell array shown in FIG. 22, memory gate drivers (MG drivers) which drive memory gate lines (MGs), Y gates (YGs) which drive bit lines (BLs) and source lines (SLs), sense amplifiers (Sense Amps) and program driver. Furthermore, this nonvolatile semiconductor memory device includes control circuits for controlling the memory gate line drivers (MG drivers), Y gates (YGs), sense amplifiers (Sense Amps) and program drivers, and also includes power circuits which supply various voltages to these circuits.

In FIG. 24A, a layout of one memory cell which is included in the memory cell array shown in FIG. 22 is shown. The source and drain are formed by a buried diffusion layer and forming a bit line BL and source line SL are connected to adjacent memory cells above and below in the diagram. The memory gate line MG which is the charge storage layer and control gate, is formed so that it extends parallel to a channel direction of the memory cell. The bit line BL, source line SL and memory gate MG intersect each other.

In FIG. 24A, an example layout of one memory cell which is included in the memory cell array shown in FIG. 22 is shown. The structures of the source and drain are the same and have what is called a symmetrical structure. The source and drain are formed by a buried diffusion layer and forming a bit line BL and source line SL are connected to adjacent memory cells above and below in the diagram. The memory gate line MG which is the charge storage layer and control gate, is formed so that it extends parallel to a channel direction of the memory cell. The bit line BL, source line SL and memory gate MG intersect each other. By adopting such a structure, it is possible to pack the memory cells on the memory chip to a high density, and reduce the chip size even though this nonvolatile semiconductor is large memory capacity.

Figure 24B:
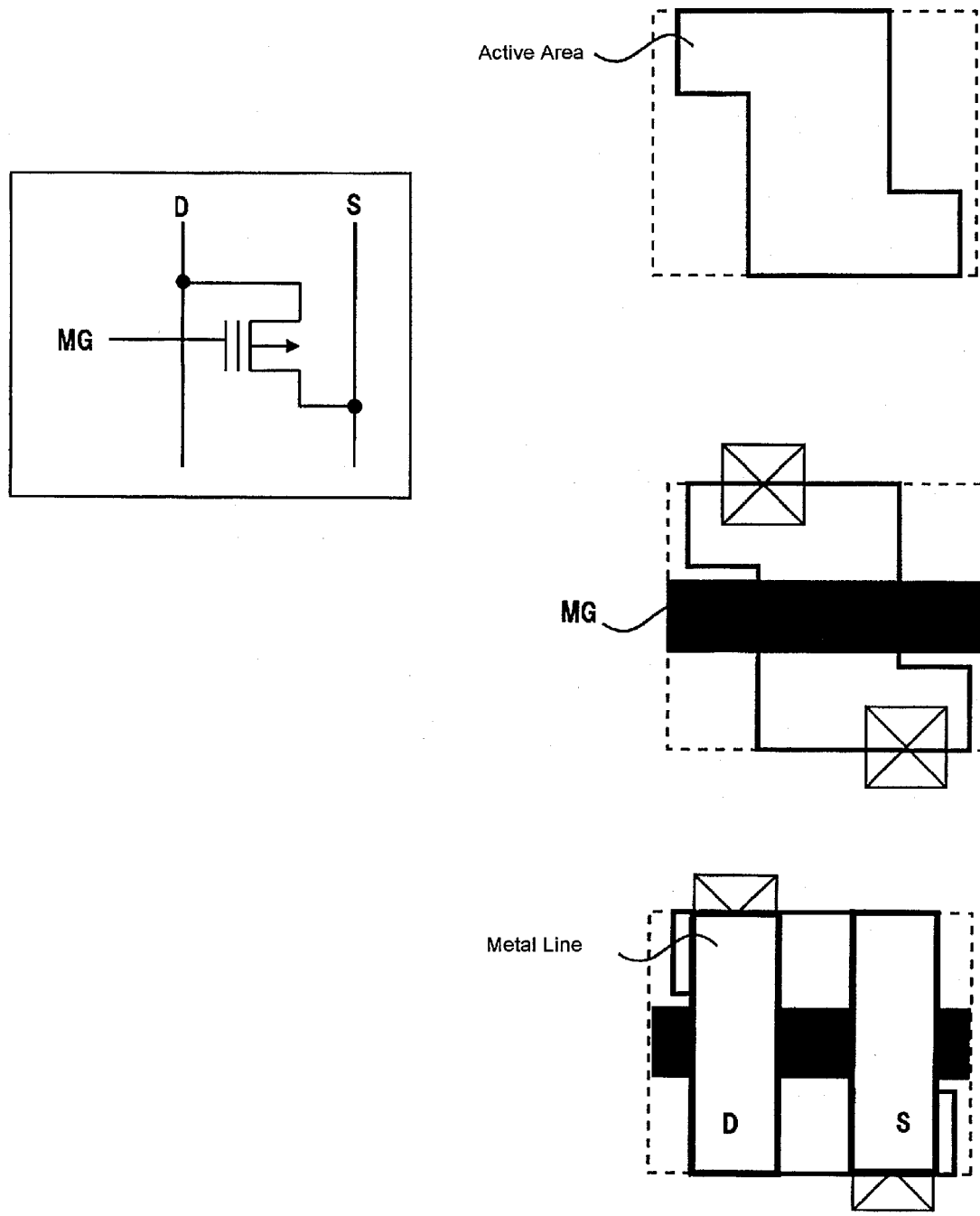
FIG. 24B is one example of a memory cell array layout of a nonvolatile memory related to the third embodiment of this invention.

In FIG. 24B, another example layout of one memory cell which is included in the memory cell array shown in FIG. 22 is shown. The structures of the source and drain are the same and have what is called a symmetrical structure. Each contact between the source and drain and bit line BL and source line SL is mutually arranged differently. The bit line BL and source line SL extends above and below in the diagram. The memory gate line MG which is the charge storage layer and control gate, is formed so that it extends parallel to a channel direction of the memory cell. The bit line BL, source line SL and memory gate MG intersect each other. By adopting such a structure, it is possible to form a bit line BL and source line SL with a metal wire, and conform to a standard CMOS process.

Figure 25A:
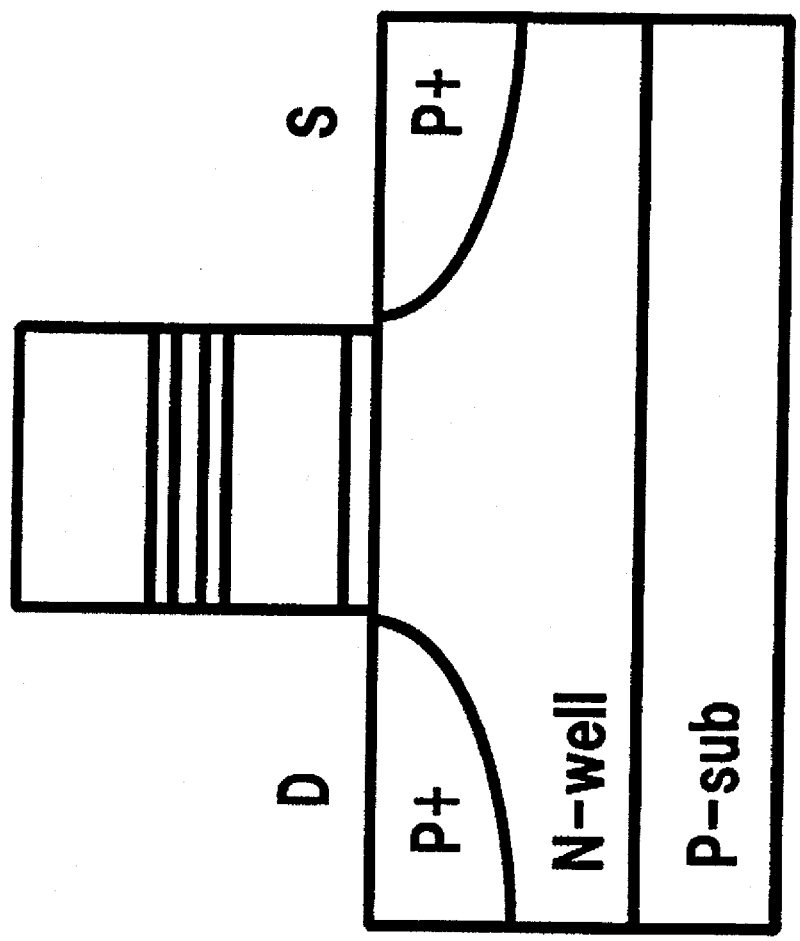
FIG. 25A is one example of a cross section of a memory cell array of a nonvolatile memory related to the third embodiment of this invention.

In FIG. 25A, an example of a cross sectional view of one memory cell which is included in the memory cell array shown in FIG. 22 is shown. This memory cell is formed in an N type well (N-well) which is formed in a P type semiconductor substrate (P-sub) of the semiconductor substrate. The memory cell is comprised from a source (S) and drain (D) which consist of P+ type diffusion regions, a gate insulation film which is stacked on a region (channel) between the source (S) and drain (D), a floating gate (FG), an inter-gate insulation film and a memory gate (MG). The threshold of a memory cell changes due to the storage of electrons in the floating gate (FG) and therefore data is stored.

Figure 25B:
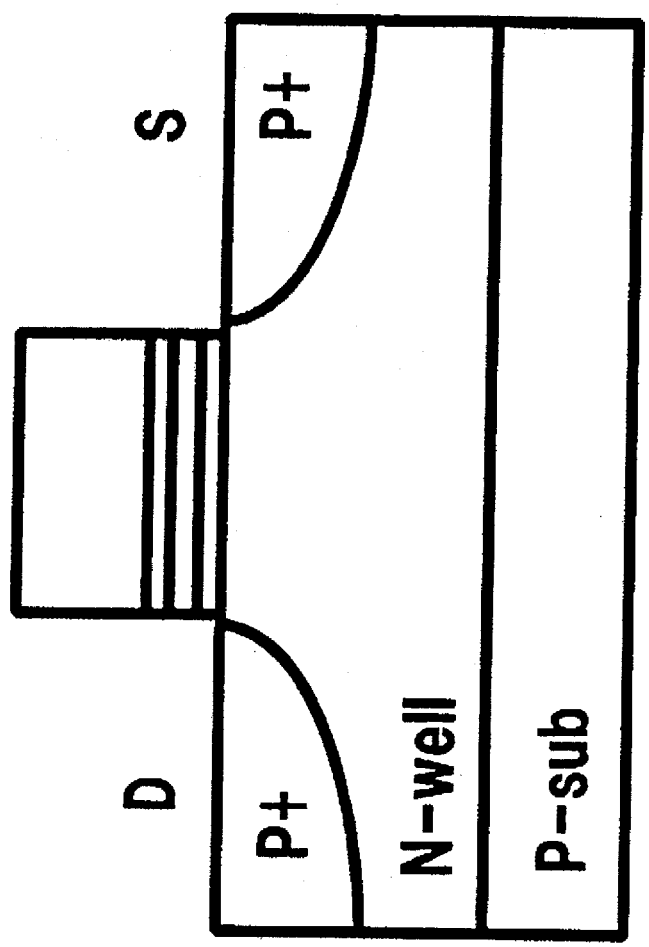
FIG. 25B is one example of a cross section of a memory cell array of a nonvolatile memory related to the third embodiment of this invention.

In FIG. 25B, an example of a cross sectional view of one memory cell which is included in the memory cell array shown in FIG. 23 is shown. This memory cell is formed in an N type well (N-well) which is formed in a P type semiconductor substrate (P-sub) of the semiconductor substrate. The memory cell is comprised from a source (S) and drain (D) which consist of P+ type diffusion regions, a gate insulation film (for example, an ONO film) which includes a charge storage layer stacked on a region (channel) between the source and drain, an inter-gate insulation film and a memory gate (MG). The threshold of a memory cell changes due to the storage of electrons in the charge storage layer and therefore data is stored.

FIG. 26 shows the magnitude relationship of the voltage applied to each part in the third embodiment of the present invention. Sel in the chart shows selection, and Nonsel in the chart shows non-selection. In the chart, READ means read, PGM means program and ERS means erase. There are two ways for erase, one is a block unit erase and the other is a word line unit erase.

FIG. 27 shows examples of specific voltages which are applied to each part in one embodiment of the present invention. Here, a magnitude relationship is shown between a voltage and its potential. Sense in the chart refers to connecting with a sense amplifier not shown in the diagram and applying a required voltage for read out. HiZ in the chart refers to a high impedance state.

Figure 28A:
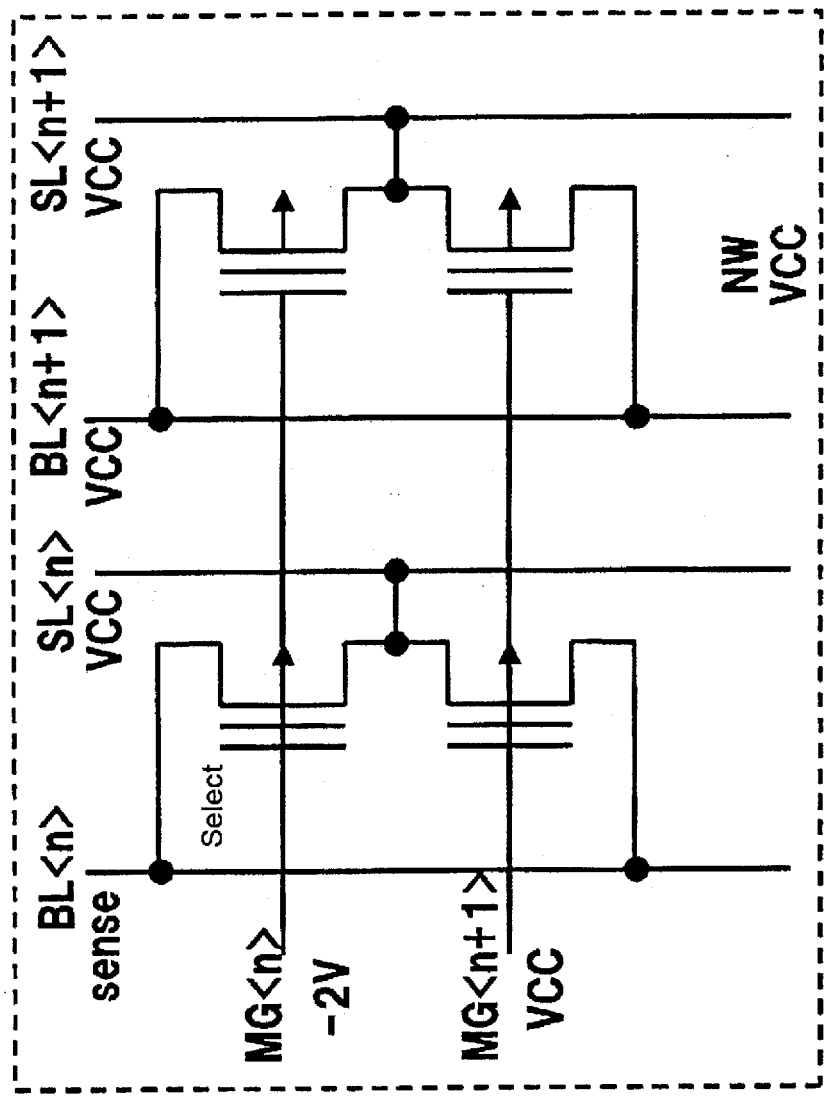
FIG. 28A is a specific example of the voltages applied to each part at the time of a read operation in the third embodiment of this invention.

FIG. 28A shows the voltages applied to each part at the time of a read out operation. −2V is applied to the memory gate line MG<n>, VCC is applied to the memory gate line MG<n+1>, VCC is applied to the source line SL <n> and SL <n+1>, sense is applied to the selected bit line BL<n> and Vcc is applied to the non-selected bit line BL<n+1>. The voltage applied to the N type well NW is VCC.

Figure 28B:
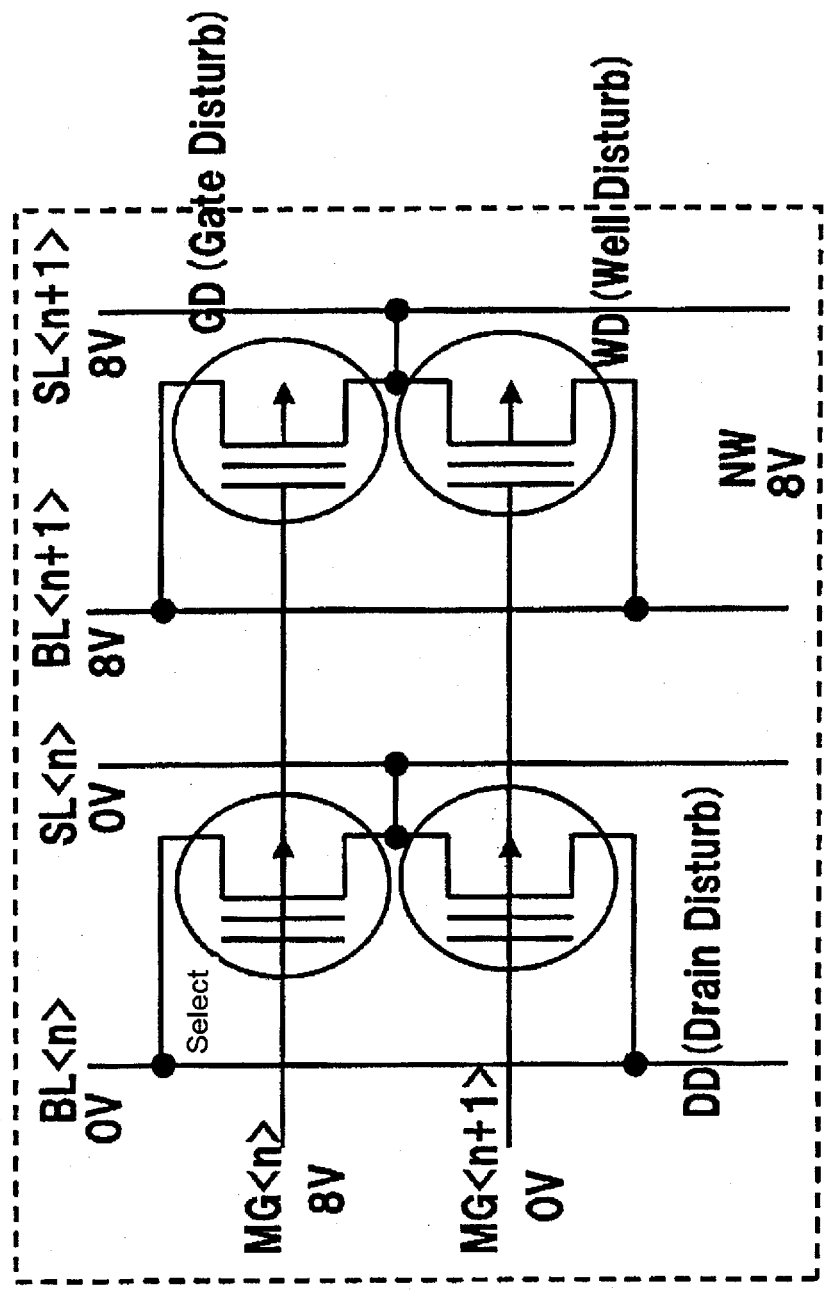
FIG. 28B is a specific example of the voltages applied to each part at the time of a program operation in the third embodiment of this invention.

FIG. 28B shows the voltages applied to each part at the time of a program operation. 8V is applied to the memory gate line MG<n>, 0V is applied to the memory gate line MG<n+1>, 0V is applied to the source line SL <n>, 8V is applied to the source line SL <n+1>, 0V is applied to the selected bit line BL<n> and 8V is applied to the non-selected bit line BL<n+1>. The voltage applied to the N type well NW is 8V. As stated previously, the source and drain of a memory cell have a symmetrical structure. Then, the same 0V is applied to the source and drain of the selected memory cell and, because 8V is applied to either the N type well NW or the memory gate line MG<n>, B4-HE programming is performed from both the source side and drain side. In addition, because the potential difference between the source and drain at the time of programming is 0V, scaling of the length of a gate is easy. In addition, because the same 8V is applied to the all of the four terminals of a memory cell in which gate disturb (GD) becomes a problem, the gate disturb problem can be entirely avoided.

Figure 28C:
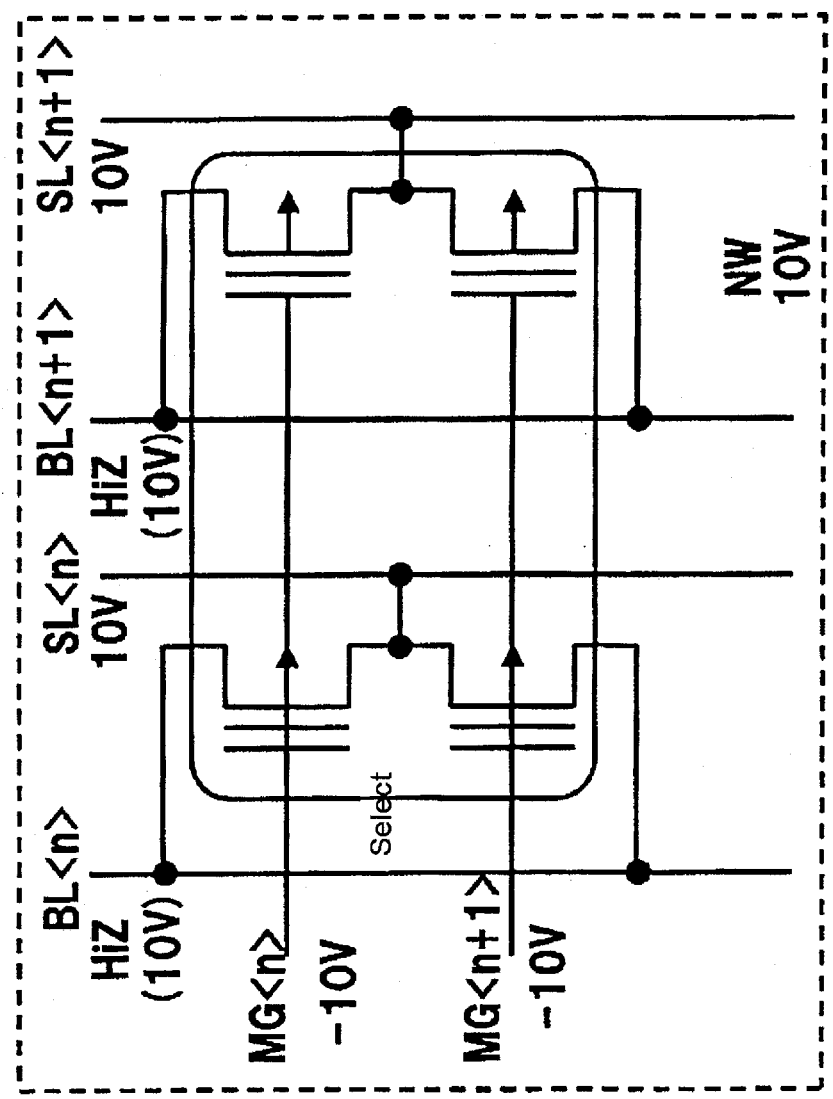
FIG. 28C is a specific example of the voltages applied to each part at the time of an erase operation in the third embodiment of this invention.

FIG. 28C shows an example of the voltages applied to each part at the time of a block erase operation. −10V is applied to the memory gate line MG<n> and the memory gate line MG<n+1>, 10V is applied to the source line SL<n> and the source line SL<n+1>, and the bit line BL<n> and the bit line BL<n+1> are left at HiZ. The voltage applied to the N type well NW is 10V. In these conditions, the accumulated electrons are ejected into the entire surface of the channel by a FN tunnel current and erase is performed. The bit line BL<n> and the bit line BL<n+1> may be driven to 10V and not left at HiZ. In this case, the break down voltage of the periphery transistors is sufficient at 10V or more.

Figure 28D:
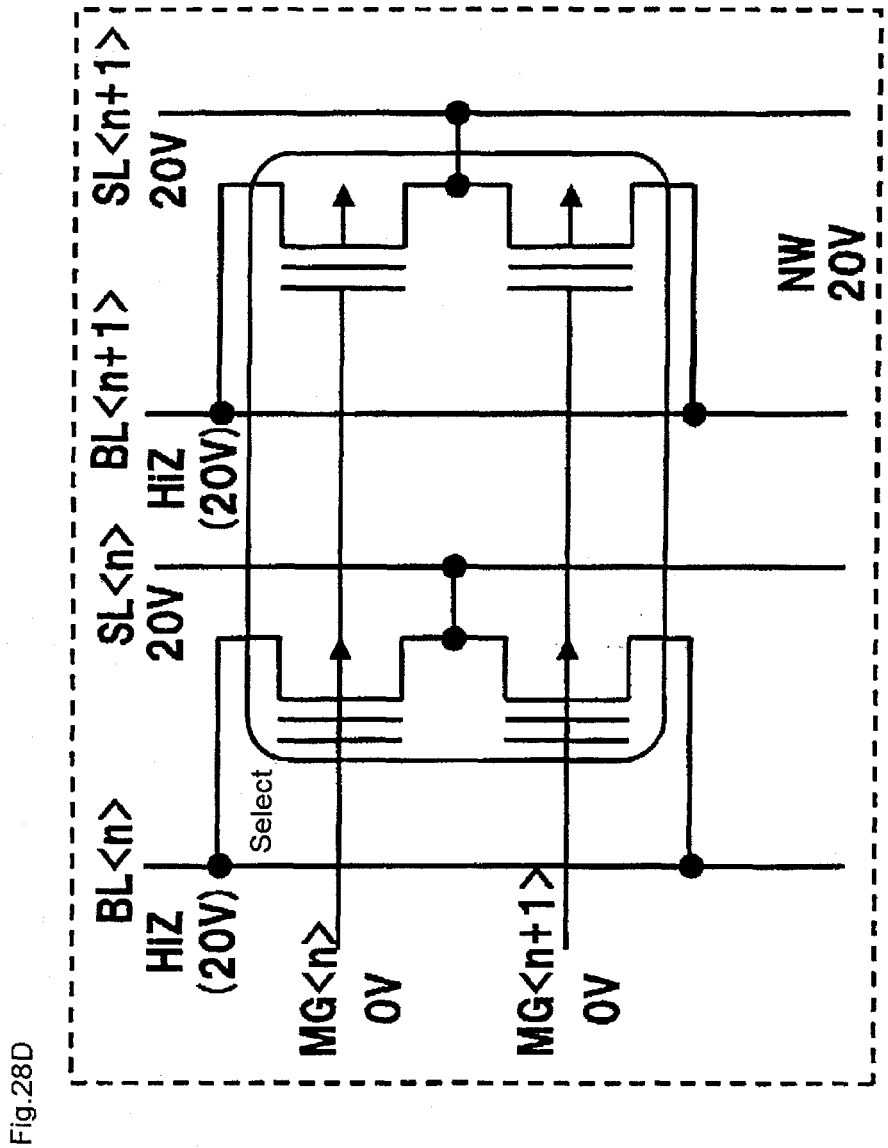
FIG. 28D is a specific example of the voltages applied to each part at the time of an erase operation in the third embodiment of this invention.

FIG. 28D shows another example of the voltages applied to each part at the time of a block erase operation. 0V is applied to the memory gate line MG<n> and the memory gate line MG<n+1>, 20V is applied to the source line SL<n> and the source line SL<n+1>, and the bit line BL<n> and the bit line BL<n+1> are left at HiZ. The voltage applied to the N type well NW is 20V. Also in these conditions, the accumulated electrons are ejected into the entire surface of the channel by a FN tunnel current and erase is performed. The bit line BL<n> and the bit line BL<n+1> may be driven to 20V and not left at HiZ. In this case, the break down voltage of the periphery transistors is required to be 20V or more, however, operation of all the circuits is possible by a positive voltage of 0V or more.

Figure 28E:
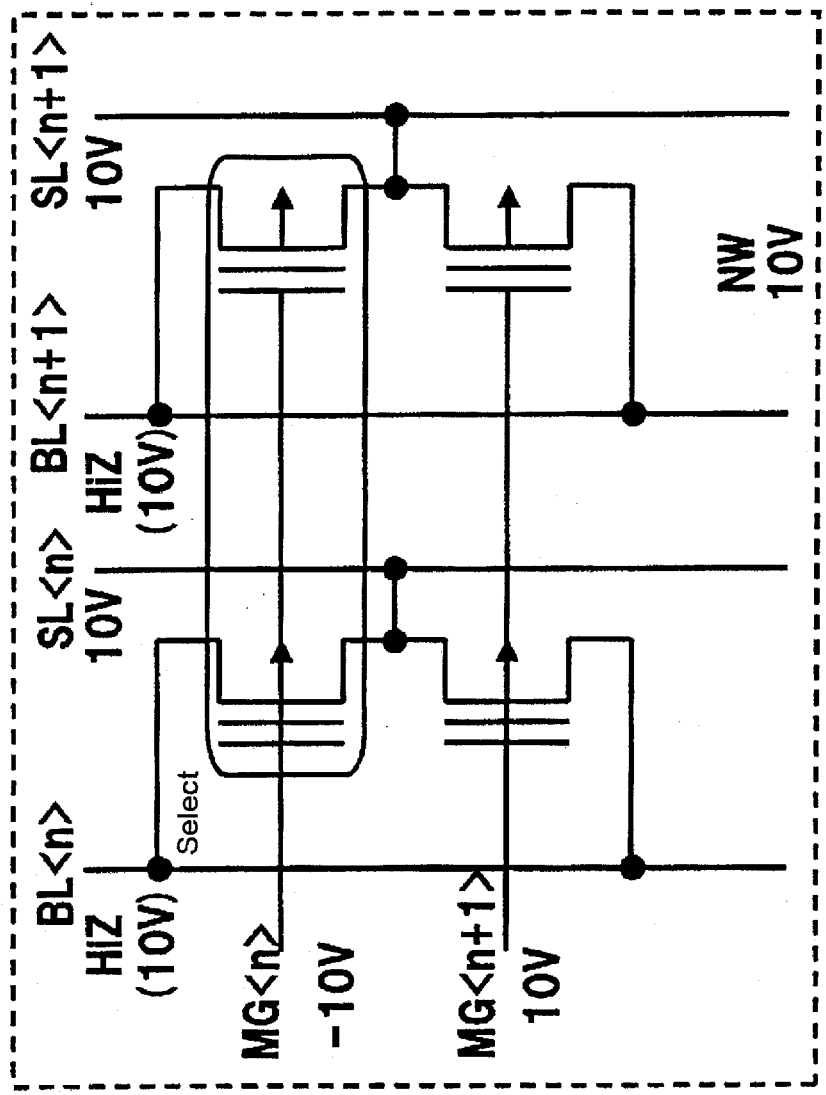
FIG. 28E is a specific example of the voltages applied to each part at the time of an erase operation in the third embodiment of this invention.

FIG. 28E shows an example of the voltages applied to each part at the time of a world line erase operation. −10V is applied to the memory gate line MG<n> and −10V is applied to the memory gate line MG<n+1>, 10V is applied to the source line SL<n> and the source line SL<n+1>, and the bit line BL<n> and the bit line BL<n+1> are left at HiZ. The voltage applied to the N type well NW is 10V. Also in these conditions, the accumulated electrons are ejected from the accumulated gate of one row of memory cell which are connected to the memory gate line MG<n> which is supplied with −10V, into the entire surface of the channel by a FN tunnel current and erase is performed. The bit line BL<n> and the bit line BL<n+1> may be driven to 10V and not left at HiZ. In this case, the break down voltage of the periphery transistors is sufficient at 10V or more.

Figure 28F:
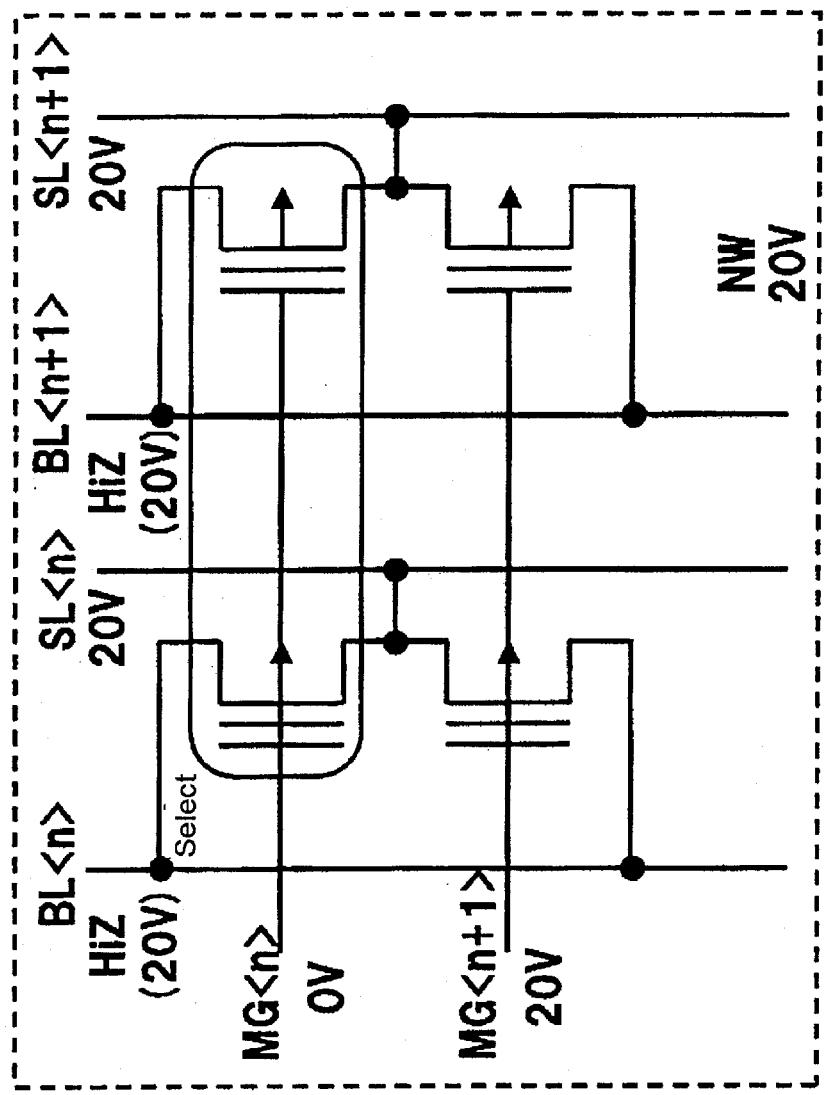
FIG. 28F is a specific example of the voltages applied to each part at the time of an erase operation in the third embodiment of this invention.

FIG. 28F shows another example of the voltages applied to each part at the time of a world line erase operation. 0V is applied to the memory gate line MG<n> and 20V is applied to the memory gate line MG<n+1>, 20V is applied to the source line SL<n> and the source line SL<n+1>, and the bit line BL<n> and the bit line BL<n+1> are left at HiZ. The voltage applied to the N type well NW is 20V. Also in these conditions, the accumulated electrons are ejected from the accumulated gate of a one row memory cell which is connected to the memory gate line MG<n> which is supplied with 0V, into the entire surface of the channel by a FN tunnel current and erase is performed. The bit line BL<n> and the bit line BL<n+1> may be driven to 20V and not left at HiZ. In this case, the break down voltage of the periphery transistors is required to be 20V or more, however, operation of all the circuits is possible by a positive voltage of 0V or more.

Next, the fourth embodiment of the present invention will be explained by referring to FIG. 29 to FIG. 35.

Figure 29:
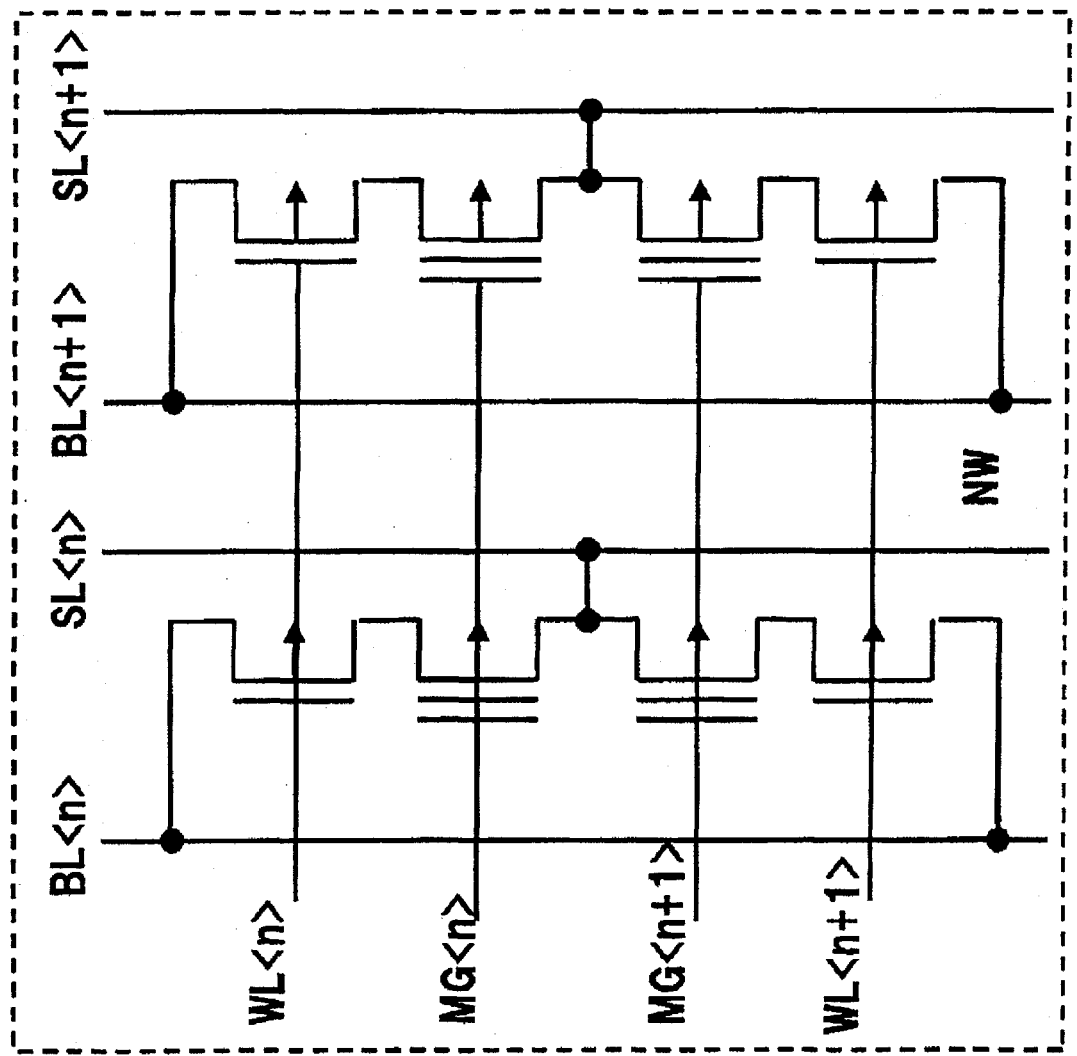
FIG. 29 is an array structural diagram of a nonvolatile memory related to the fourth embodiment of this invention.

As is shown in FIG. 29, a memory cell array of a NOR type flash memory related to the fourth embodiment of this invention, is comprised of a plurality of memory cells which are formed in an N type well NW. Each individual memory cell is comprised from a cell transistor which has a charge storage layer such as a floating gate, and a select transistor. Both the P type MIS transistor which has a charge storage layer such as a floating gate, and the select transistor, has a source, a drain and a gate. The gate electrode of the n-th row memory cell cell transistor is connected to a memory gate line MG<n> which is arranged in a row direction, and the gate of the (n+1)th row memory cell cell transistor is connected to a memory gate line MG<n+1> which is arranged in a row direction. The gate electrode of the n-th row memory cell select transistor is connected to a word line WL<n> which is arranged in a row direction, and the gate of the (n+1)th row memory cell selection transistor is connected to a word line WL<n+1> which is arranged in a row direction. The drain of the n-th column memory cells select transistor is connected to a bit line BL<n> arranged in a column direction, and the drain of the (n+1)th column memory cells select transistor is connected to a bit line BL<n+1> arranged in a column direction. As a result, the memory cell array has an AND type array shape.

Furthermore, the source of the n-th column memory cell cell transistor is connected to a source line SL<n> arranged in a column direction, and the source of the (n+1)th column memory cells cell transistor is connected to a source line SL<n+1> arranged in a column direction. In this way, the source line SL is paired with a bit line BL and the source voltage of the select transistor which comprises a memory cell can be independently controlled for each bit line BL. Each individual memory cell is comprised from one P type MIS transistor.

Figure 30:
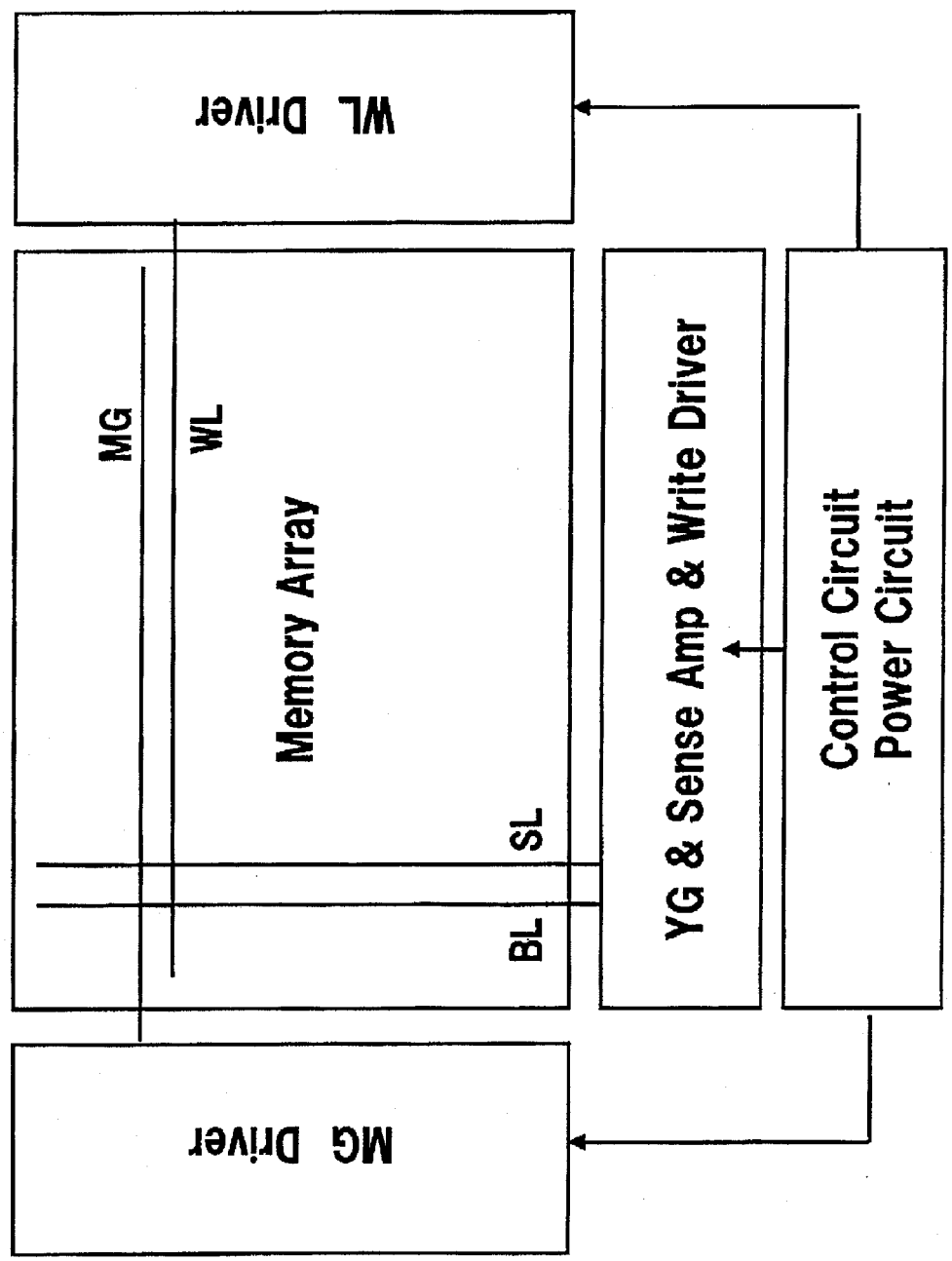
FIG. 30 is an entire structural diagram of a nonvolatile memory related to the fourth embodiment of this invention.

FIG. 30 shows the entire structure of a nonvolatile semiconductor memory device which includes a circuit for driving the memory cell array shown in FIG. 29. This nonvolatile semiconductor memory device is different from the nonvolatile semiconductor memory device shown in FIG. 2 in that word line drivers (WL drivers) and a variety of control circuits for those WL drives are attached.

Figure 31:
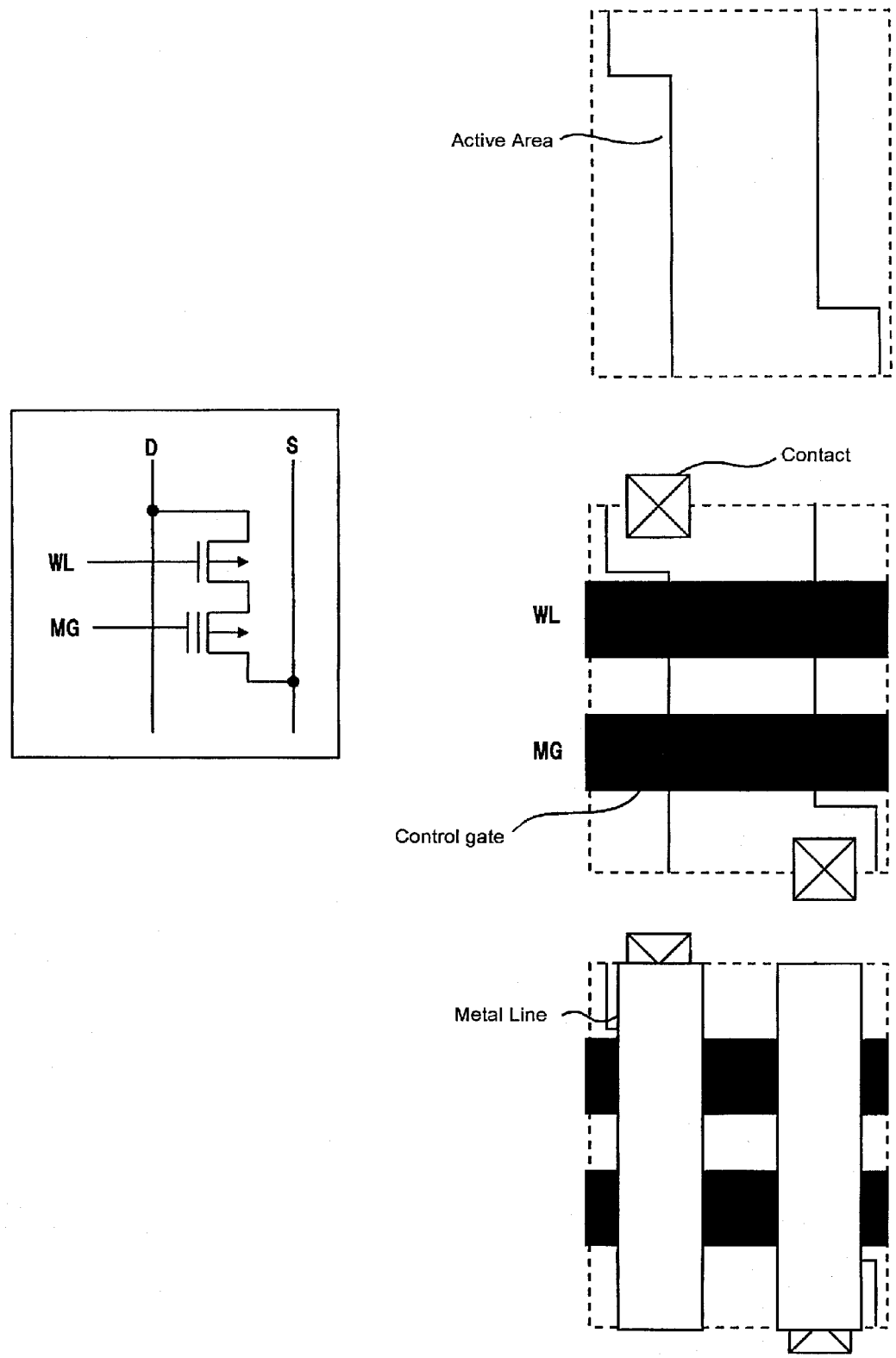
FIG. 31 is one example of a layout of a memory cell array of a nonvolatile memory related to the fourth embodiment of this invention.

In FIG. 31, an example layout of one memory cell which is included in the memory cell array shown in FIG. 29 is shown. A contact which connects the drain of the select transistor and a bit line BL and a contact which connects the source of a cell transistor and a source line SL are alternately arranged. The bit line BL and source line SL extends above and below in the diagram. The memory gate line MG which is the charge storage layer and control gate, is formed so that it is perpendicular to a channel direction of the memory cell. The bit line BL and the source line SL, and the memory gate MG and a word line WL intersect each other. By adopting such a structure, it is possible to form a bit line BL and source line SL with a metal wire, and conform to a standard CMOS process.

Figure 32A:
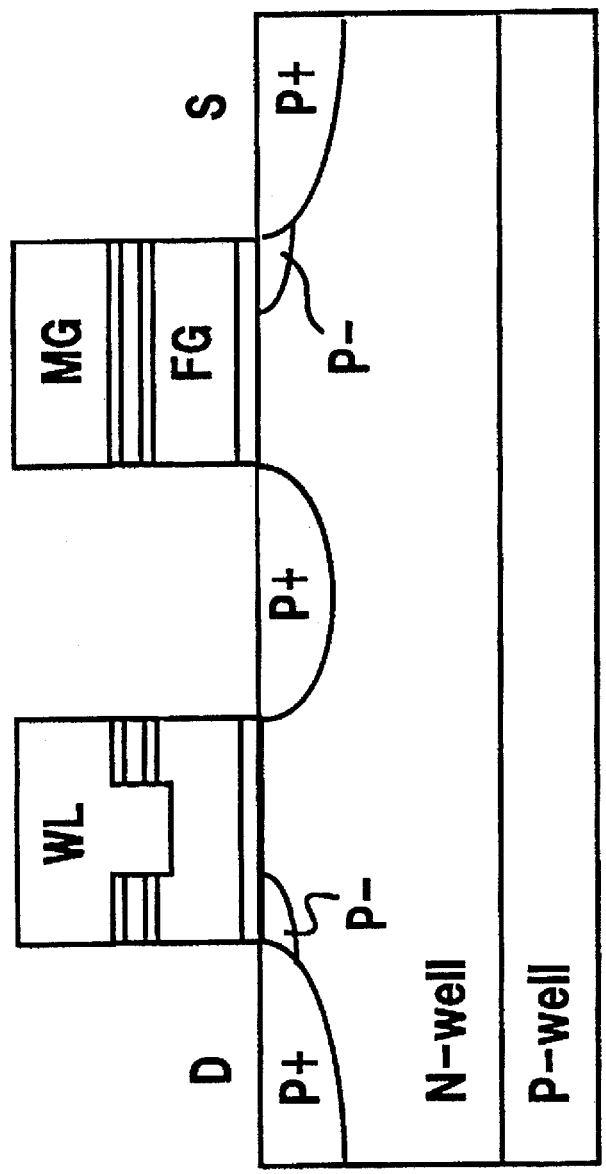
FIG. 32A is one example of a cross section of a memory cell of a memory cell array related to the fourth embodiment of this invention.

In FIG. 32A, an example of a cross sectional view of one memory cell which is included in the memory cell array shown in FIG. 29 is shown. This memory cell is formed in an N type well (N-well) which is formed in a P type semiconductor substrate (P-sub) of the semiconductor substrate. The memory cell transistor is comprised from a source (S) and drain (D) which consist of P+ type diffusion regions, a gate insulation film which is stacked on a region (channel) between the source and drain, a floating gate (FG), an inter-gate insulation film and a memory gate (MG). The threshold of a memory cell changes due to the storage of electrons in the floating gate (FG) and therefore data is stored. The select transistor is comprised from a source (S) and drain (D) which consist of P+ type diffusion regions, a gate insulation film which is stacked on a region (channel) between the source and drain, and a gate (WL). The drain of a memory cell transistor and the source of a select transistor are formed in a common diffusion layer. Furthermore, a shallow and low density P-layer is formed in the drain (connected to a bit line BL) of a select transistor and the source (connected to a source line SL) of a memory cell transistor. In other words, the source and drain of the memory cell transistor and the select transistor do not have a symmetrical structure. It is preferred that the thickness of the gate insulation film of the select transistor is the same thickness as a thickness of a standard power voltage (VCC) transistor gate insulation film or an external input/output (I/O) transistor gate insulation film. In addition, the thickness of the gate insulation film of the select transistor may also be the same thickness as the gate insulation film (tunnel insulation film) of the memory cell transistor.

Furthermore, the thickness of the gate insulation film of the select transistor may also be different to one of the thickness of the gate insulation film of the standard power voltage (VCC) transistor, the thickness of external input/output (I/O) transistor gate insulation film or the thickness of a tunnel insulation film of a memory element.

Furthermore, the length of the channel region of the select transistor many be the same as the length of the channel region of the memory cell transistor and may also be longer.

Figure 32B:
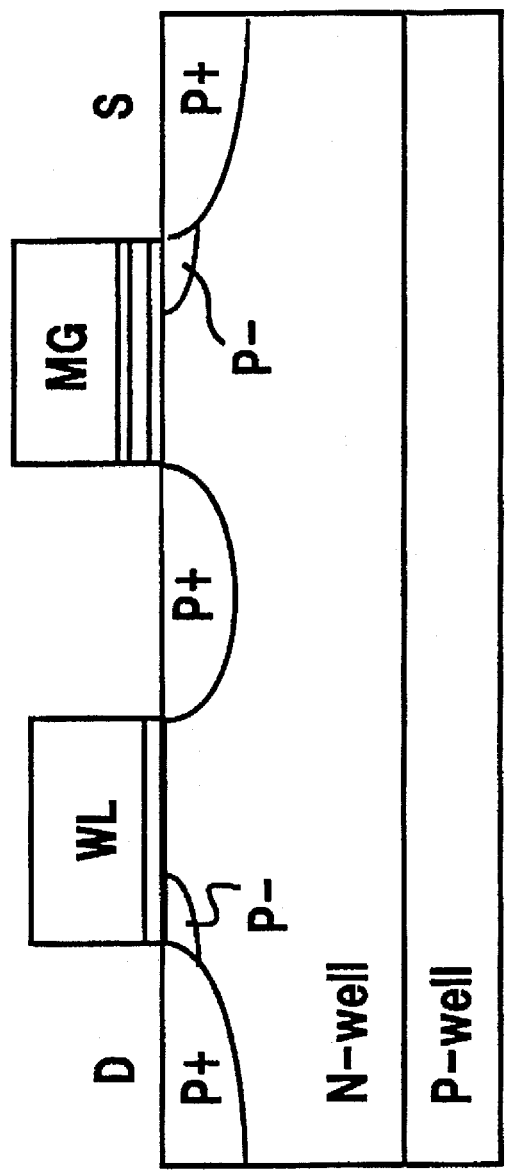
FIG. 32B is one example of a cross section of a memory cell of a memory cell array related to the fourth embodiment of this invention.

In FIG. 32B, another example of a cross sectional view of one memory cell which is included in the memory cell array shown in FIG. 29 is shown. This memory cell is formed in an N type well (N-well) which is formed in a P type semiconductor substrate (P-sub) of the semiconductor substrate. The memory cell transistor is comprised from a source (S) and drain (D) which consist of P+ type diffusion regions, an insulation film (for example, an ONO film) which includes a charge storage layer stacked on a region (channel) between the source and drain, and a memory gate (MG). The threshold of a memory cell changes due to the storage of electrons in the charge storage layer and therefore data is stored. The select transistor is comprised from a source (S) and drain (D) which consist of P+ type diffusion regions, a gate insulation film stacked on a region (channel) between the source and drain, and a gate (WL). The drain of the memory cell transistor and the source of the select transistor are formed in the common diffusion layer. The source and drain of the memory cell transistor and the select transistor have a symmetrical structure. The thickness of the gate insulation film of the select transistor may be the same thickness as the thickness of a standard power source voltage (VCC) transistor gate insulation film or the thickness of an external input/output (I/O) transistor gate insulation film.

FIG. 33 shows the magnitude relationship of the voltage applied to each part in the fourth embodiment of the present invention and their potentials. Sel in the chart shows selection, and Unsel in the chart shows non-selection. In the chart, READ means read, PGM means program and ERS means erase. There are two ways for erase, one is a block unit erase and the other is a word line unit erase. An important point is that at the time of programming, a bit line and a source line are set at the same potential Vd_Vs (Vbsl_p in the diagram) and by applying a higher positive voltage Vb (Vnw_p in the diagram) and Vg (Vmg_p in the diagram) than Vd_Vs to the N type well and the gate electrode above the charge storage layer respectively, hot electrons are generated by the electrons generated by inter band tunneling, these hot electrons are injected/implanted into the charge storage layer and programming is performed.

FIG. 34 shows examples of specific voltages which are applied to each part in the fourth embodiment of the present invention. Here, voltages and a magnitude relationship of their potential are shown. The same as FIG. 26, Sense in the chart refers to connecting with a sense amplifier not shown in the diagram and applying a required voltage for read out. HiZ in the chart refers to a high impedance state.

Figure 35A:
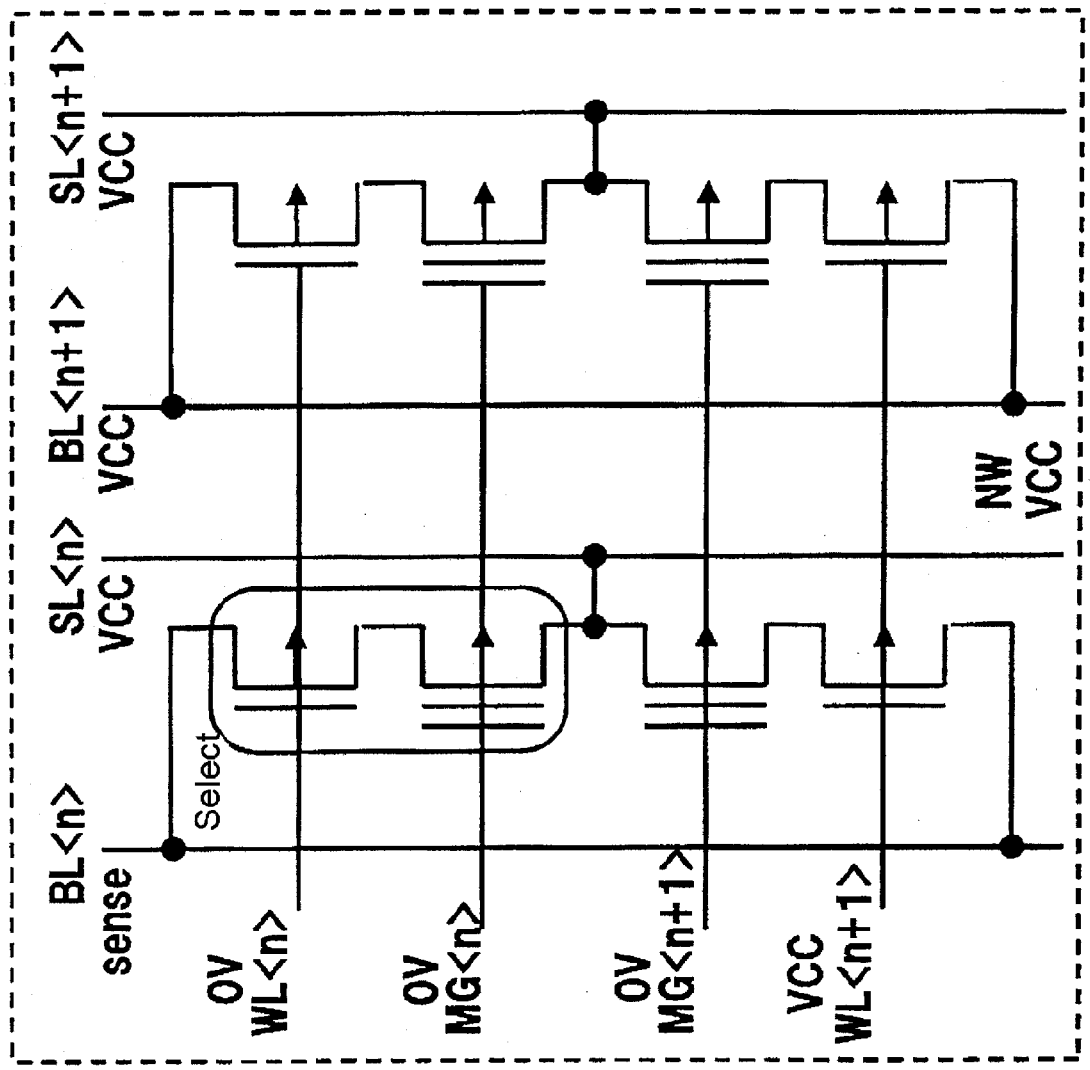
FIG. 35A is a specific example of the voltages applied to each part at the time of a read operation in the fourth embodiment of this invention.

FIG. 35A shows the voltages that are applied to each part at the time of a read operation. 0V is applied to the word line WL<n> and the memory gate line MG<n>, VCC is applied to the word line WL<n+1>, 0V is applied to the memory gate line MG<n+1>, VCC is applied to the source line SL<n> and the source line SL<n+1>, sense is applied to the selected bit line BL<n> and VCC is applied to the non-selected bit line BL<n+1>. The voltage applied to the N type well NW is VCC. Because a select transistor exists, even at the time of a read operation, because it is possible to cut off an off leak (flow of a leak current to a non-selected memory cell connected to the same bit line) of the memory cell, it is not necessary to set a threshold deep and control of the word line at the time of a read operation can be controlled at 0V/VCC (control only of power source voltage).

Figure 35B:
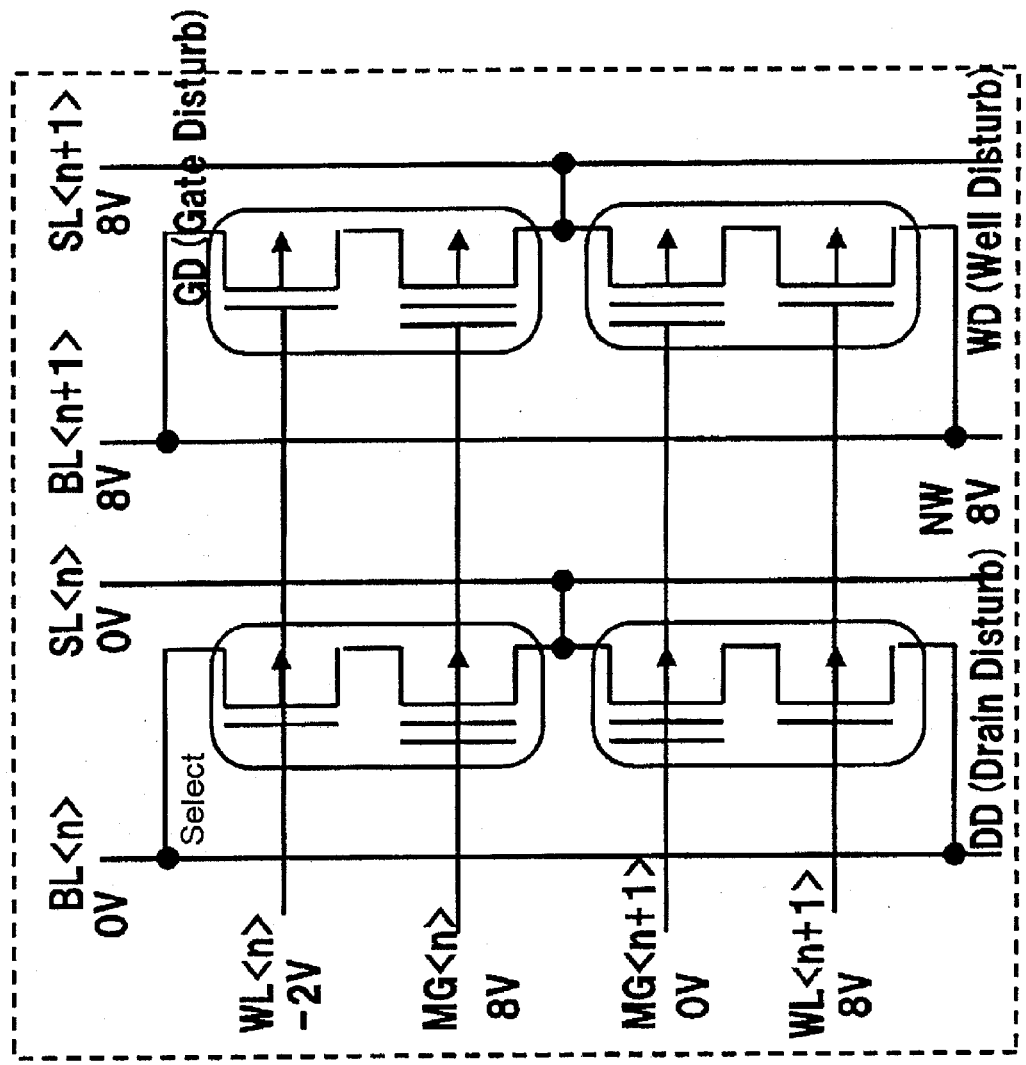
FIG. 35B is a specific example of the voltages applied to each part at the time of a program operation in the fourth embodiment of this invention.

FIG. 35B shows the voltages applied to each part at the time of a program operation. −2V is applied to the word line WL<n>, 8V is applied to the memory gate line MG<n>, 8V is applied to the word line WL<n+1>, 0V is applied to the memory gate line MG<n+1>, 0V is applied to the source line SL <n>, 8V is applied to the source line SL <n+1>, 0V is applied to the selected bit line BL<n> and 8V is applied to the non-selected bit line BL<n+1>. The voltage applied to the N type well NW is 8V. The following merits are obtained when programming using this memory cell. That is, because the drain side select transistor of the non-selected memory cell cuts off 0V of the selected bit line BL<n>, drain disturb immunity is improved. In addition, because the potential difference between the source and drain at the time of programming is 0V, scaling of the length of a gate is easy. In addition, because the same 8V is applied to the all of the four terminals of a memory cell in which gate disturb (GD) becomes a problem, the gate disturb problem can be entirely avoided.

Figure 35C:
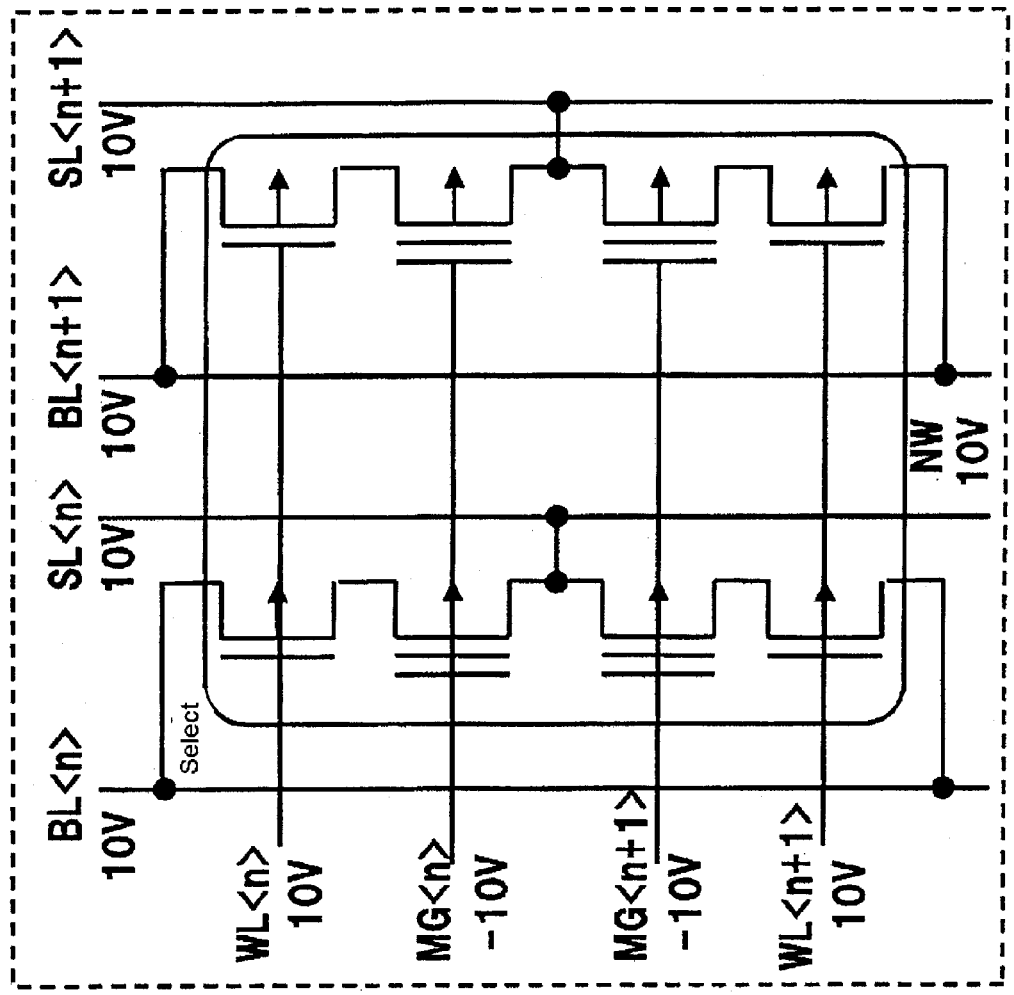
FIG. 35C is a specific example of the voltages applied to each part at the time of an erase operation in the fourth embodiment of this invention.

FIG. 35C shows one example of the voltages applied to each part at the time of a block erase operation. 10V is applied to the word line WL<n> and the word line WL<n+1>, −10V is applied to the memory gate line MG<n> and the memory gate line MG<n+1>, 10V is applied to the source line SL<n> and the source line SL<n+1>, and the bit line BL<n> and the bit line BL<n+1> become 10V. The voltage applied to the N type well NW is 10V. In these conditions, the accumulated electrons are ejected into the entire surface of the channel by a FN tunnel current and erase is performed. In this case, it is sufficient if the break down voltage of the periphery transistors is 10V or more.

Figure 35D:
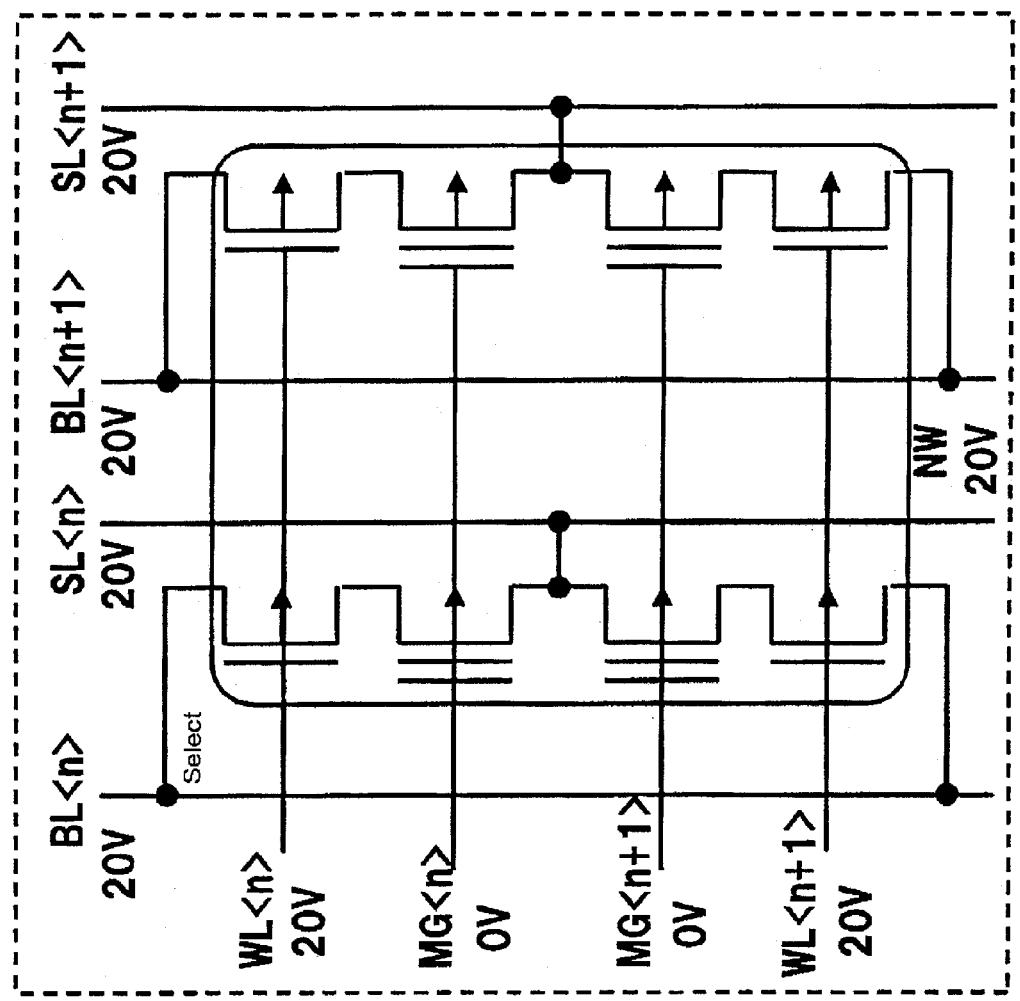
FIG. 35D is a specific example of the voltages applied to each part at the time of an erase operation in the fourth embodiment of this invention.

FIG. 35D shows another example of the voltages applied to each part at the time of a block erase operation. 20V is applied to the word line WL<n> and the word line WL<n+1>, 0V is applied to the memory gate line MG<n> and the memory gate line MG<n+1>, 20V is applied to the source line SL<n> and the source line SL<n+1>, and the bit line BL<n> and the bit line BL<n+1> become 20V. The voltage applied to the N type well NW is 20V. In these conditions, the accumulated electrons are ejected into the entire surface of the channel by a FN tunnel current and erase is performed. In this case, the break down voltage of the periphery transistors is required to be 20V or more, however, operation of all the circuits is possible by a positive voltage of 0V or more.

Figure 35E:
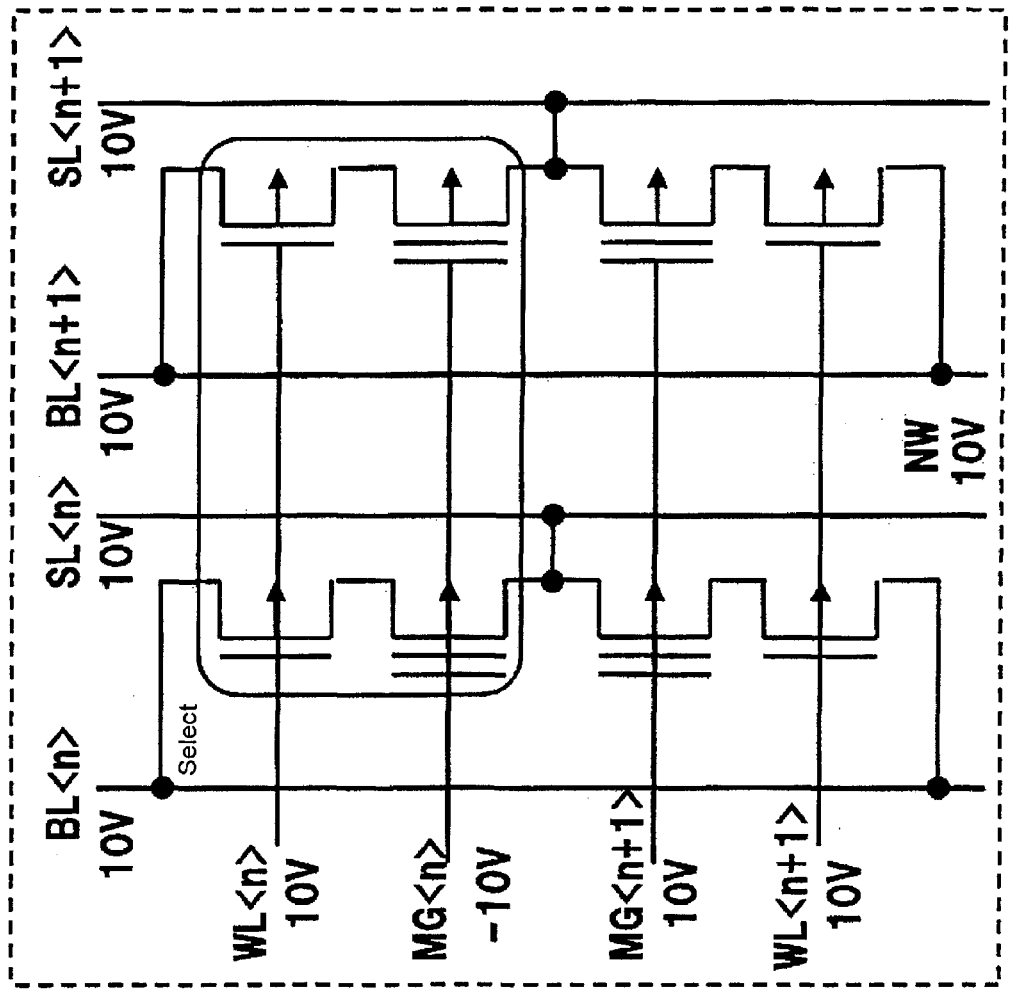
FIG. 35E is a specific example of the voltages applied to each part at the time of an erase operation in the fourth embodiment of this invention.

FIG. 35E shows an example of the voltages applied to each part at the time of a world line erase operation. 10V is applied to the word line WL<n> and the word line WL<n+1>, −10V is applied to the memory gate line MG<n> and 10V is applied to the memory gate line MG<n+1>, 10V is applied to the source line SL<n> and the source line SL<n+1>, and the bit line BL<n> and the bit line BL<n+1> are supplied with 10V. The voltage applied to the N type well NW is 10V. Also in these conditions, the electrons are ejected from the accumulated gate of one row of memory cells which are connected to the memory gate line MG<n> which is supplied with −10V, into the entire surface of the channel by a FN tunnel current and erase is performed.

Figure 35F:
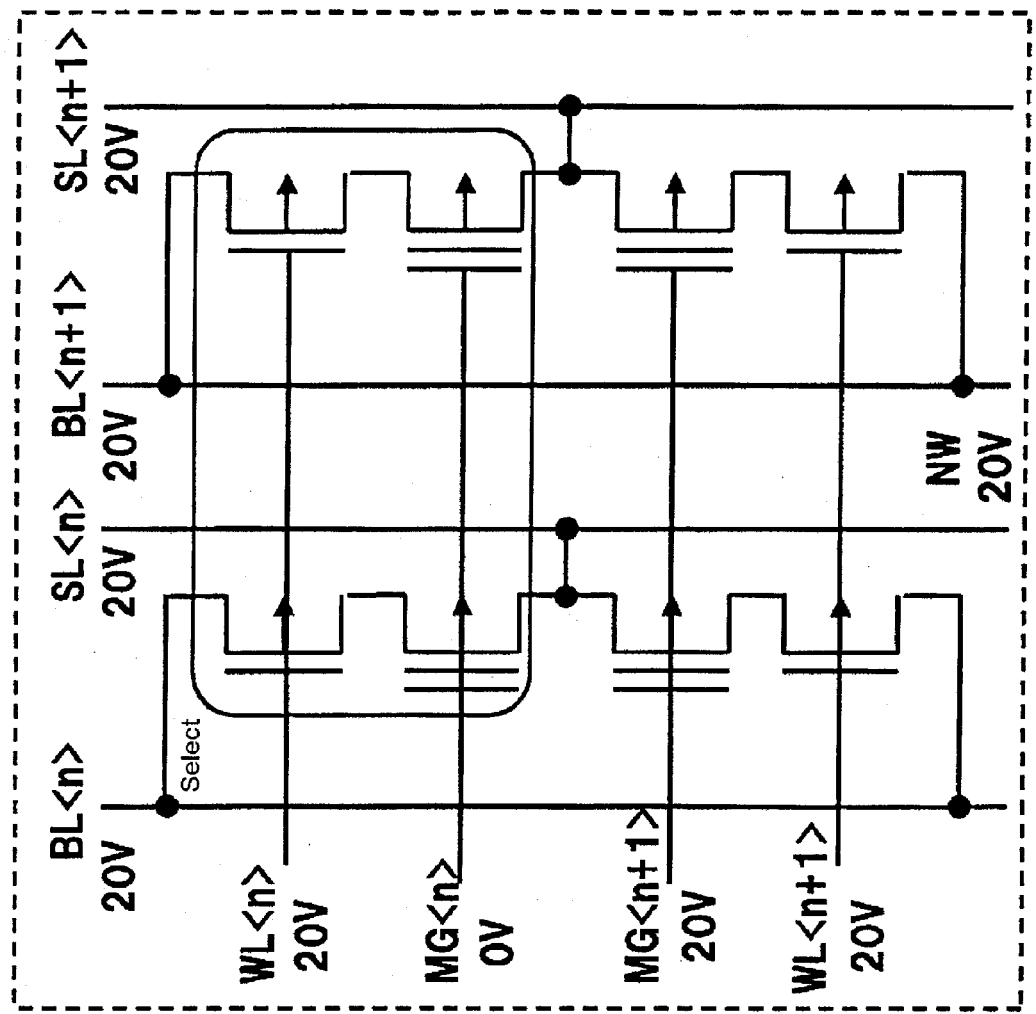
FIG. 35F is a specific example of the voltages applied to each part at the time of an erase operation in the fourth embodiment of this invention.

FIG. 35F shows another example of the voltages applied to each part at the time of a world line erase operation. 20V is applied to the word line WL<n> and the word line WL<n+1>, 0V is applied to the memory gate line MG<n> and 20V is applied to the memory gate line MG<n+1>, 20V is applied to the source line SL<n> and the source line SL<n+1>, and the bit line BL<n> and the bit line BL<n+1> are supplied with 20V. The voltage applied to the N type well NW is 20V. Also in these conditions, the electrons are ejected from the accumulated gate of one row of memory cells which are connected to the memory gate line MG<n> which is supplied with 0V, into the entire surface of the channel by a FN tunnel current and erase is performed.

Next, the fifth embodiment of the present invention will be explained by referring to FIG. 36 to FIG. 41F.

Figure 36:
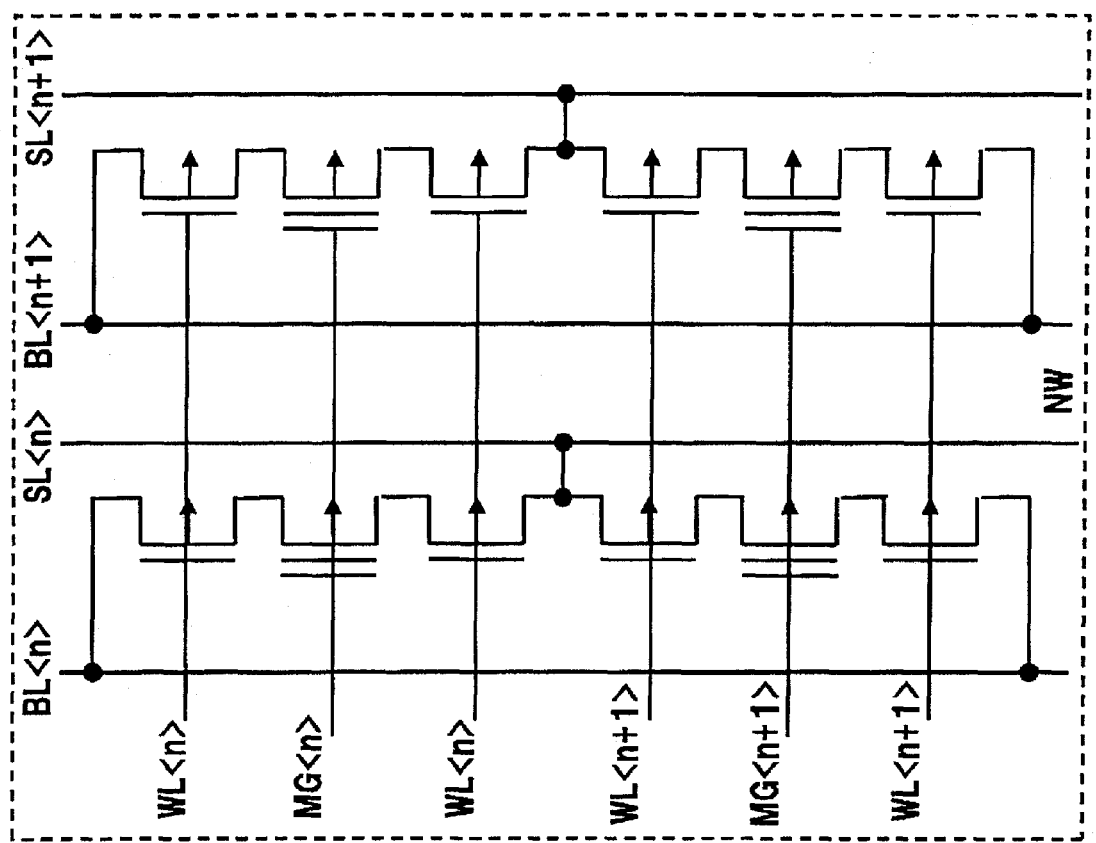
FIG. 36 is an array structural diagram of a nonvolatile memory related to the fifth embodiment of this invention.

As is shown in FIG. 36, the memory array of a NOR type flash memory related to the fifth embodiment of this invention is comprised from a plurality of memory cells formed in an N type well NW. Each individual memory cell is comprised from a cell transistor which includes a charge storage layer such as a floating gate, a drain side select transistor and a source side select transistor. The cell transistor which includes a charge storage layer such as a floating gate, and the drain side and source side select transistors each have a source, drain and a gate. The gate electrode of the n-th row memory cell cell transistor is connected to a memory gate line MG<n> which is arranged in a row direction, and the gate of the (n+1)th row memory cell cell transistor is connected to a memory gate line MG<n+1> which is arranged in a row direction. The gate electrode of the n-th row memory cell drain side and source side select transistors are connected to a word line WL<n> (however, two are arranged in parallel so that they sandwich the memory gate line MG<n>) which is arranged in a row direction, and the gate of the (n+1)th row memory cell drain side and source side select transistors are connected to two word lines WL<n+1> which are arranged in a row direction. The drain of the n-th column memory cells select transistor is connected to a bit line BL<n> arranged in a column direction, and the drain of the (n+1)th column memory cells select transistor is connected to a bit line BL<n+1> arranged in a column direction. As a result, the memory cell array has an AND type array shape.

Furthermore, the source of the n-th column memory cells cell transistor is connected to a source line SL<n> arranged in a column direction, and the source of the (n+1)th column memory cells cell transistor is connected to a source line SL<n+1> arranged in a column direction. In this way, the source line SL is paired with a bit line BL and the source voltage of the cell transistor which comprises a memory cell can be independently controlled for each bit line BL. Each individual memory cell is comprised from one P type MIS transistor.

Because the entire structure of a nonvolatile semiconductor memory device which includes a circuit for driving the memory cell array shown in FIG. 36 is almost the same as the nonvolatile semiconductor memory device shown in FIG. 9 (corresponding to the fourth embodiment), an explanation will be omitted.

Figure 37:
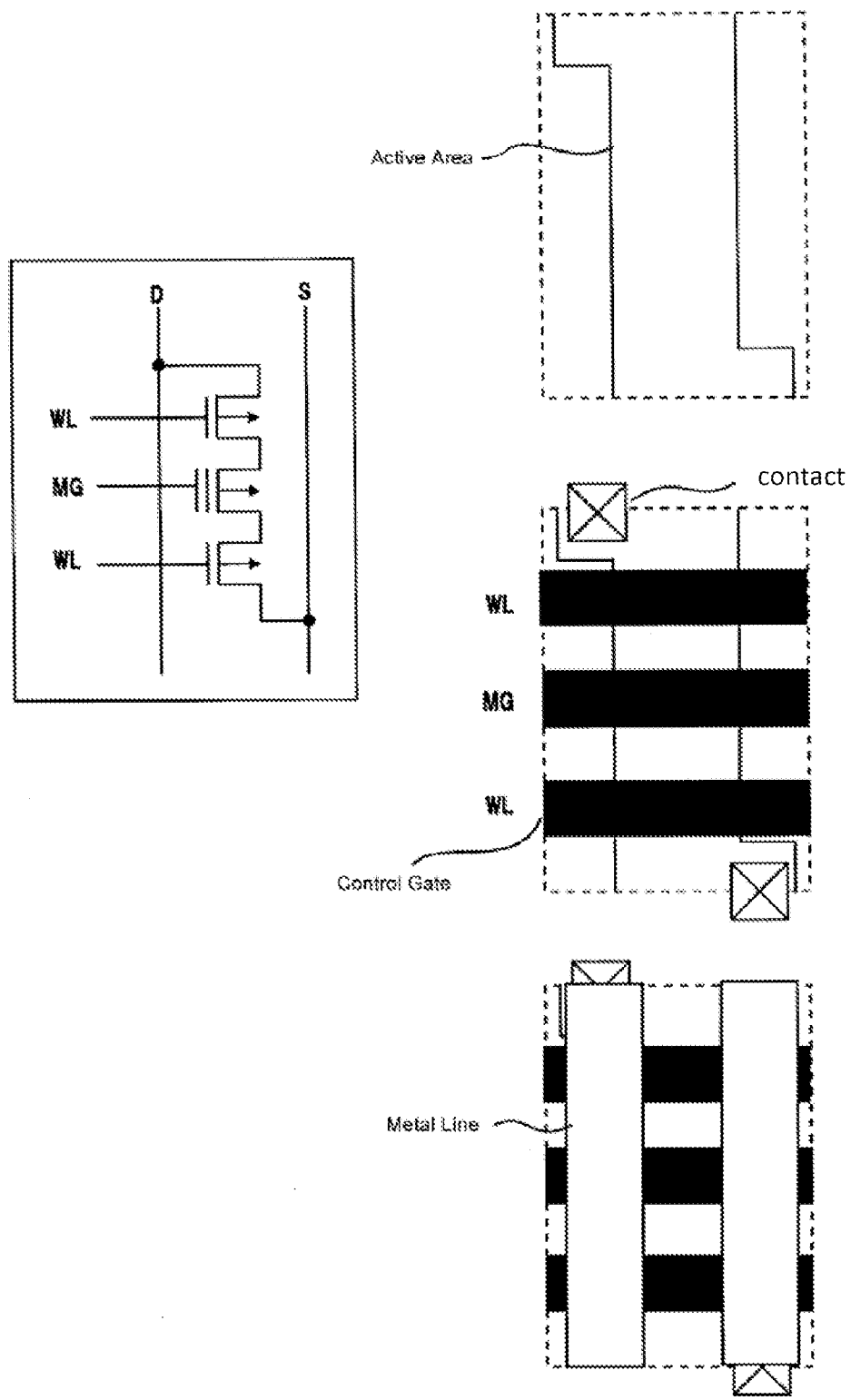
FIG. 37 is one example of the layout of a memory cell array of a nonvolatile memory related to the fifth embodiment of this invention.

In FIG. 37, an example layout of one memory cell which is included in the memory cell array shown in FIG. 36 is shown. A contact which connects the drain of the select transistor and a bit line BL and a contact which connects the source of a cell transistor and a source line SL are alternately arranged. The bit line BL and source line SL extend above and below in the diagram. The memory gate line MG which is the charge storage layer and control gate, is formed so that it is perpendicular to a channel direction of the memory cell. The bit line BL and the source line SL, and the memory gate MG and the two word lines WL intersect each other. By adopting such a structure, it is possible to form a bit line BL and source line SL with a metal wire, and conform to a standard CMOS process.

Figure 38A:
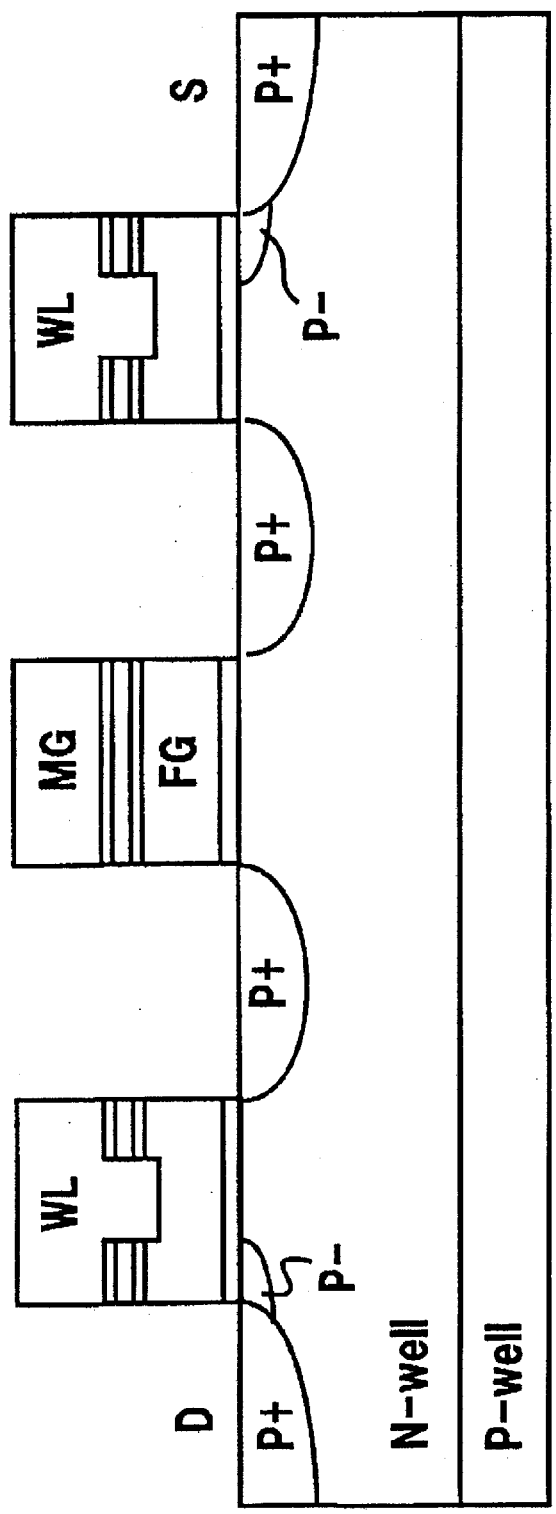
FIG. 38A is one example of a cross section of a memory cell of a memory cell array related to the fifth embodiment of this invention.

In FIG. 38A, an example of a cross sectional view of one memory cell which is included in the memory cell array shown in FIG. 36 is shown. This memory cell is formed in an N type well (N-well) which is formed in a P type semiconductor substrate (P-sub) of the semiconductor substrate. The memory cell transistor is comprised from a source (S) and drain (D) which consist of P+ type diffusion regions, a gate insulation film which is stacked on a region (channel) between the source and drain, a floating gate (FG), and an inter-gate insulation film. The threshold of a memory cell changes due to the storage of electrons in the floating gate (FG) and therefore data is stored. The drain side and source side select transistors are each comprised from a source (S) and drain (D) which consist of P+ type diffusion regions, a gate insulation film which is stacked on a region (channel) between the source and drain, and a gate (WL). The drain of a memory cell transistor and the source of a drain side select transistor are formed in a common diffusion layer. In addition, the source of the memory cell transistor and the drain of the source side select transistor are formed in a common diffusion layer. A shallow and low density P-layer is formed in the drain (connected to a bit line BL) of a drain side select transistor and the source (connected to a source line SL) of a source side select transistor. And, a shallow and low density P-layer is not formed in the source and drain of a memory cell transistor, therefore, the memory cell has a symmetrical structure. The thickness of the gate insulation film of the drain side select transistor and the source side select transistor is preferred to be the same thickness of a standard power voltage (VCC) transistor gate insulation film, or the same thickness as an external input/output (I/O) transistor gate insulation film. In addition, the thickness of the gate insulation film of the select transistor may also be the same thickness as the gate insulation film (tunnel insulation film) of the memory cell transistor.

Furthermore, the thickness of the gate insulation film of the select transistor may also be different to one of the thickness of the gate insulation film of the standard power voltage (VCC) transistor, the thickness of external input/output (I/O) transistor gate insulation film or the thickness of a tunnel insulation film of a memory element.

Furthermore, the length of the channel region of the select transistor many be the same as the length of the channel region of the memory cell transistor and may also be longer.

Figure 38B:
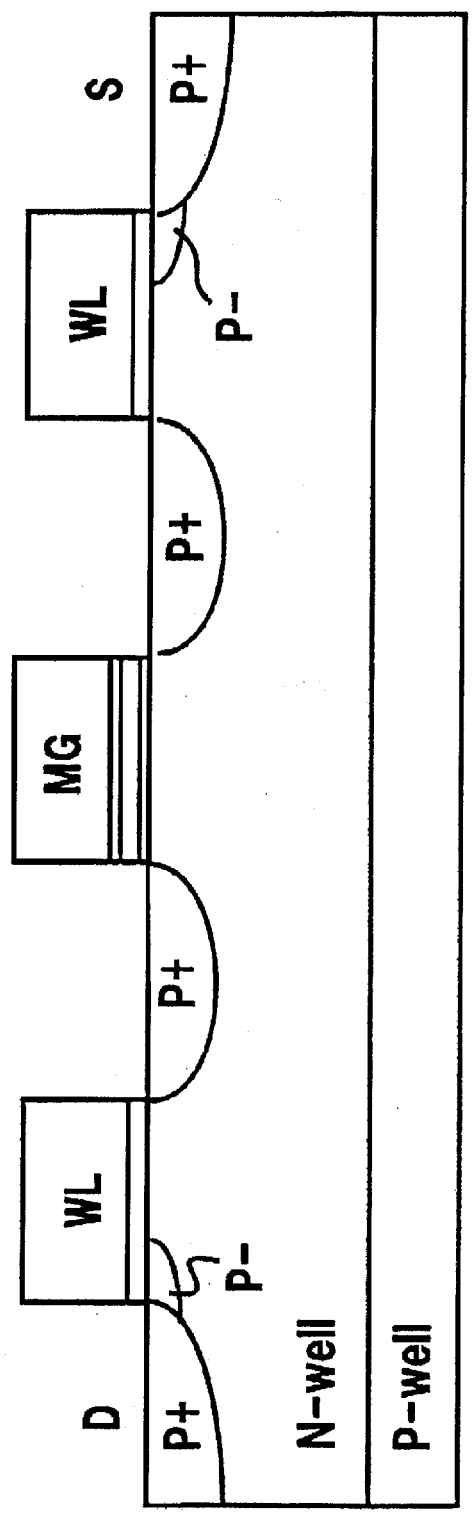
FIG. 38B is one example of a cross section of a memory cell of a memory cell array related to the fifth embodiment of this invention.

In FIG. 38B, another example of a cross sectional view of one memory cell which is included in the memory cell array shown in FIG. 36 is shown. This memory cell is formed in an N type well (N-well) which is formed in a P type semiconductor substrate (P-sub) of the semiconductor substrate. The memory cell transistor is comprised from a source (S) and drain (D) which consist of P+ type diffusion regions, an insulation film (for example, ONO film) which includes a charge storage layer stacked on a region (channel) between the source and drain and a memory gate (MG). The threshold of a memory cell changes due to the storage of electrons in the charge storage layer and therefore data is stored. The drain side and source side select transistors are each comprised from a source (S) and drain (D) which consist of P+ type diffusion regions, a gate insulation film which is stacked on a region (channel) between the source and drain, and a gate (WL). The drain of a memory cell transistor and the source of a drain side select transistor are formed in a common diffusion layer. In addition, the source of the memory cell transistor and the drain of the source side select transistor are formed in a common diffusion layer. A shallow and low density P-layer is formed in the drain (connected to a bit line BL) of a drain side select transistor and the source (connected to a source line SL) of a source side select transistor. And, a shallow and low density P-layer is not formed in the source and drain of a memory cell transistor, therefore, the memory cell has a symmetrical structure. The thickness of the gate insulation film of the drain side select transistor and the source side select transistor is preferred to be the same thickness of a standard power voltage (VCC) transistor gate insulation film, or the same thickness as an external input/output (I/O) transistor gate insulation film.

FIG. 39 shows the voltage applied to each part in the fifth embodiment of the present invention and the magnitude relationship of their potentials. Sel in the chart shows selection, and Unsel in the chart shows non-selection. In the chart, READ means read, PGM means program and ERS means erase. There are two columns for erase, one is a block unit erase and the other is a word line unit erase.

FIG. 40 shows a specific example of the voltages applied to each part in the fifth embodiment of the present invention. Here, a magnitude relationship is shown between a voltage and its potential. The same as FIG. 26, Sense in the chart refers to connecting with a sense amplifier not shown in the diagram and applying a required voltage for read out.

Figure 41A:
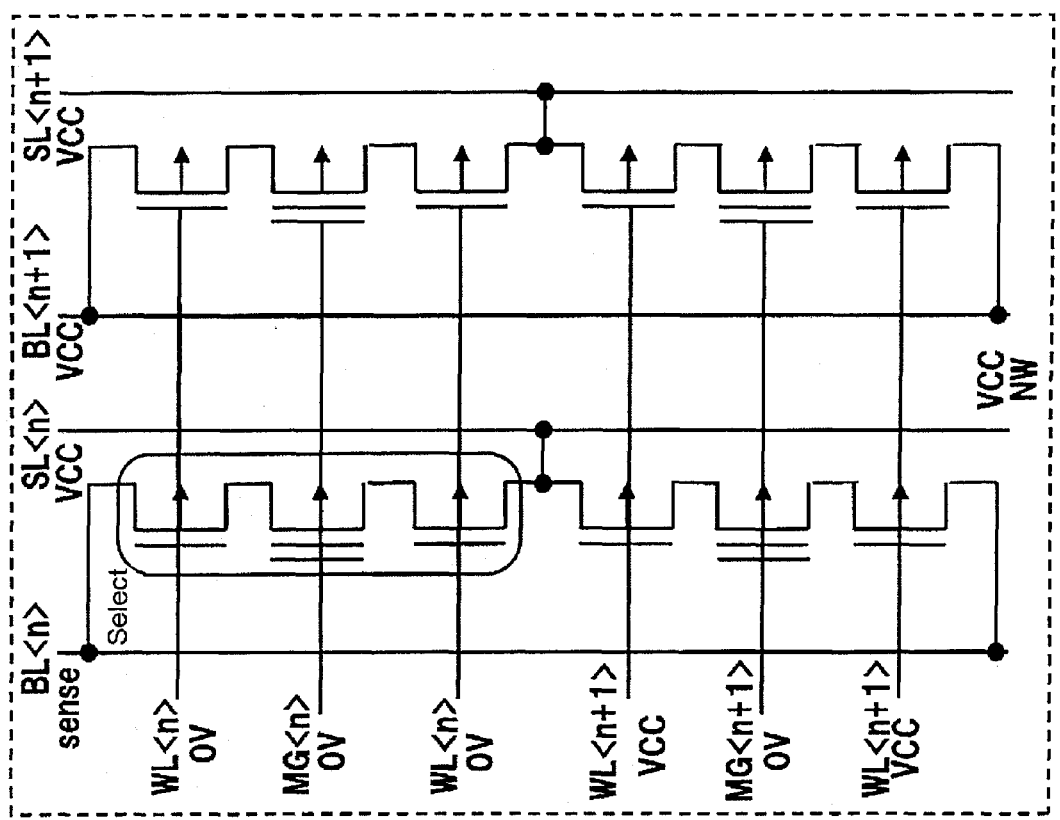
FIG. 41A is a specific example of the voltages applied to each part at the time of a read operation in the fifth embodiment of this invention.

FIG. 41A shows the voltages that are applied to each part at the time of a read operation. 0V is applied to the word line WL<n> and the memory gate line MG<n>, VCC is applied to the word line WL<n+1>, 0V is applied to the memory gate line MG<n+1>, VCC is applied to the source line SL<n> and the source line SL<n+1>, sense is applied to the selected bit line BL<n> and VCC is applied to the non-selected bit line BL<n+1>. The voltage applied to the N type well NW is VCC. Because a select transistor exists, even at the time of a read operation, because it is possible to cut off an off leak (flow of a leak current to a non-selected memory cell connected to the same bit line) of the memory cell, it is not necessary to set a threshold deep and control of the word line at the time of a read operation can be controlled at 0V/VCC (control only of power source voltage). This is the same as in the fourth embodiment.

Figure 41B:
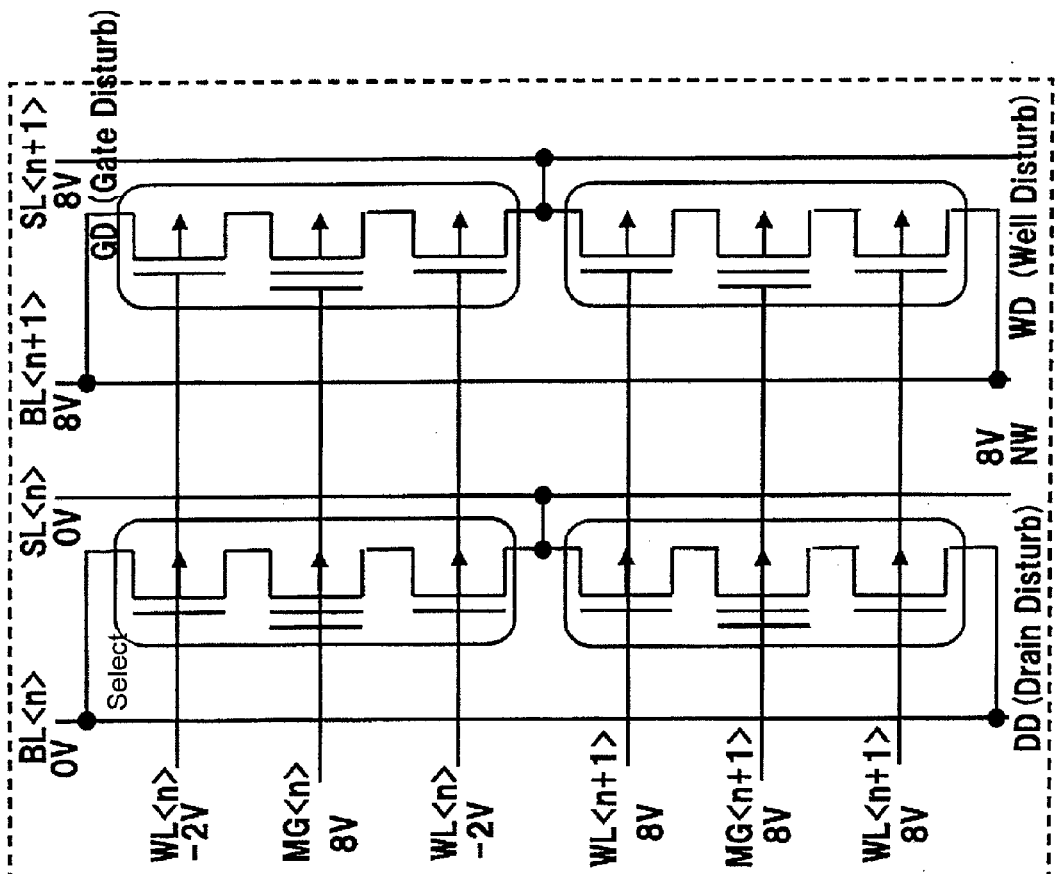
FIG. 41B is a specific example of the voltages applied to each part at the time of a program operation in the fifth embodiment of this invention.

FIG. 41B shows the voltages applied to each part at the time of a program operation. −2V is applied to the word line WL<n>, 8V is applied to the memory gate line MG<n>, 8V is applied to the word line WL<n+1>, 8V is applied to the memory gate line MG<n+1>, 0V is applied to the source line SL <n>, 8V is applied to the source line SL <n+1>, 0V is applied to the selected bit line BL<n> and 8V is applied to the non-selected bit line BL<n+1>. The voltage applied to the N type well NW is 8V. The following merits are obtained when programming using this memory cell. That is, because the drain side select transistor of the non-selected memory cell cuts off the voltage 0V of the selected bit line BL<n>, drain disturb immunity is improved. In addition, because the potential difference between the source and drain at the time of programming is 0V, scaling of the length of a gate is easy. In addition, because the same 8V is applied to the all of the four terminals of a memory cell cell transistor in which gate disturb (GD) becomes a problem, the gate disturb problem can be entirely avoided. Also, it is possible to cut off the voltage 0V of the selected bit line BL and source line SL by both select transistors of the drain side and source side, and by setting the non-selected memory cell gate voltage the same as the N type well voltage NW, it is possible to possible to further improve drain disturb immunity.

Figure 41C:
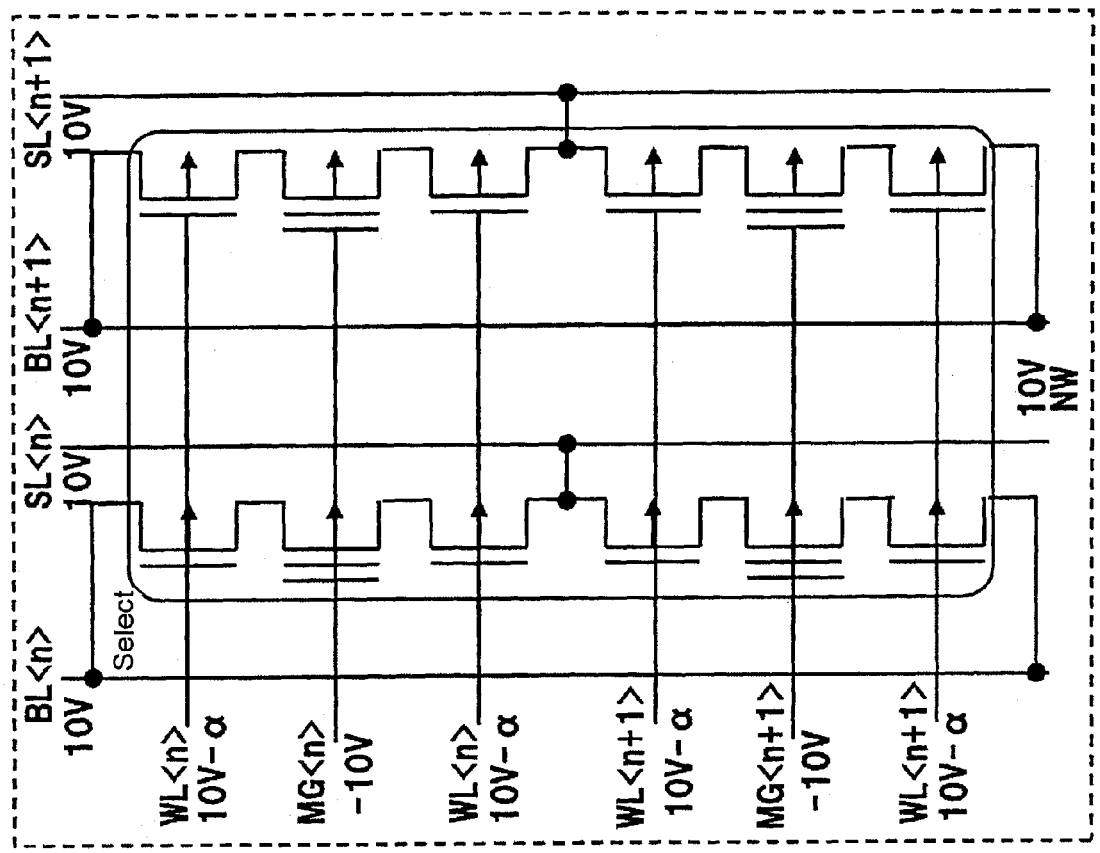
FIG. 41C is a specific example of the voltages applied to each part at the time of an erase operation in the fifth embodiment of this invention.

FIG. 41C shows an example of the voltages applied to each part at the time of a block erase operation. 10V-α is applied to the word line WL<n> and the word line WL<n+1>, −10V is applied to the memory gate line MG<n> and the memory gate line MG<n+1>, 10V is applied to the source line SL<n> and the source line SL<n+1>, and 10V is applied to the bit line BL<n> and the bit line BL<n+1>. The voltage applied to the N type well NW is 10V. In these conditions, the accumulated electrons are ejected into the entire surface of the channel by a FN tunnel current and erase is performed. In this case, it is sufficient that the break down voltage of the periphery transistors be 10V or more. So that gate stress becomes as small as possible, it is preferable that a be as small as possible, however, the select transistor may be set so that it conducts.

Figure 41D:
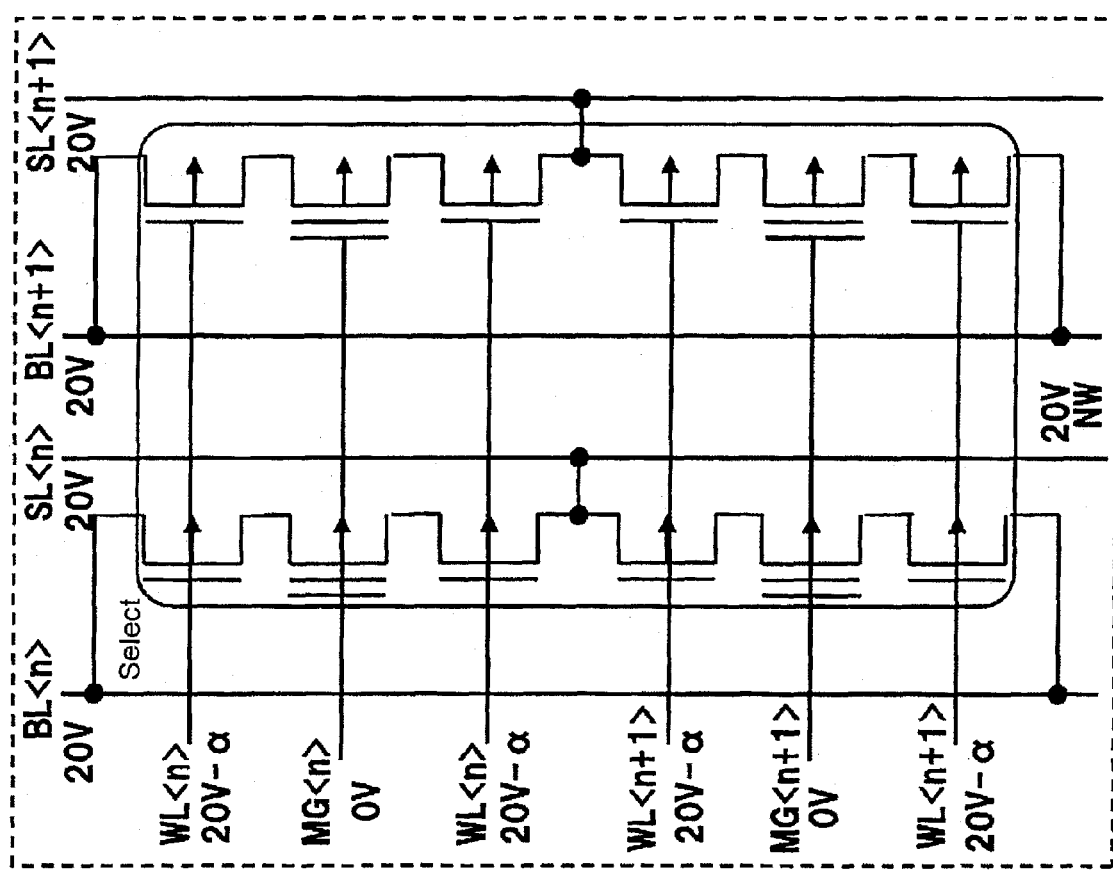
FIG. 41D is a specific example of the voltages applied to each part at the time of an erase operation in the fifth embodiment of this invention.

FIG. 41D shows another example of the voltages applied to each part at the time of a block erase operation. 20V-α is applied to the word line WL<n> and the word line WL<n+1>, 0V is applied to the memory gate line MG<n> and the memory gate line MG<n+1>, 20V is applied to the source line SL<n> and the source line SL<n+1>, and 20V is applied to the bit line BL<n> and the bit line BL<n+1>. The voltage applied to the N type well NW is 20V. In these conditions too, the accumulated electrons are ejected into the entire surface of the channel by a FN tunnel current and erase is performed. In this case, the break down voltage of the periphery transistors is required to be 20V or more, however, operation of all the circuits is possible by a positive voltage of 0V or more.

Figure 41E:
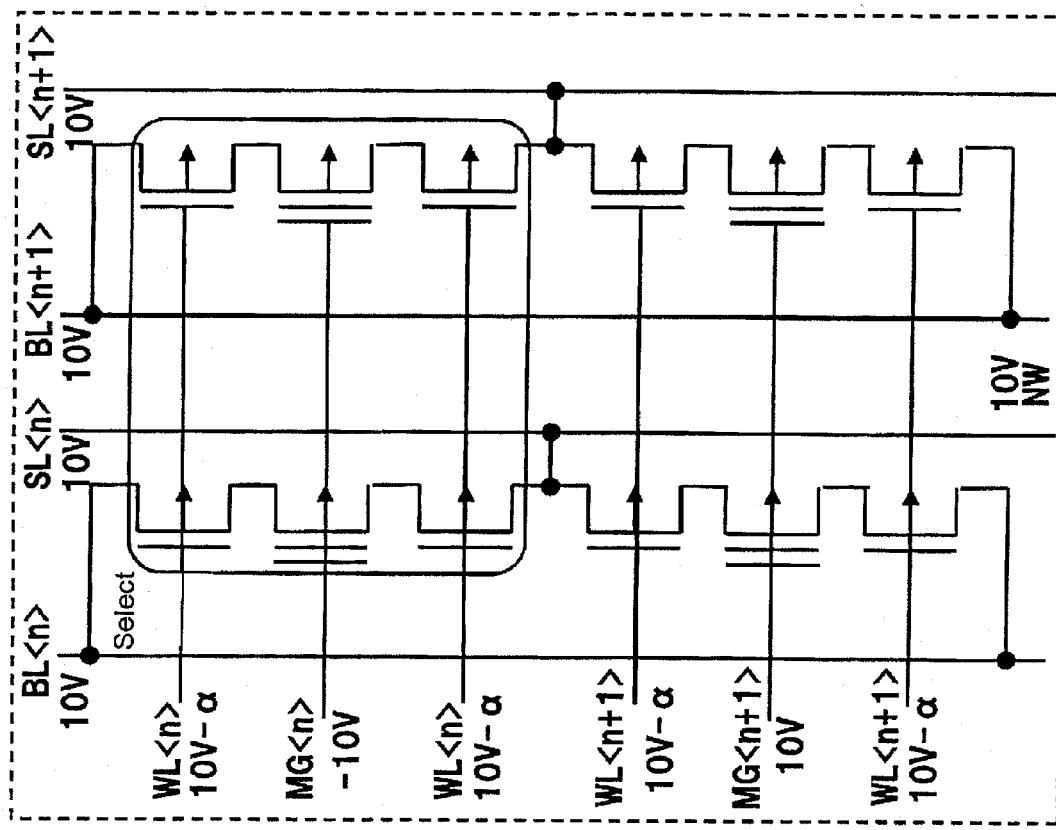
FIG. 41E is a specific example of the voltages applied to each part at the time of an erase operation in the fifth embodiment of this invention.

FIG. 41E shows an example of the voltages applied to each part at the time of a world line erase operation. 10V-α is applied to the word line WL<n> and the word line WL<n+1>, −10V is applied to the memory gate line MG<n> and −10V is applied to the memory gate line MG<n+1>, 10V is applied to the source line SL<n> and the source line SL<n+1>, and the bit line BL<n> and the bit line BL<n+1> are supplied with 10V. The voltage applied to the N type well NW is 20V. Also in these conditions, the electrons are ejected from the charge storage layer of one row of memory cells which are connected to the memory gate line MG<n> which is supplied with 0V, into the entire surface of the channel by a FN tunnel current and erase is performed.

Figure 41F:
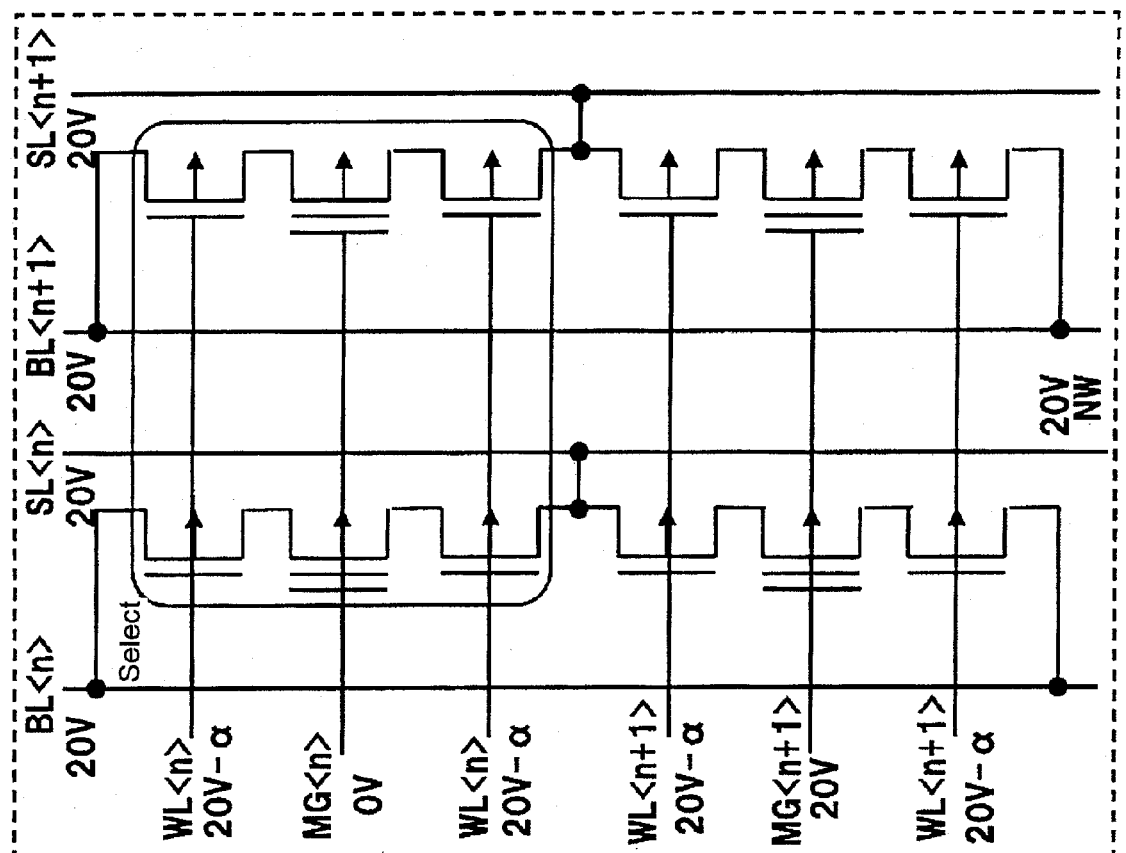
FIG. 41F is a specific example of the voltages applied to each part at the time of an erase operation in the fifth embodiment of this invention.

FIG. 41F shows another example of the voltages applied to each part at the time of a world line erase operation. 20V-α is applied to the word line WL<n> and the word line WL<n+1>, 0V is applied to the memory gate line MG<n> and 20V is applied to the memory gate line MG<n+1>, 20V is applied to the source line SL<n> and the source line SL<n+1>, and the bit line BL<n> and the bit line BL<n+1> are supplied with 20V. The voltage applied to the N type well NW is 20V. Also in these conditions, the electrons are ejected from the charge storage layer of one row of memory cells which are connected to the memory gate line MG<n> which is supplied with 0V, into the entire surface of the channel by a FN tunnel current and erase is performed.

FIG. 42 shows a chart of a comparison of each embodiment of the present invention and conventional examples. A comparison was made of the symmetrical structure of the source and drain of the memory elements, the array structure, ease of scaling gate length, consumption power in a read operation and disturb characteristics in a program operation. From this chart, in any of the embodiments, it is possible to set the voltages which meet each type of disturb characteristic and in addition, scaling of the gate length becomes easier because the potential difference between a source and drain at the time of a programming operation becomes zero. In addition, in the fourth and fifth embodiments, power consumption at the time of a read operation is less than a conventional example. Furthermore, program disturb immunity is better improved in the third embodiment than in a conventional example and improved even further in the fourth embodiment. Furthermore, even further improvements can be seen in the fifth embodiment.

Figure 43:
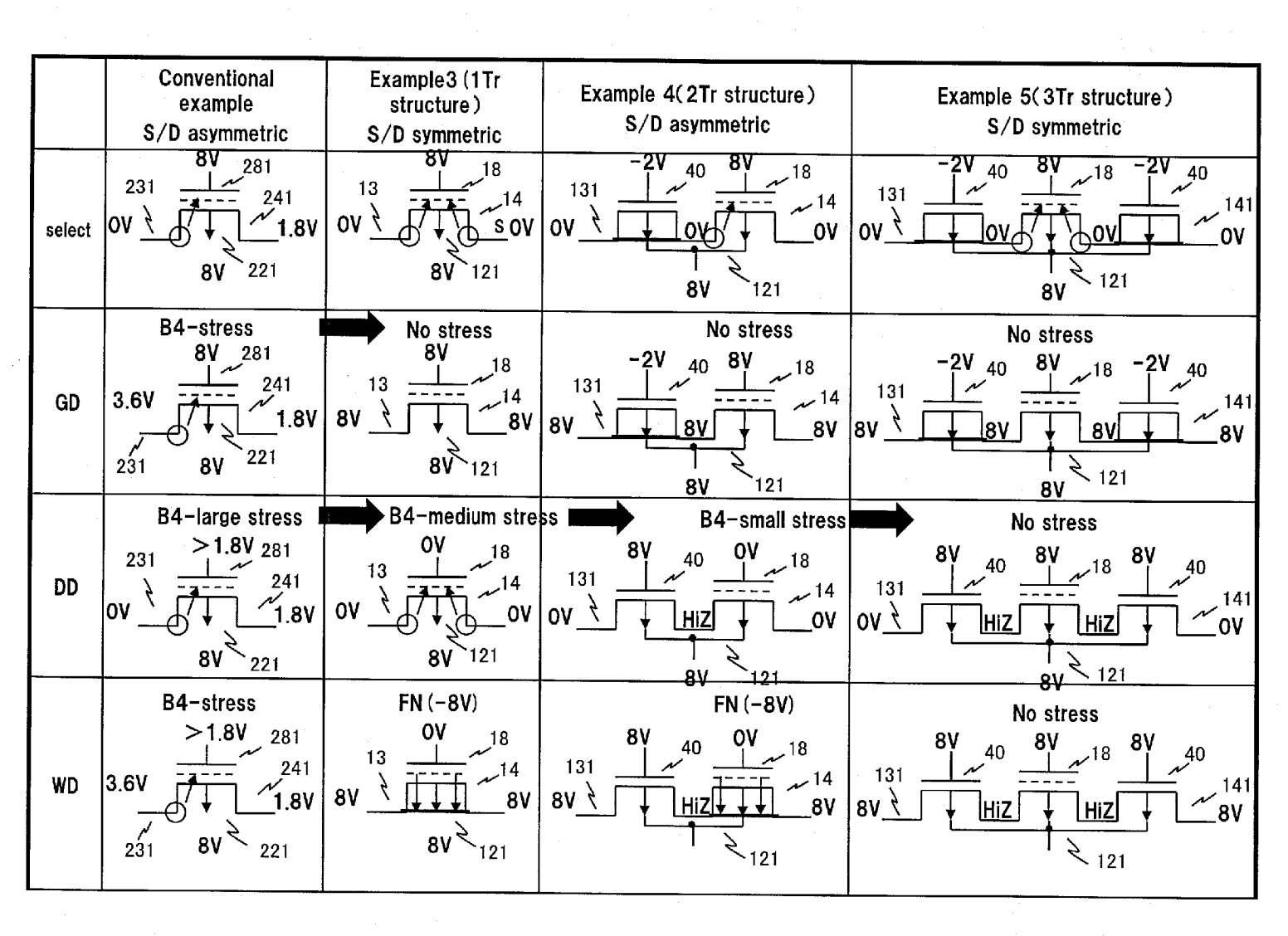

FIG. 43 is a chart of a comparison of each embodiment of the present invention and conventional examples focusing on each disturb stress at the time of a programming operation. In the chart, GD shows a memory cell (a memory cell which exists on the same row as a selected memory cell) in which gate disturb GD becomes a problem, DD shows a memory cell (a memory cell which exists on the same column as a selected memory cell) in which drain disturb DD becomes a problem, and WD shows a memory cell (a memory cell which exists on different row, column from a selected memory cell)

in which well disturb becomes a problem. From this diagram, in the fifth embodiment, it can be seen that all the disturb problems are solved.

Figure 44:
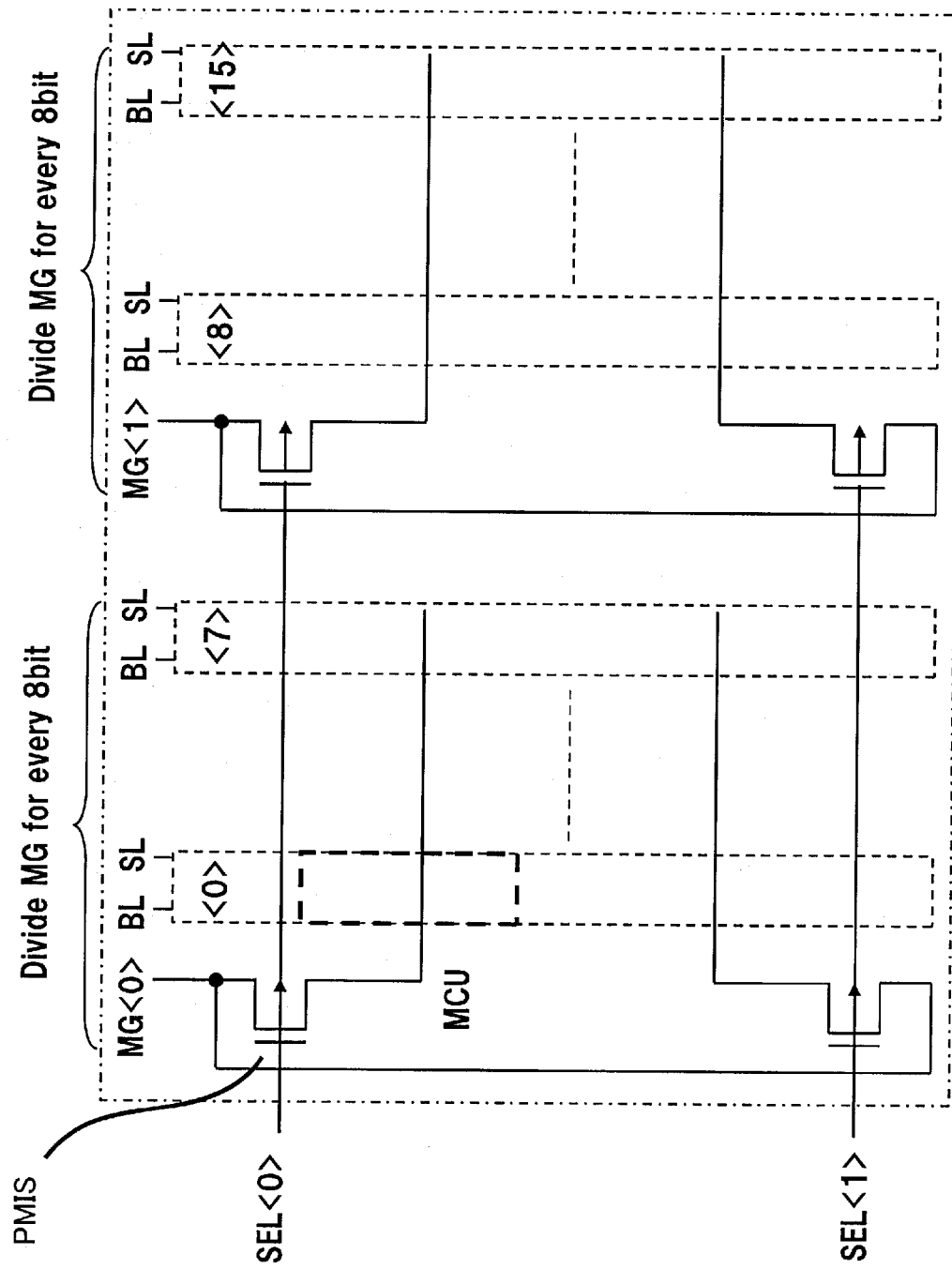
FIG. 44 is a structural diagram of a memory cell array of a nonvolatile memory related to the sixth embodiment.
Figure 45:
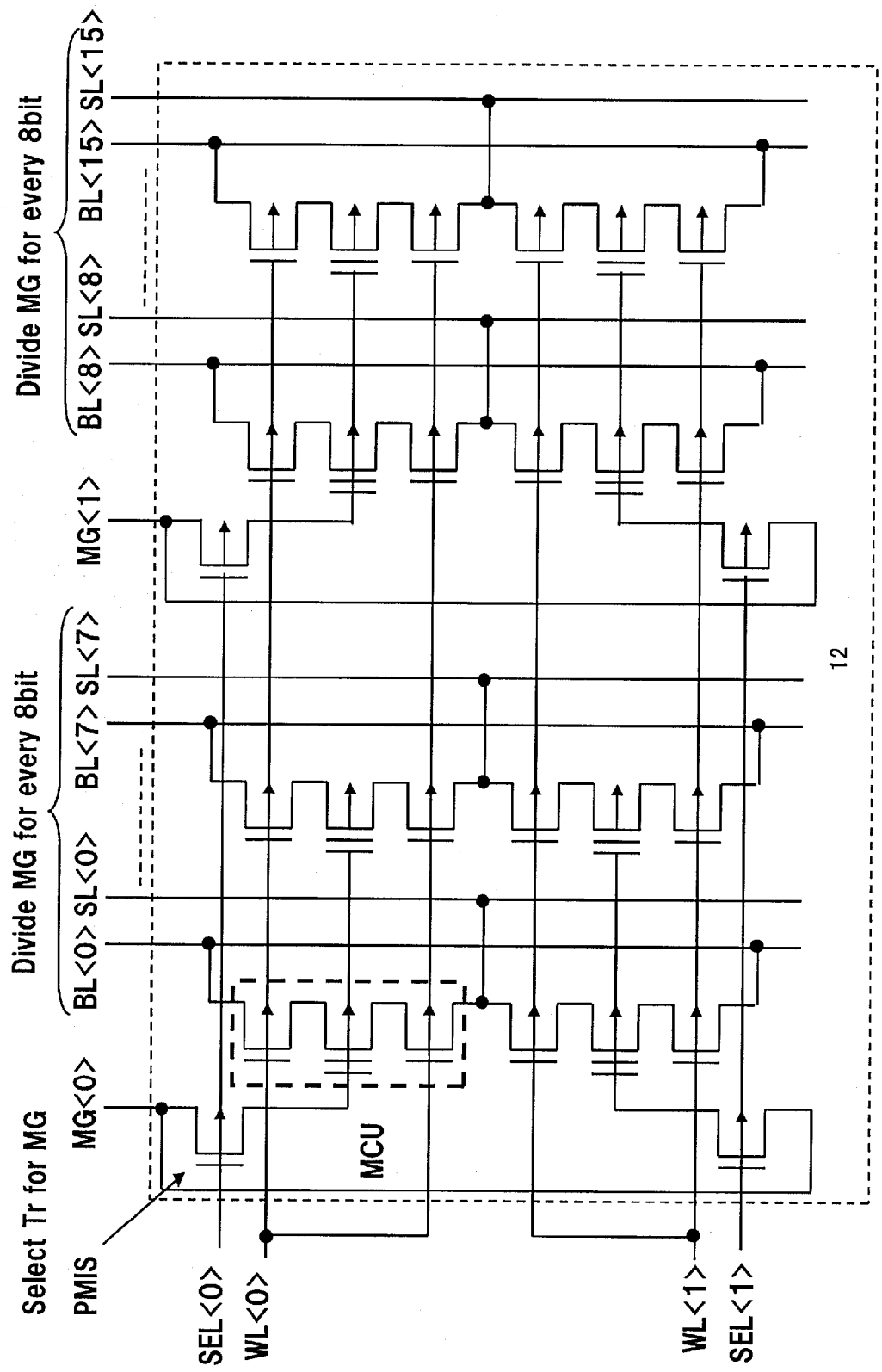
FIG. 45 is a structural diagram of a memory cell array of a nonvolatile memory related to the sixth embodiment.

FIG. 44 is a structural diagram of a memory cell array related to an example (sixth embodiment) in which a byte type EEPROM (a nonvolatile memory which can program and erase in 8 bit units) which applied each of the embodiments described above, is realized. The characteristics of this EEPROM are that because erase in 8 bit units can be realized, the gate electrode (memory cell gate MG) of a memory element is divided for every 8 bits. Then, control of the gate electrode is performed by an MG select transistor (PMIS) which is driven by the select line SEL. This MG select transistor is formed within the same N type well as a memory cell. This construction can be applied to all the embodiments (third, fourth and fifth) of the present invention explained above. In FIG. 45, an example which applies to the byte type EEPROM which applies a memory cell related to the fifth embodiment is shown.

Figure 46:
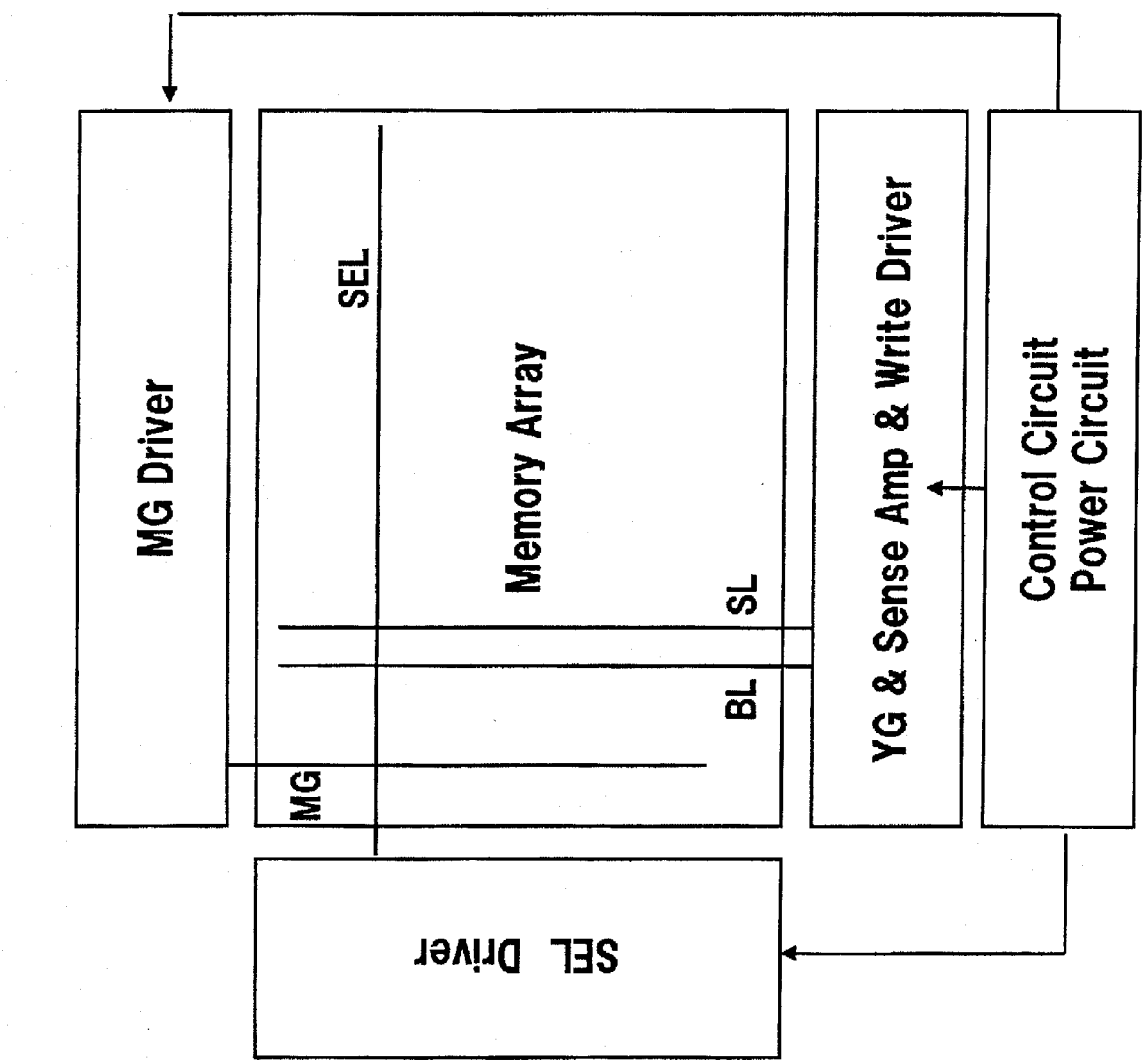
FIG. 46 is an entire structural diagram of a nonvolatile memory related to the sixth embodiment.
Figure 55:
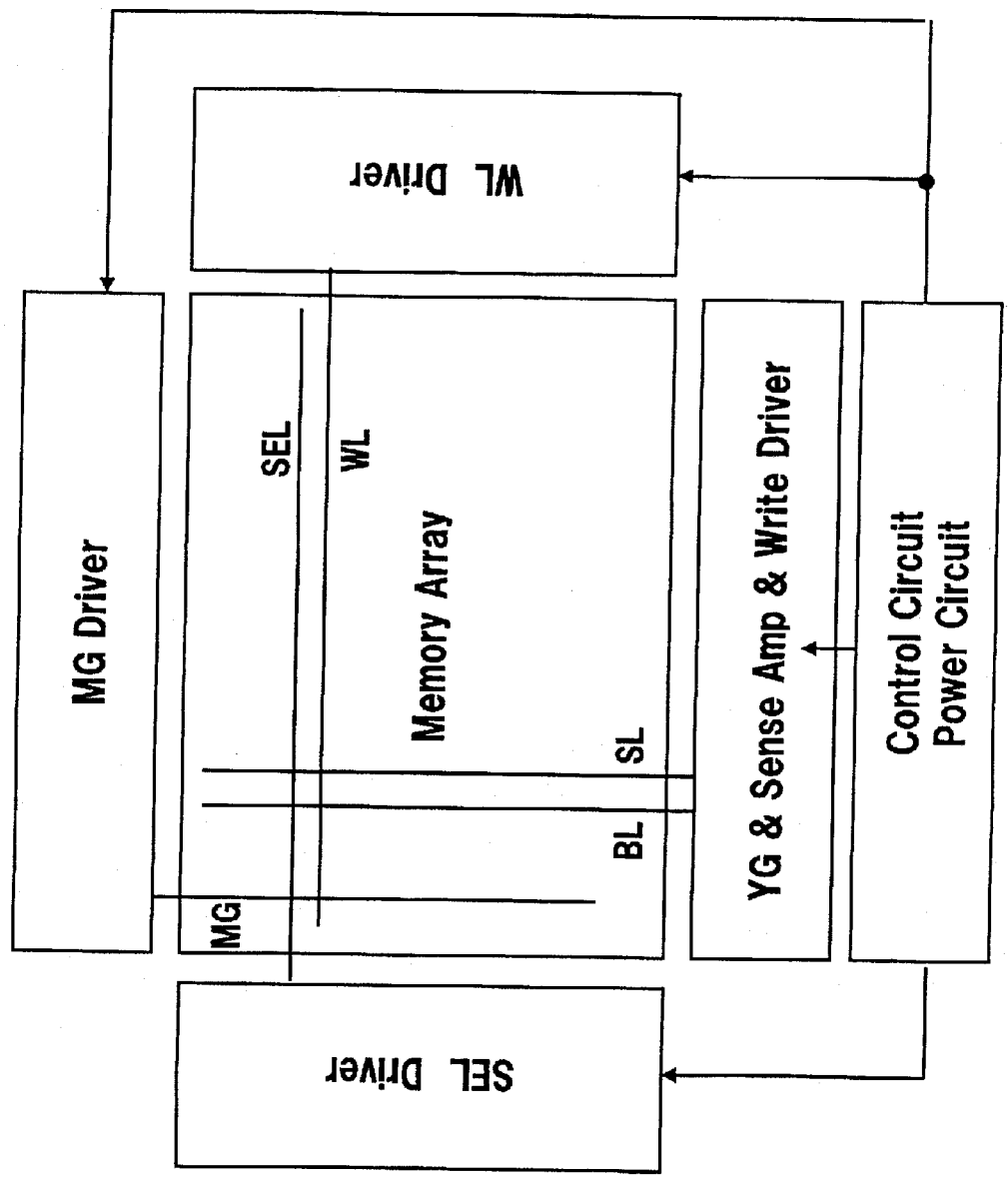
FIG. 55 is an entire structural diagram of a nonvolatile memory related to the seventh embodiment of this invention.

FIG. 46 is an entire circuit structure diagram of the nonvolatile semiconductor memory device related to the sixth embodiment and shows the case where the memory cell related to the third embodiment is applied. This nonvolatile semiconductor memory device is constructed from the memory cell array shown in FIG. 44, memory gate line drivers which drive memory gate lines MGs, Y gates (YGs) which drive bit lines BLs and source lines SLs, sense amplifiers (Sense Amps) and program drivers, and SEL drivers which drive select lines SELs. Furthermore, this nonvolatile semiconductor memory device includes control circuits which control the memory gate line drivers, the Y gates, the sense amplifiers and the program drivers, and also power circuits which supply various voltages. FIG. 55 is an example of a transformed structure of the entire circuit structure shown in FIG. 46 and shows the case where the memory cell related to the fourth and fifth embodiments are applied. In FIG. 55 an example in which word line WL drivers separate from the SEL drivers are arranged on the opposite side of the memory cell array.

Figure 47:
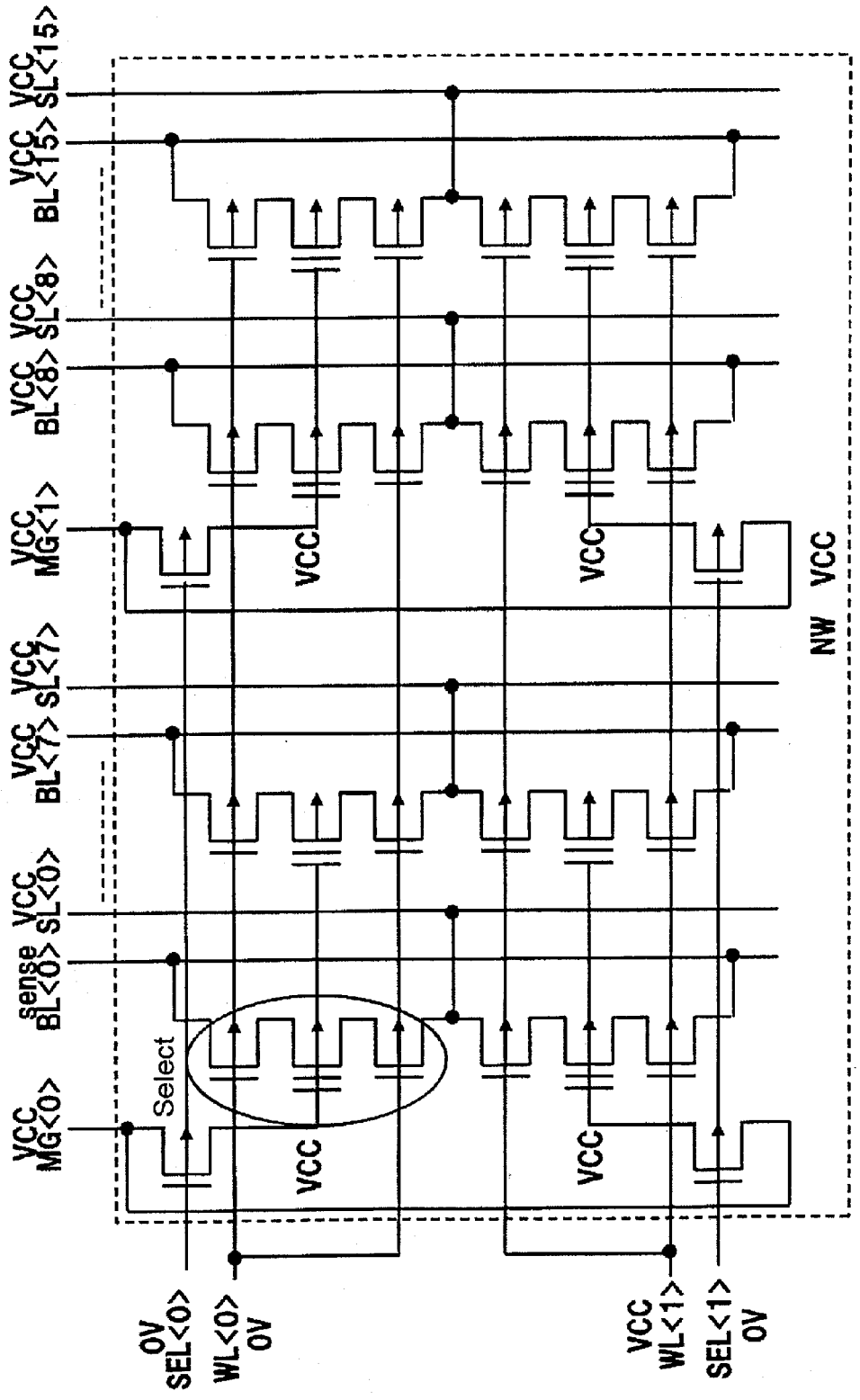
FIG. 47 is a specific example of the voltages applied to each part at the time of a read operation in the sixth embodiment of this invention.

FIG. 47 is a diagram which shows a specific example related to the conditions of operation voltage in a read operation. Here, the memory cell enclosed with a circle shows an example of a memory cell selected for reading. 0V is applied to the select line SEL<0> and the select line SEL<1>, 0V is applied to the word line WL<0>, VCC is applied to the word line WL<1>, VCC is applied to the memory gate line MG<0> and the memory gate line MG<1>, sense is applied to BL<0>, VCC is applied to a bit line, and VCC is applied to the source line SL. The N type well NW is applied with VCC.

Figure 48:
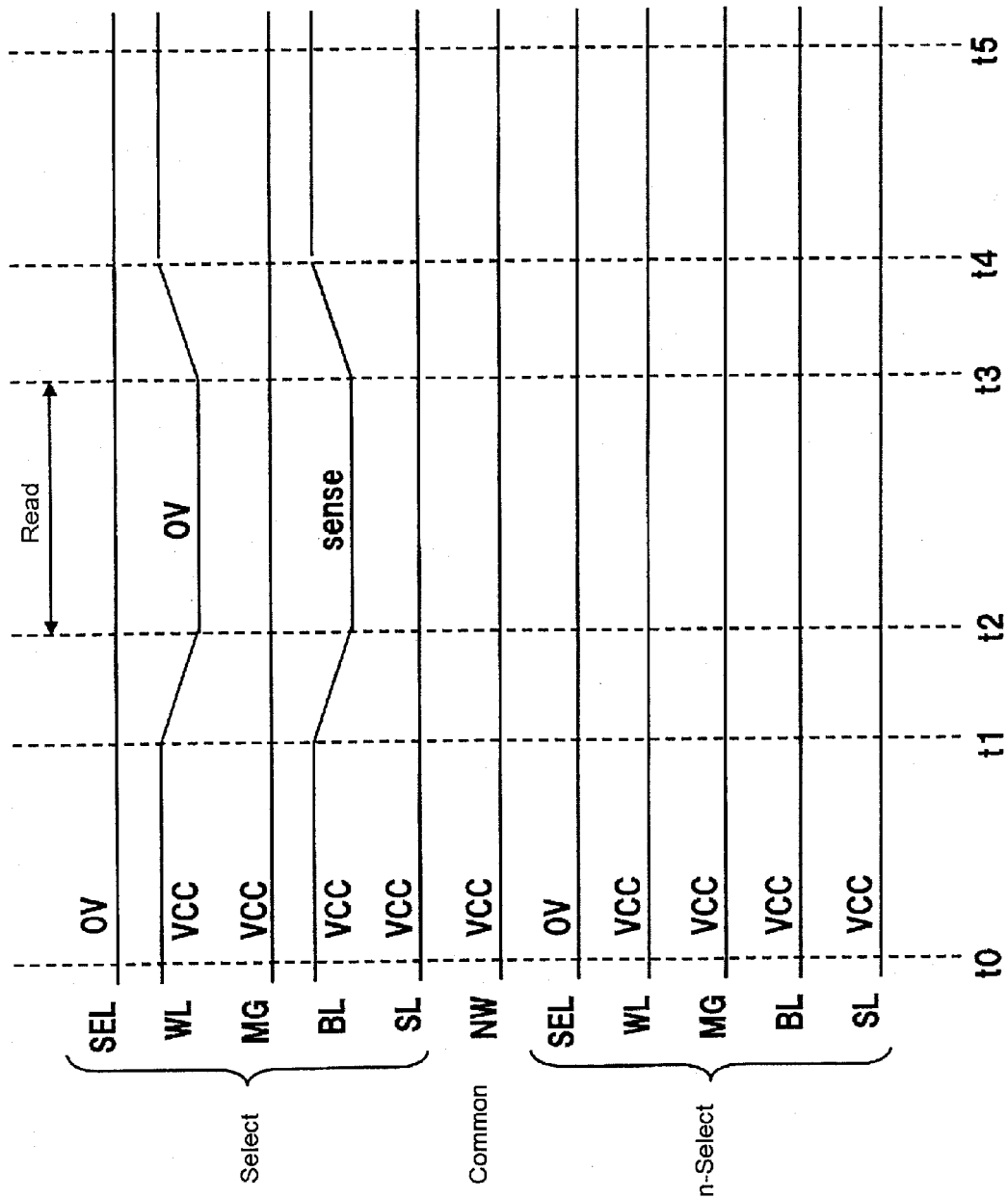
FIG. 48 is a time chart during a read operation in the sixth embodiment of this invention.

FIG. 48 is a time chart which shows the voltages applied to each node at the time of a read operation. Between the times t1 and t2, the potential of the selected word line WL drops to 0V and the select bit line BL is connected to a sense amplifier. Between the times t3 and t4, the potential of the selected word line WL returns to VCC and the select bit line BL is cut off from the sense amplifier. Reading takes place between the time t2 and t3.

Figure 49:
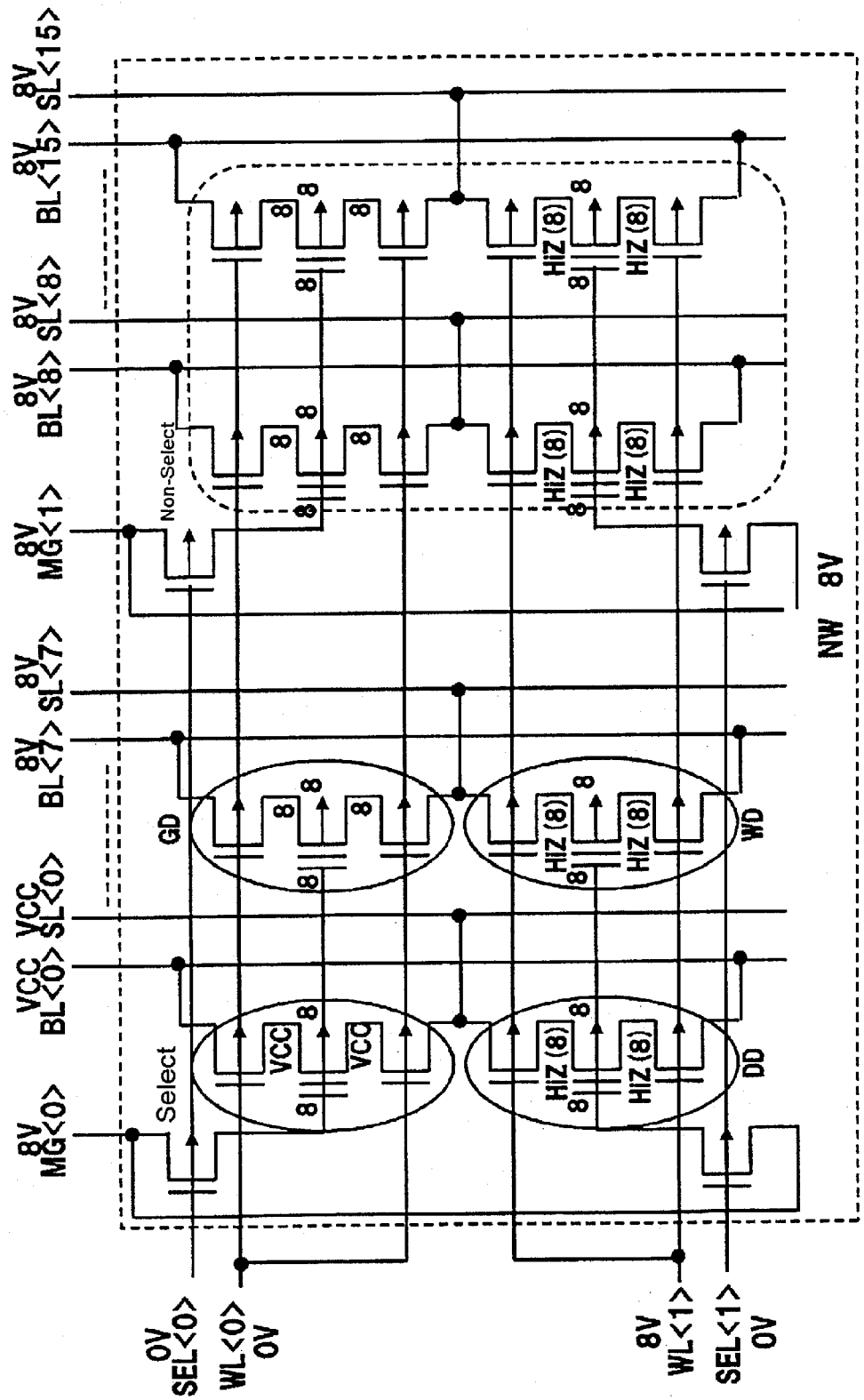
FIG. 49 is a specific example of the voltages applied to each part at the time of a program operation in the sixth embodiment of this invention.

FIG. 49 is a diagram which shows a specific example related to the conditions of operation voltages at the time of a program operation. Here, in the diagram, memory cells marked with select are memory cells to be programmed, memory cells marked with GD are memory cells in which gate disturb becomes a problem, memory cells marked with DD are memory cells in which drain disturb becomes a problem and memory cells marked with WD are memory cells in which well disturb becomes a problem. In addition, the non-selected memory cells are marked enclosed with a dotted line. 0V is applied to the select line SEL<0> and the select line SEL<1>, 0V is applied to the word line WL<0>, 8V is applied to the word line WL<1>, 8V is applied to the memory gate line MG<0> and the memory gate line MG<1>, VCC is applied to the selected bit line BL<0>, 8V is applied to the other bit lines BL, VCC is applied to the selected source line SL<0> and 8V is applied to all the other source lines SL. The N type well NW is applied with 8V. Characteristically, all the disturb stress apart from the selected memory cells is avoided. Furthermore, in this embodiment, because an MG select transistor is formed within the same N type well as the memory cell, it is necessary to set the potential of MG below the potential of the N type well NW.

Figure 50:
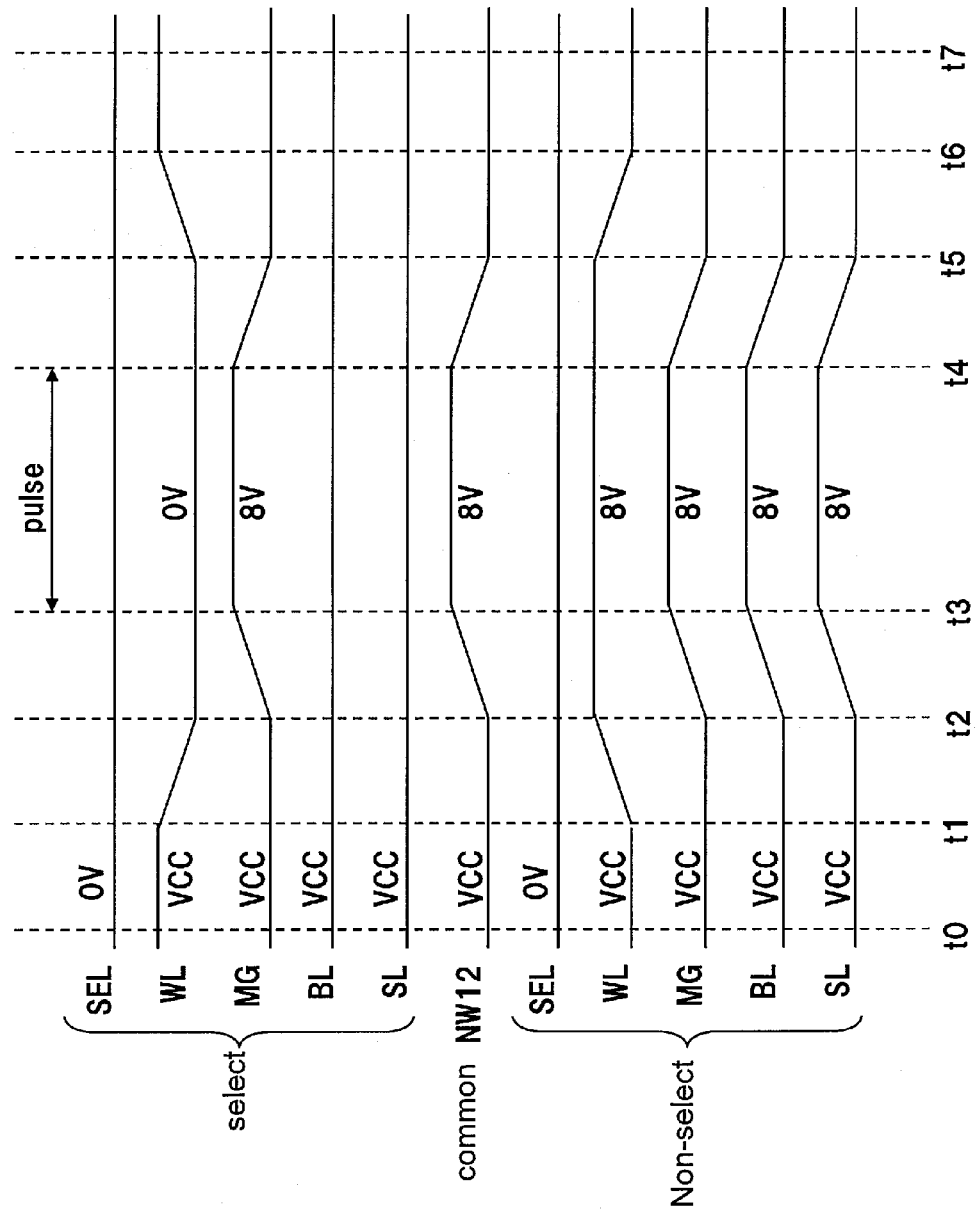
FIG. 50 is a time chart during a program operation in the sixth embodiment of this invention.

FIG. 50 is a time chart which shows the voltage which are applied to each node at the time of a program operation. Between the times t1 and t2, the potential of the selected word line WL drops to 0V and the potential of the non-selected word line WL rises from VCC to 8V. Between the times t2 and t3, the potential of the memory gate line MG rises from VCC to 8V and the non-selected bit line BL, the non-selected source line SL and the well potential NW rise from VCC to 8V. Programming (pulse) takes place between the times t3 and t4.

Figure 51:
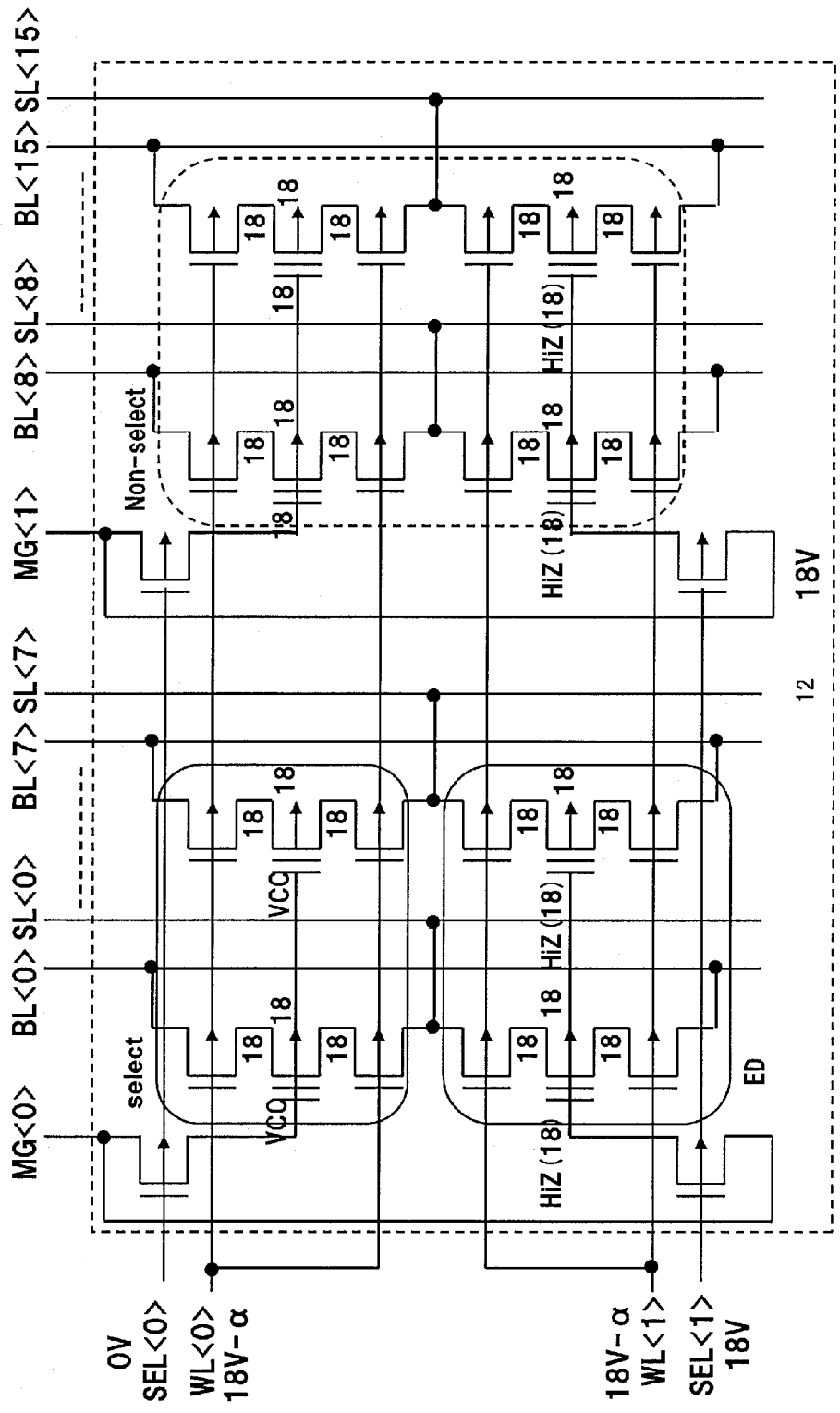
FIG. 51 is a specific example of the voltages applied to each part at the time of an erase operation in the sixth embodiment of this invention.

FIG. 51 is a diagram which shows a specific example related to the conditions of the operation voltage at the time of an erase operation. Here, the memory cells marked with select are the memory cells to be erased. 0V is applied to the select line SEL<0>, 18V is applied to the select line SEL<1>, 18V-α is applied to the word line WL<0> and the word line WL<1>, VCC is applied to the memory gate line MG<0>, 18V is applied to the memory gate line MG<1>, and 18V is applied the source bit line BL and the source line SL. The N type well NW is applied with 18V. Characteristically, all the disturb stress apart from the selected memory cells is avoided. Furthermore, in this embodiment, by setting the voltage of the gate of the select transistor to a voltage at which the channel conducts, that is, about 18V-α, it is possible to relieve gate stress of a memory cell. In addition, in this example, all the operation voltages are realized above 0V and it is possible to operate using only a charge pump which generates a positive voltage.

Figure 52:
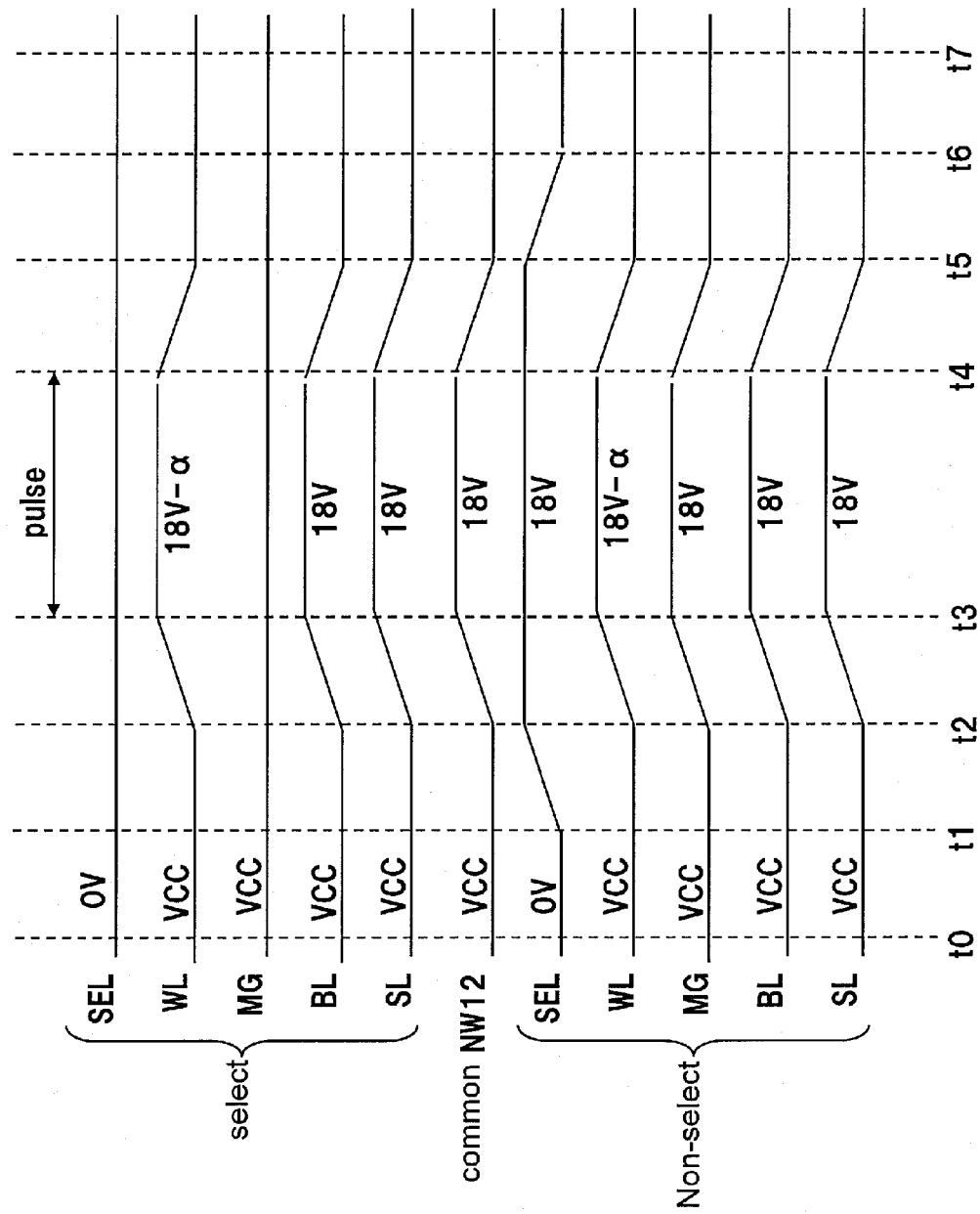
FIG. 52 is a time chart during an erase operation in the sixth embodiment of this invention.

FIG. 52 is a time chart which shows the voltages applied to each node at the time of an erase operation. Between the times t1 and t2, the potential of the non-selected select line SEL rises to 18V. Between the times t2 and t3, the potentials of the word line WL, the bit line BL, the source line SL and the non-selected memory gate MG rise to 18V-α. Erasure (pulse) takes place between t3 and t4.

Figure 53:
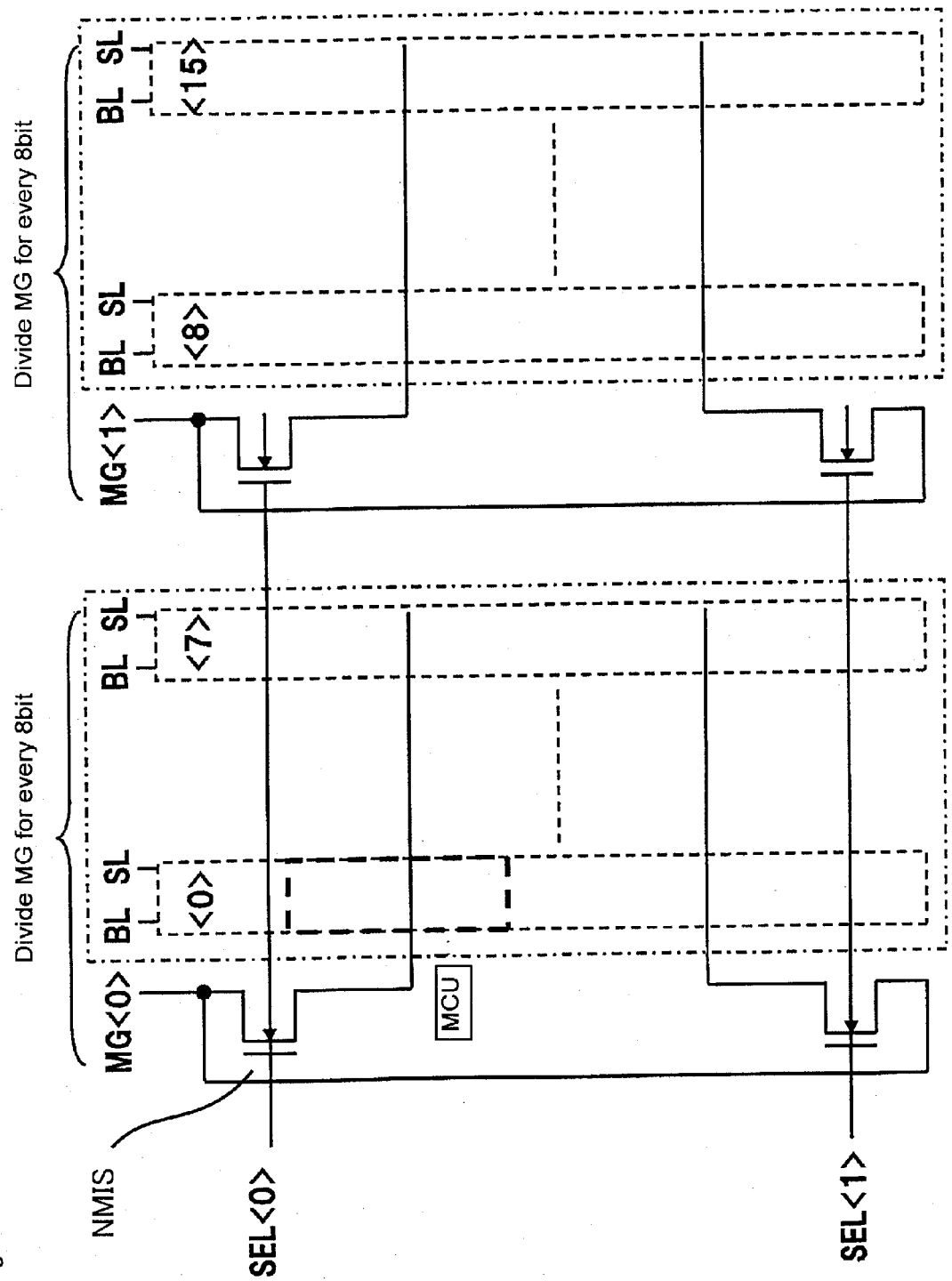
FIG. 53 is a structural diagram of a memory cell array of a nonvolatile memory related to the seventh embodiment of this invention.
Figure 54:
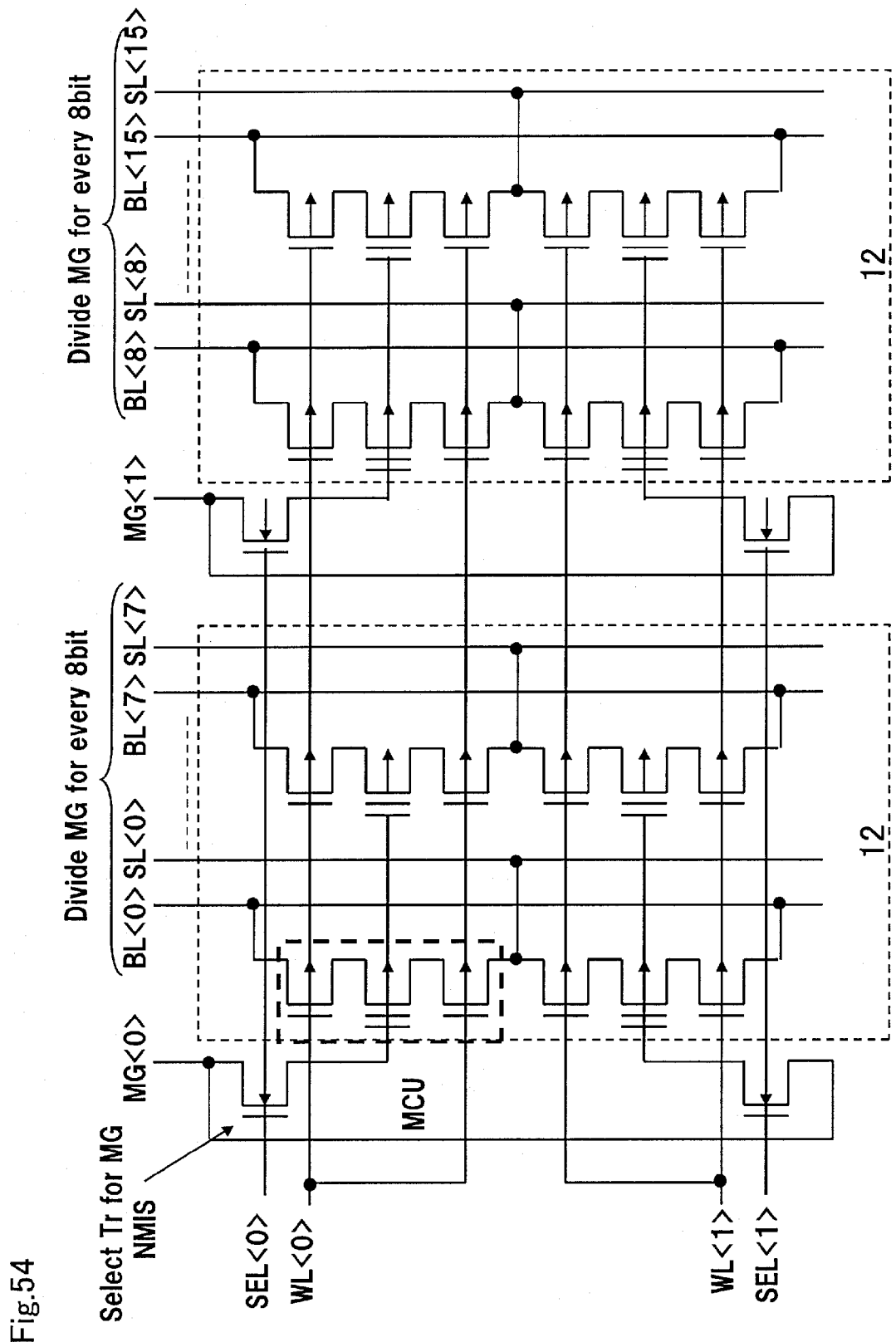
FIG. 54 is a structural diagram of a memory cell array of a nonvolatile memory related to the seventh embodiment of this invention.

FIG. 53 is a structural diagram of a memory cell array related to an example (seventh embodiment) in which a byte type EEPROM (a nonvolatile memory which can program and erase in 8 bit units) which applied each of the embodiments described above, is realized. The characteristics of this EEPROM are that because erase in 8 bit units can be realized, the gate electrode (memory cell gate MG) of a memory element is divided for every 8 bits. Then, control of the gate electrode is performed by an MG select transistor (NMIS) which is driven by the select line SEL. This MG select transistor is formed within the P type well which is formed adjacent to an N type well formed in a memory cell. This construction can be applied to all the embodiments (third, fourth and fifth) of the present invention explained above. In FIG. 54, an example which applies to the byte type EEPROM which applies a memory cell related to the fifth embodiment is shown. FIG. 46 or FIG. 55 are entire circuit structural diagrams of the nonvolatile semiconductor memory device related to the seventh embodiment.

Figure 56:
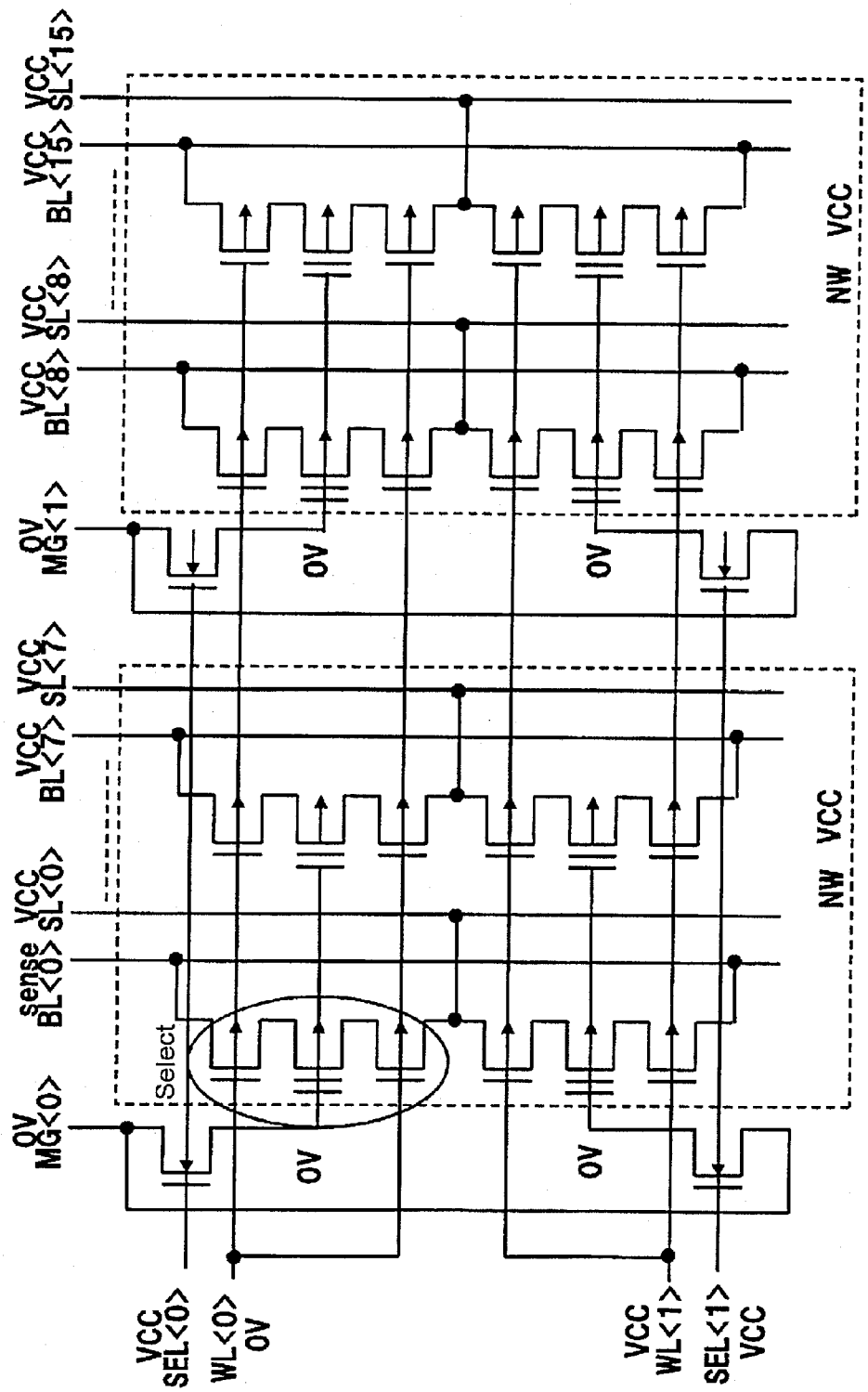
FIG. 56 is a specific example of the voltages applied to each part at the time of a read operation in the seventh embodiment of this invention.

FIG. 56 is a diagram which shows a specific example related to the conditions of operation voltage in a read operation. Here, the memory cell enclosed with a circle shows an example of a memory cell selected for reading. VCC is applied to the select line SEL<0> and the select line SEL<1>, 0V is applied to the word line WL<0>, VCC is applied to the word line WL<1>, 0 is applied to the memory gate line MG<0> and the memory gate line MG<1>, sense is applied to BL<0>, VCC is applied to a bit line, and VCC is applied to the source line SL. The N type well NW is applied with VCC.

Figure 57:
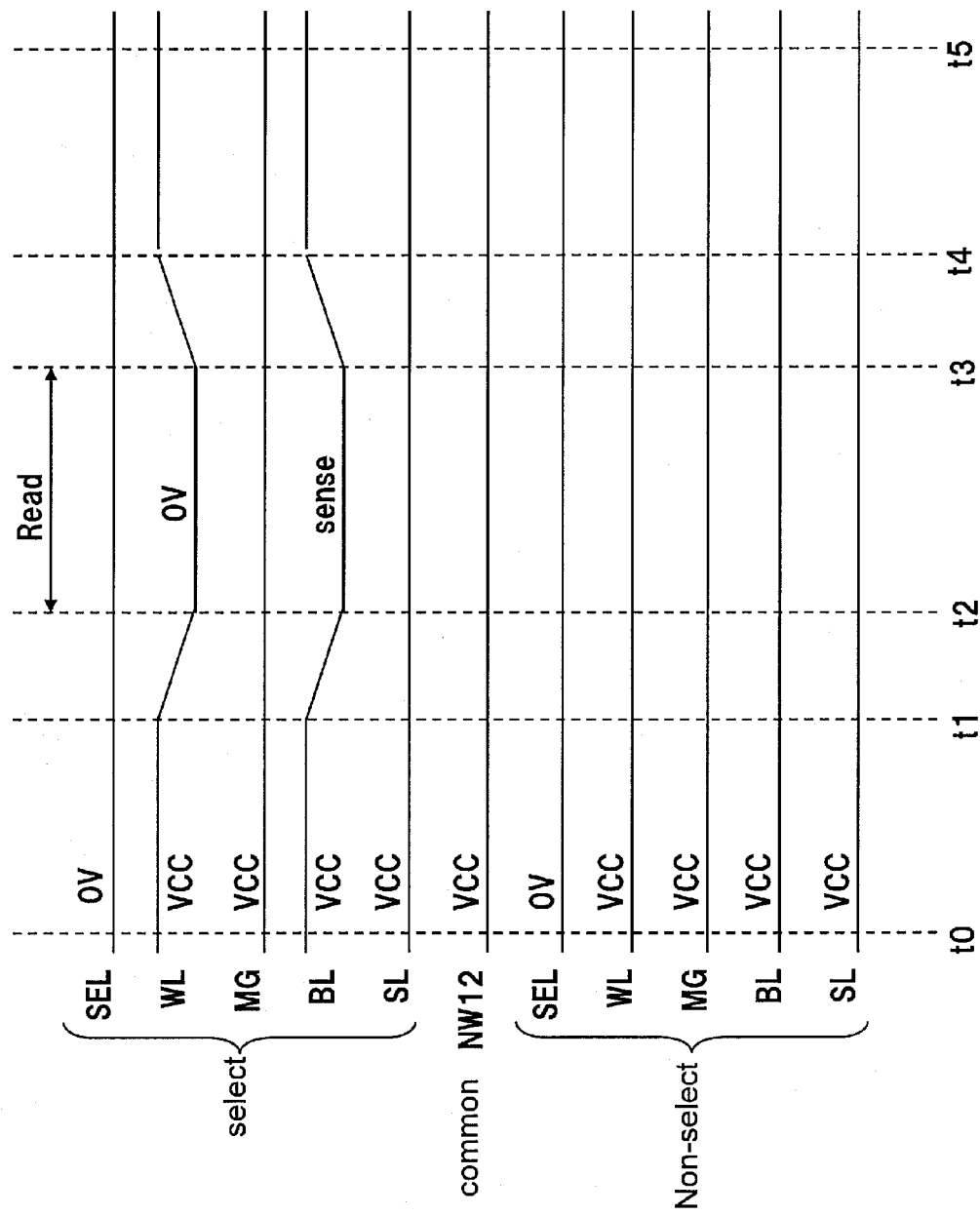
FIG. 57 is a time chart during a read operation in the seventh embodiment of this invention.

FIG. 57 is a time chart which shows the voltages applied to each node at the time of a read operation. Between the times t1 and t2, the potential of the selected word line WL drops to 0V and the select bit line BL is connected to a sense amplifier. Between the times t3 and t4, the potential of the selected word line WL returns to VCC and the select bit line BL is cut off from the sense amplifier. Reading takes place between the time t2 and t3.

Figure 58:
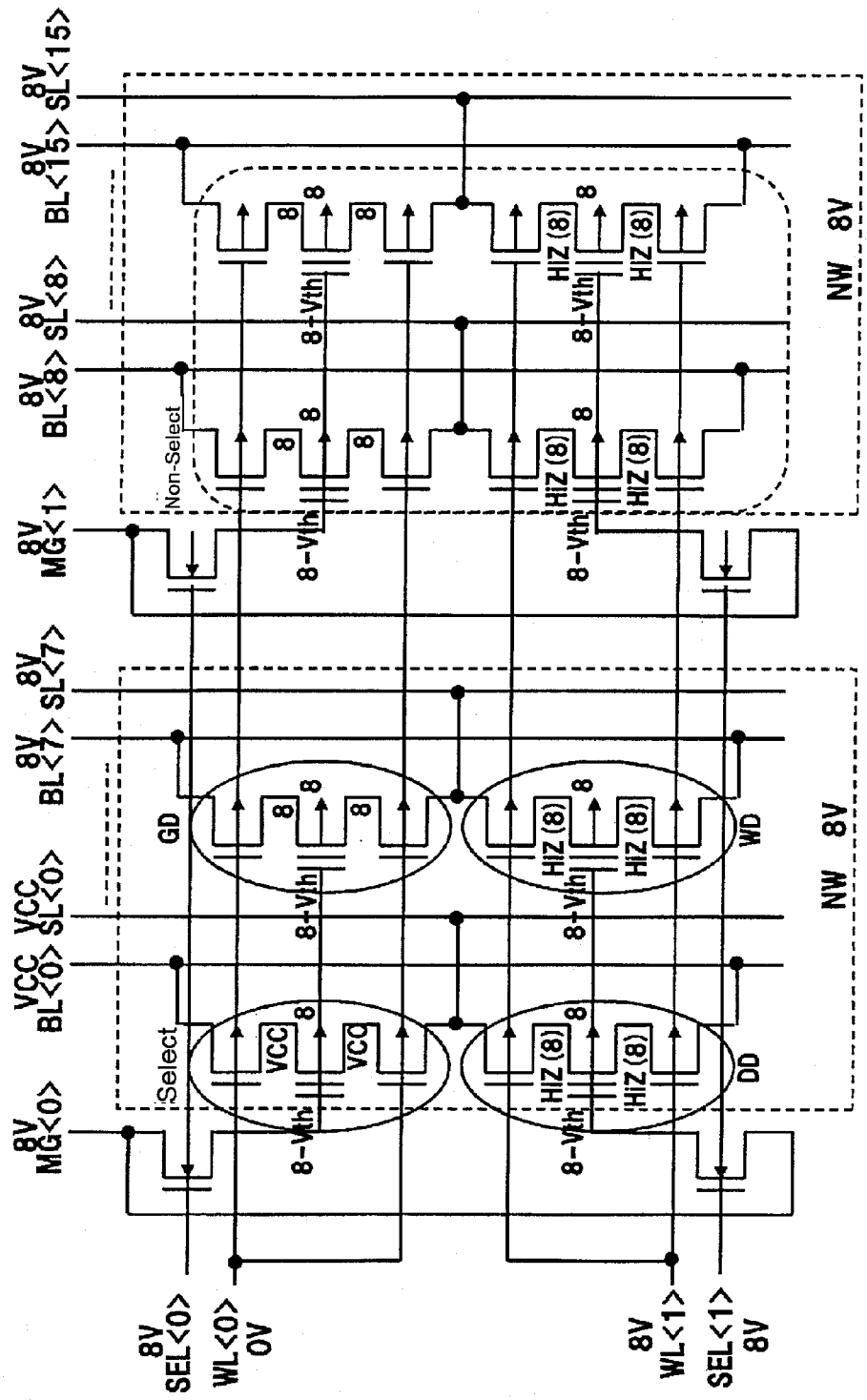
FIG. 58 is a specific example of the voltages applied to each part at the time of a program operation in the seventh embodiment of this invention.

FIG. 58 is a diagram which shows a specific example related to the conditions of operation voltages at the time of a program operation. Here, in the diagram, memory cells marked with select are memory cells to be programmed, memory cells marked with GD are memory cells in which gate disturb becomes a problem, memory cells marked with DD are memory cells in which drain disturb becomes a problem and memory cells marked with WD are memory cells in which well disturb becomes a problem. In addition, the non-selected memory cells are marked enclosed with a dotted line. 8V is applied to the select line SEL<0> and the select line SEL<1>, 0V is applied to the word line WL<0>, 8V is applied to the word line WL<1>, 8V is applied to the memory gate line MG<0> and the memory gate line MG<1>, VCC is applied to the selected bit line BL<0>, 8V is applied to the other bit lines BL, VCC is applied to the selected source line SL<0> and 8V is applied to all the other source lines SL. The N type well NW is applied with 8V. As a result, 8V-Vth (however, Vth is a threshold voltage of an MG transistor) is applied to the gate of a cell transistor of a memory cell. Characteristically, all the disturb stress apart from the selected memory cells is avoided. Furthermore, in this embodiment, because an MG select transistor and the N type well which forms a memory cell are formed independently, it is possible to independently set the potentials of MG and NW.

Figure 59:
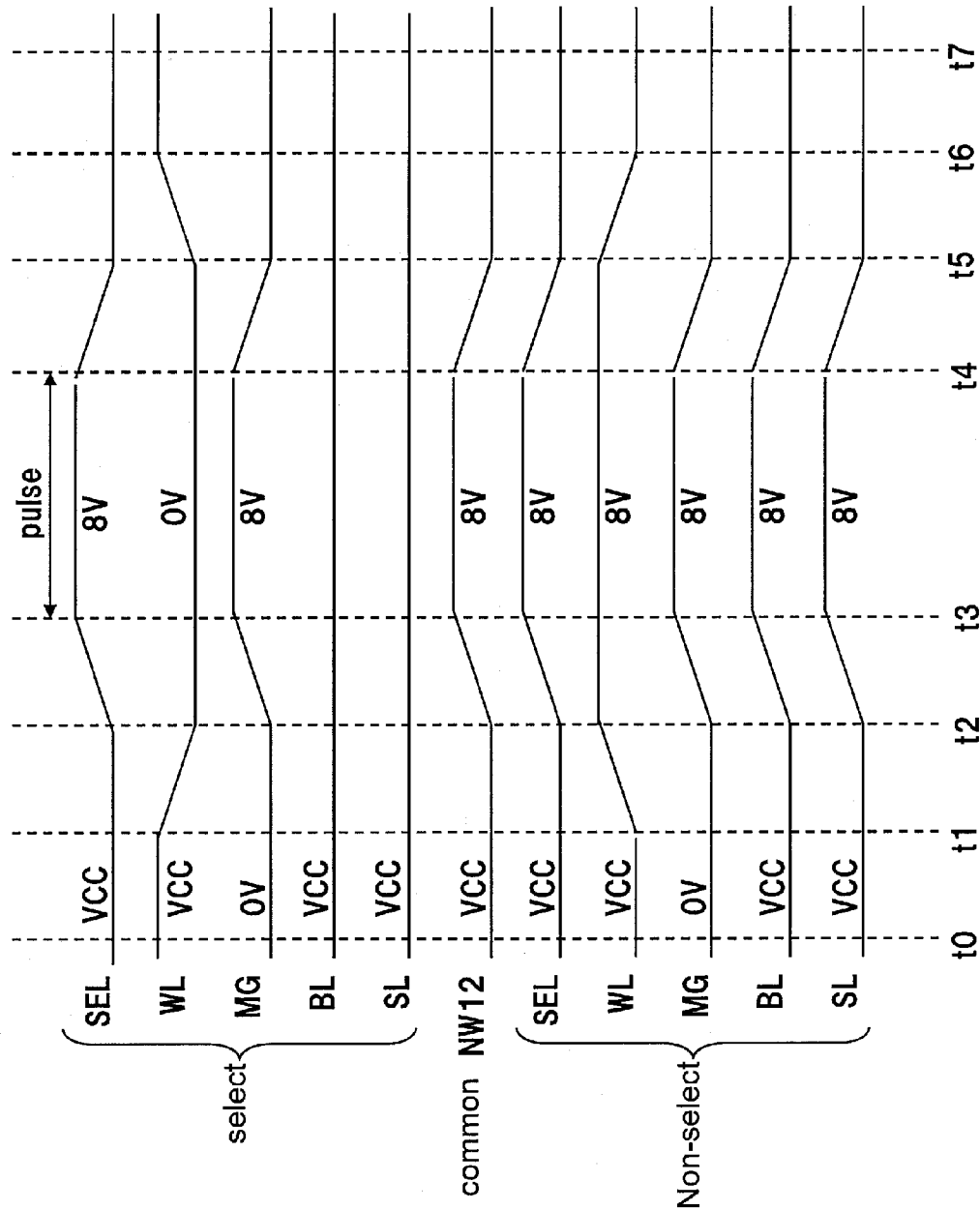
FIG. 59 is a time chart during a program operation in the seventh embodiment of this invention.

FIG. 59 is a time chart which shows the voltage which are applied to each node at the time of a program operation. Between the times t1 and t2, the potential of the selected word line WL drops to 0V and the potential of the non-selected word line WL rises from VCC to 8V. Between the times t2 and t3, the potential of the memory gate line MG rises from VCC to 8V and the non-selected bit line BL, the non-selected source line SL and the well potential NW rise from VCC to 8V. Programming (pulse) takes place between the times t3 and t4.

Figure 60:
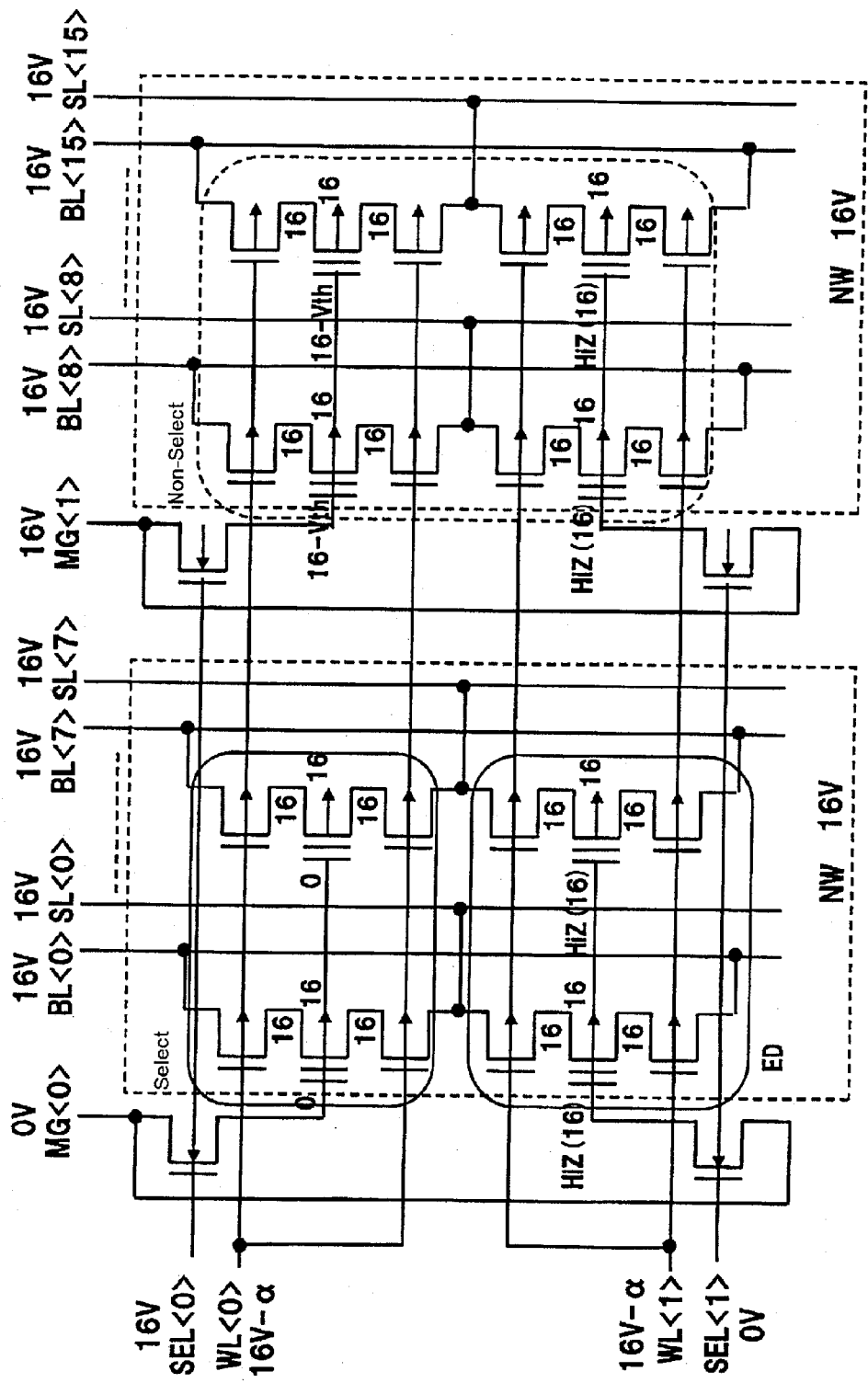
FIG. 60 is a specific example of the voltages applied to each part at the time of an erase operation in the seventh embodiment of this invention.

FIG. 60 is a diagram which shows a specific example related to the conditions of the operation voltage at the time of an erase operation. Here, the memory cells marked with select are the memory cells to be erased. 16V is applied to the select line SEL<0>, 0V is applied to the select line SEL<1>, 16V-α is applied to the word line WL<0> and the word line WL<1>, 0V is applied to the memory gate line MG<0>, 16V is applied to the memory gate line MG<1>, and 16V is applied the source bit line BL and the source line SL. The N type well NW is applied with 16V. Characteristically, all the disturb stress apart from the selected memory cells is avoided. Furthermore, in this embodiment, by setting the voltage of the gate of the select transistor to a voltage at which the channel conducts, that is, about 16V-α, it is possible to relieve gate stress of a memory cell. In addition, in this example, all the operation voltages are realized above 0V and it is possible to operate using only a charge pump which generates a positive voltage. Furthermore, by constructing the MG transistor with an NMIS structure, it is possible to set the MG voltage not to VCC but to 0V and it is possible to make the each voltage of NW, BL and SL a low voltage by only this amount.

Figure 61:
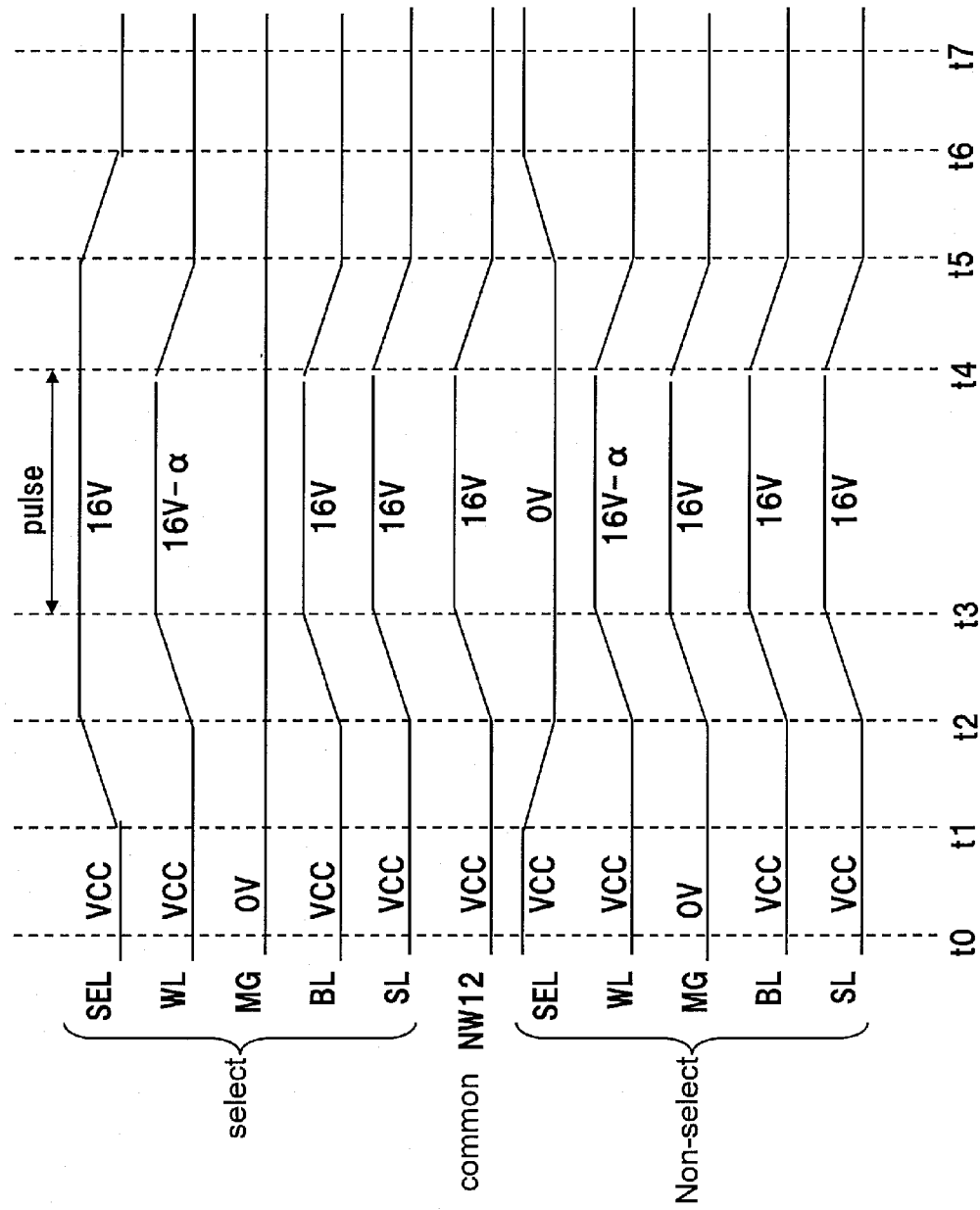
FIG. 61 is a time chart during an erase operation in the seventh embodiment of this invention.
Figure 63:
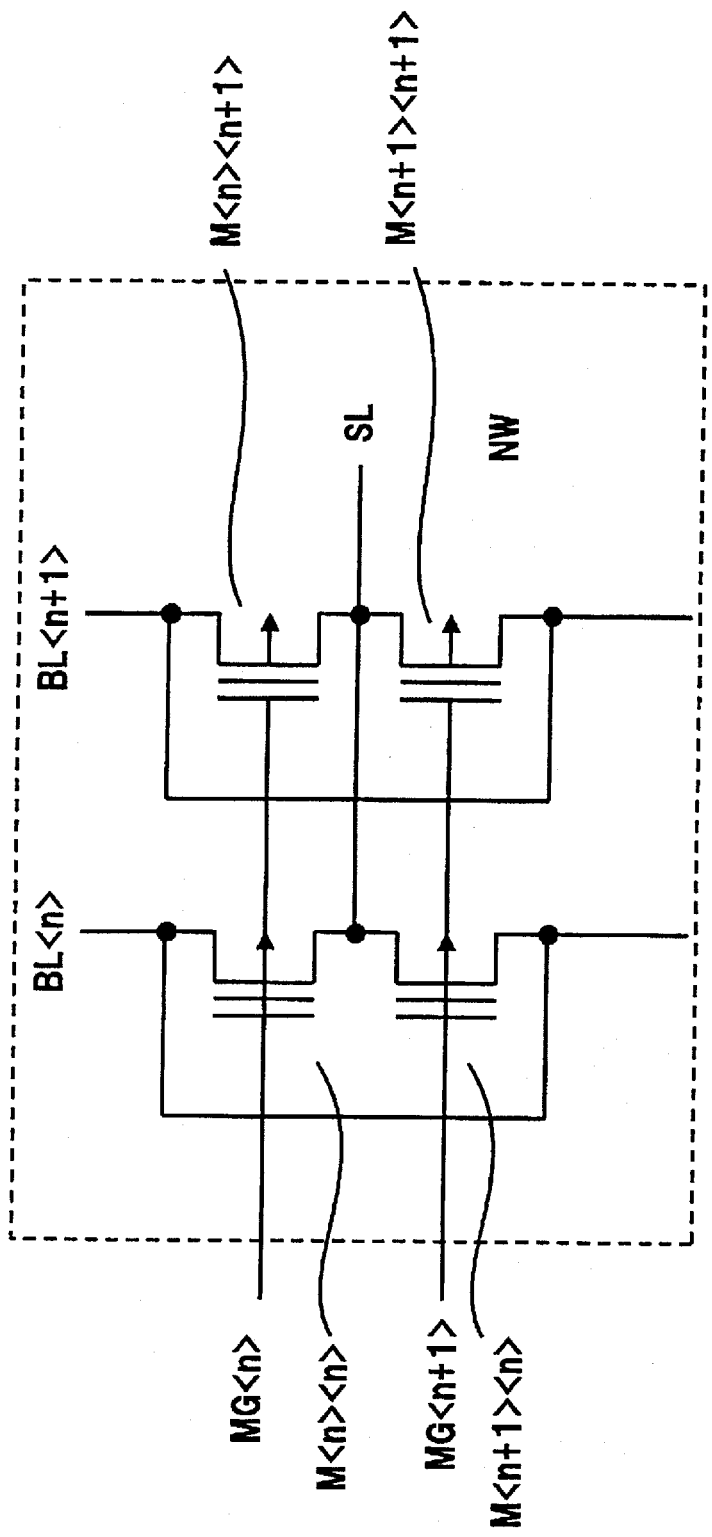
FIG. 63 is an array structural diagram of a conventional NOR type nonvolatile memory.
Figure 64:
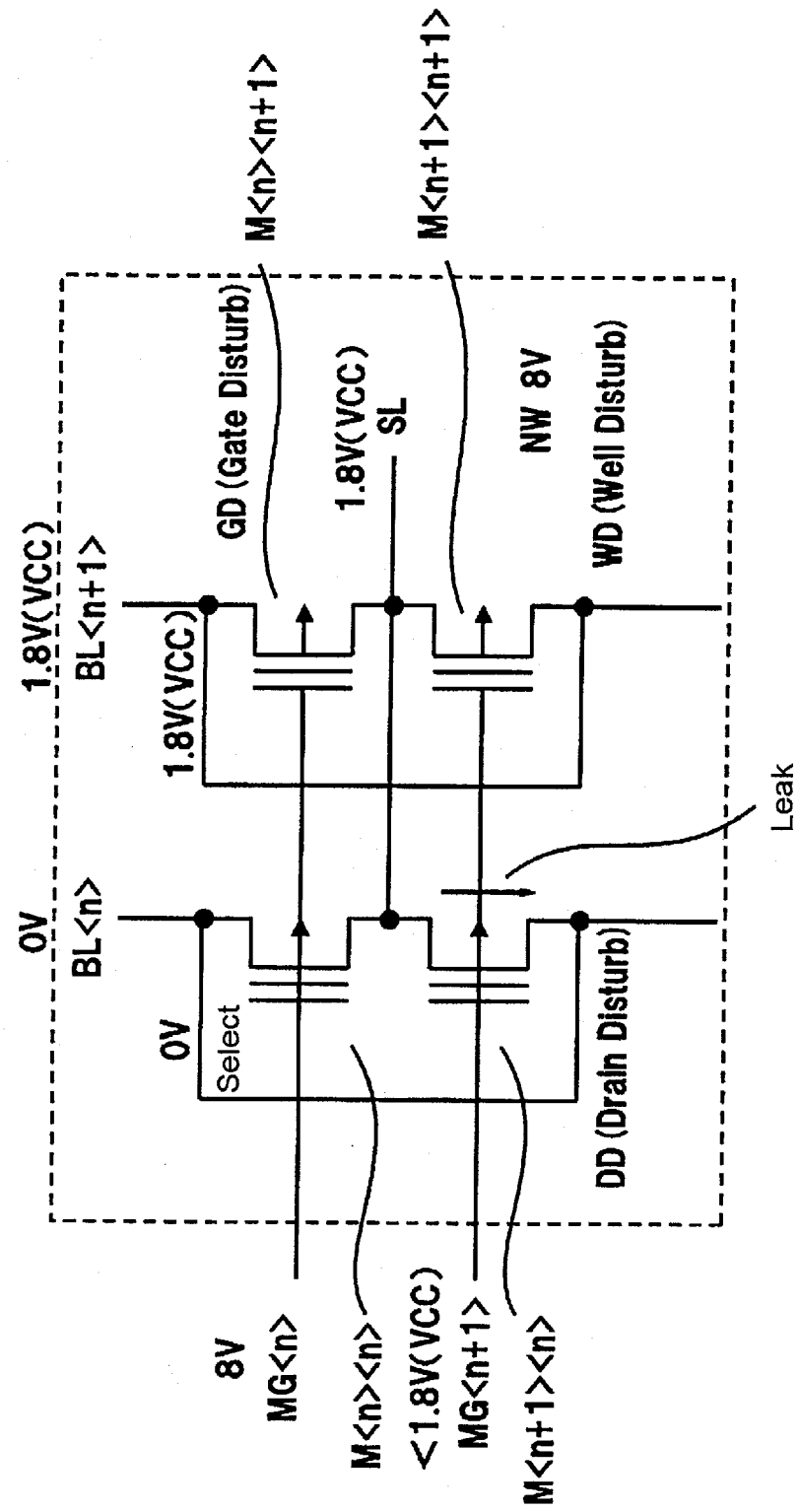
FIG. 64 is one example of disturb in a conventional NOR type nonvolatile memory.
Figure 65:
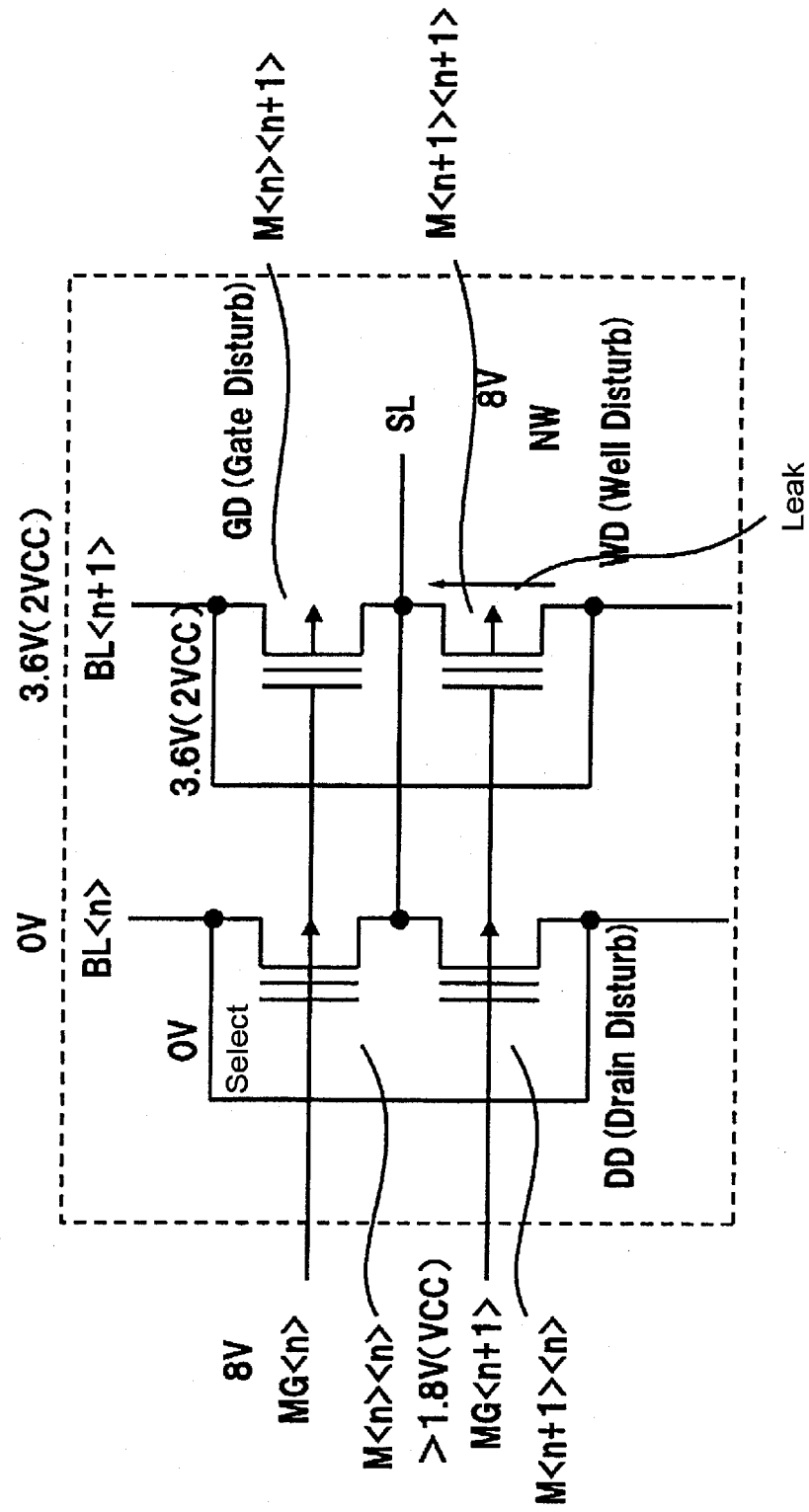
FIG. 65 is one example of disturb in a conventional NOR type nonvolatile memory.

FIG. 61 is a time chart which shows the voltages applied to each node at the time of an erase operation. Between the times t1 and t2, the potential of the selected select line SEL rises to 16V and the potential of the non-selected select line SEL drops from VCC to 0V. Between the times t2 and t3, the potentials of the word line WL, the bit line BL, the source line SL and the non-selected memory gate MG rise from VCC to 16V-α. Erasure (pulse) takes place between t3 and t4.

FIG. 62 is diagram chart of a comparison between an example of a MG select transistor with a PMIS structure (sixth embodiment) and an NMIS structure (seventh embodiment). The array area becomes larger only by the amount in which well separation is necessary when using a NMIS, however, the restrictions of voltage setting under programming conditions disappear. The other effects are shown in the chart.

A nonvolatile memory of the present invention was explained above; however, the present invention is not limited to the described embodiments. For example, in the sixth and seventh embodiments, a memory gate line was divided for every 8 bits, however, as long as this is a plurality of bits, 16 bits, 32 bits or multi-bits such as $2^n$ bits (n>3: integer number) are possible. In addition, other high voltages apart from a specific voltage such as 10V, 20V, 18V, 16V may be used.

What is claimed is:
1. A nonvolatile semiconductor memory device comprising:
a semiconductor substrate;
an n type well formed in the semiconductor substrate;
a plurality of bit lines arranged along a first direction;
a plurality of source lines arranged along the first direction and between the plurality of bit lines;
a plurality of memory gate lines arranged along a second direction intersecting the first direction; and
a memory cell array having a plurality of P type MIS memory cells formed in the n type well, the plurality of P type MIS memory cells being arranged in matrix, each of the plurality of P type MIS memory cells having a first P+ type drain diffusion region connected to a corresponding one of the plurality of bit lines, a first P+ type source diffusion region connected to a corresponding one of the plurality of source lines, a first channel region between the first P+ type drain diffusion region and the first P+ type source diffusion region, a stack of a gate insulation film, a charge storage layer, an inter-gate insulation film, and a first control gate integrally forming a corresponding one of the plurality of memory gate lines,
wherein during a programming operation an n well voltage is applied to the n well, programming voltages lower than the n well voltage are applied to a selected one of the plurality of bit lines and a selected one of the plurality of source lines, a memory gate line voltage higher than the programming voltages is applied to a selected one of the plurality of memory gate lines, a program inhibit voltages higher than the programming voltages are applied to remaining ones of the plurality of bit lines and remaining ones of the plurality of source lines, and inhibit memory gate line voltages lower than the memory gate line voltage are applied to remaining ones of the plurality of memory gate lines.

2. The nonvolatile semiconductor memory device according to claim 1, further comprising:
a plurality of first word lines arranged along the second direction; and
a first select transistor array having a plurality of first P type MIS transistors arranged in matrix, each of the first P type MIS transistors corresponding to one of the P type MIS memory cells, each of the first P type MIS transistors having a second P+ type drain diffusion region directly connected to a corresponding one of the plurality of bit lines, a second P+ type source diffusion region integrally formed with the first P+ type drain diffusion region of the corresponding one of the P type MIS memory cells, a second channel region between the second P+ type drain diffusion region and the second P+ type source diffusion region, a stack of a gate insulation film and a second control gate integrally forming a corresponding one of the plurality of first word lines,
wherein during the programming operation, a selection voltage lower than the programming voltages is applied to a selected one of the plurality of first word lines and non-selection voltages lower than the programming voltages are applied to remaining ones of the plurality of first word lines.

3. The nonvolatile semiconductor memory device according to claim 2, further comprising:
a plurality of second word lines arranged along the second direction; and
a second select transistor array having a plurality of second P type MIS transistors arranged in a matrix, each of the second P type MIS transistors corresponding to one of the P type MIS memory cells, each of the second P type MIS transistors having a third P+ type drain diffusion region integrally formed with the first P+ type source diffusion region of the corresponding one of the P type MIS memory cells, a third P+ type source diffusion region directly connected to a corresponding one of the plurality of source lines, a third channel region between the third P+ type drain diffusion region and the third P+ type source diffusion region, a stack of a gate insulation film and a third control gate integrally forming a corresponding one of the plurality of second word lines;
wherein during the programming operation, the selection voltage is applied to a selected one of the plurality of second word lines and the non-selection voltages are applied to remaining ones of the plurality of second word lines.

4. The nonvolatile semiconductor memory device according to claim 3, wherein the memory cell array and a plurality of the memory gate lines are divided into a plurality of memory cell array groups along the first direction, the nonvolatile semiconductor memory device further comprising:
a plurality of master memory gate lines arranged in the second direction, each of the plurality of the master memory gate lines corresponding to one of the plurality of memory cell array groups;
a plurality of selection lines arranged in the first direction; and
a plurality of memory gate selection transistors arranged in a matrix, each of the plurality of memory gate selection transistors corresponding to one of the memory cell array groups, wherein each of the plurality of memory gate selection transistors is connected between the corresponding one of the master memory gate lines and one of the plurality of the memory gate lines and is controlled by a voltage applied to a corresponding one of the plurality of selection lines.

5. The nonvolatile semiconductor memory device according to claim 1, wherein during the programming operation, a selected one of the plurality of P type MIS memory cells is programmed with carrier injection by band to band tunneling.

6. The nonvolatile semiconductor memory device according to claim 2, wherein during the programming operation a selected one of the plurality of P type MIS memory cells is programmed with carrier injection by band to band tunneling.

7. The nonvolatile semiconductor memory device according to claim 3, wherein during the programming operation a selected one of the plurality of P type MIS memory cells is programmed with carrier injection by band to band tunneling.

8. The nonvolatile semiconductor memory device according to claim 4, wherein during the programming operation a selected one of the plurality of P type MIS memory cells is programmed with carrier injection by band to band tunneling.

9. The nonvolatile semiconductor memory device according to claim 2, wherein a thickness of the gate insulation film of the first P type MIS transistor is equal to a thickness of one of a VCC transistor gate insulation film and an external input/output (I/O) transistor gate insulation film.

10. The nonvolatile semiconductor memory device according to claim 3 wherein a thickness of the gate insulation film of the first P type MIS transistor and the second P type MIS transistor is equal to a thickness of one of a VCC transistor gate insulation film and an external input/output (I/O) transistor gate insulation film.

11. The nonvolatile semiconductor memory device according to claim 1, wherein the P+ type drain diffusion region and the P+ type source diffusion region of the first P type MIS transistor are asymmetrically formed.

12. The nonvolatile semiconductor memory device according to claim 2, wherein the P+ type drain diffusion region and the P+ type source diffusion region of the first P type MIS transistor are asymmetrically formed and the P+ type drain diffusion region and the P+ type source diffusion region of the second P type MIS transistor are asymmetrically formed.

13. The nonvolatile semiconductor memory device according to claim 2, further comprising:
a memory unit having one of the first P type MIS memory cells and one of the first P type MIS transistors, the first P type MIS memory cell and the first P type MIS transistor being arranged in series, the memory unit having a pattern, the pattern including a first contact which directly connects the second P+ type drain diffusion region and the corresponding one of the plurality of bit lines and a second contact which directly connects the first P+ type source diffusion region and the corresponding one of the plurality of bit lines; and
an active region formed between the first contact and the second contact;
wherein the first channel region is defined by a portion of the active region intersected by the first control gate and the second channel region is defined by a portion of the active region intersected by the second control gate.

14. The nonvolatile semiconductor memory device according to claim 3 further comprising:
a memory unit having one of the first P type MIS memory cells, one of the first P type MIS transistors, and one of the second P type transistors, the first P type MIS transistor, the first P type MIS memory cell and the second P type MIS transistor being arranged in series, the memory unit having a pattern, the pattern including a first contact which directly connects the second P+ type drain diffusion region and the corresponding one of the plurality of bit lines and a third contact which directly connects the third P+ type source diffusion region and the corresponding one of the plurality of bit lines; and
an active region formed between the first contact and the third contact, wherein the first channel region is defined by a portion of the active region intersected by the first control gate, the second channel region is defined by a portion of the active region intersected by the second control gate, and the third channel region is defined by a portion of the active region intersected by the third control gate.

* * * * *